United States Patent
Cho et al.

(10) Patent No.: US 11,515,376 B2
(45) Date of Patent: *Nov. 29, 2022

(54) DISPLAY PANEL AND METHOD OF FABRICATING THE SAME

(71) Applicant: SAMSUNG DISPLAY CO., LTD., Yongin-si (KR)

(72) Inventors: Yoon-Jong Cho, Yongin-si (KR); Suyeon Yun, Seoul (KR); Seokje Seong, Seongnam-si (KR); Seongjun Lee, Seoul (KR); Joonhoo Choi, Seoul (KR); Semyung Kwon, Yongin-si (KR); Kyunghyun Baek, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 37 days.

This patent is subject to a terminal disclaimer.

(21) Appl. No.: 17/063,698

(22) Filed: Oct. 5, 2020

(65) Prior Publication Data

US 2021/0036082 A1    Feb. 4, 2021

Related U.S. Application Data

(63) Continuation of application No. 16/115,730, filed on Aug. 29, 2018, now Pat. No. 10,797,123.

(30) Foreign Application Priority Data

Oct. 13, 2017  (KR) ........................ 10-2017-0133551
Feb. 13, 2018  (KR) ........................ 10-2018-0017945
Mar. 13, 2018  (KR) ........................ 10-2018-0029301

(51) Int. Cl.
H01L 27/32   (2006.01)
H01L 27/12   (2006.01)
(Continued)

(52) U.S. Cl.
CPC ....... *H01L 27/3262* (2013.01); *G09G 3/3225* (2013.01); *H01L 27/124* (2013.01);
(Continued)

(58) Field of Classification Search
CPC ............. H01L 27/3262; H01L 27/1225; H01L 27/124; H01L 27/1248; H01L 27/3246
(Continued)

(56) References Cited

U.S. PATENT DOCUMENTS 8,134,152 B2    3/2012  Choi et al.
8,864,718 B2    10/2014 Cheng et al.
(Continued)

FOREIGN PATENT DOCUMENTS

JP    2017-187560     10/2017
KR    10-2016-0007390  1/2016
(Continued)

*Primary Examiner* — Dzung Tran
(74) *Attorney, Agent, or Firm* — F. Chau & Associates, LLC

(57) ABSTRACT

A display panel includes a base layer having a first region and a bent second region. An inorganic layer is disposed on the base layer. A lower groove is formed within the inorganic layer and overlaps the second region. A first thin-film transistor is disposed on the inorganic layer and includes a silicon semiconductor pattern overlapping the first region. A second thin-film transistor is disposed on the inorganic layer and includes an oxide semiconductor pattern overlapping the first region. Insulating layers overlap the first and second regions. An upper groove is formed within the insulating layers. A signal line electrically connects the second thin-film transistor. An organic layer overlaps the first and second regions and is disposed in the lower and upper grooves. A luminescent device is disposed on the organic layer and overlaps the first region.

25 Claims, 42 Drawing Sheets

(51) Int. Cl.
*G09G 3/3225* (2016.01)
*H01L 51/52* (2006.01)

(52) U.S. Cl.
CPC ...... *H01L 27/1218* (2013.01); *H01L 27/1225* (2013.01); *H01L 27/1248* (2013.01); *H01L 27/1251* (2013.01); *H01L 27/1262* (2013.01); *H01L 27/3246* (2013.01); *H01L 27/3258* (2013.01); *H01L 27/3272* (2013.01); *H01L 27/3276* (2013.01); *H01L 27/3288* (2013.01); *H01L 51/5237* (2013.01)

(58) Field of Classification Search
USPC .......................................................... 257/72
See application file for complete search history.

(56) References Cited

U.S. PATENT DOCUMENTS

| | | | |
|---|---|---|---|
| 8,912,536 | B2 | 12/2014 | Maeng et al. |
| 9,543,370 | B2 | 1/2017 | Tsai et al. |
| 9,799,775 | B2 | 10/2017 | Kobayashi et al. |
| 10,398,141 | B1 | 8/2019 | Kawata |
| 10,475,868 | B2 | 11/2019 | Park et al. |
| 2014/0217397 | A1 | 8/2014 | Kwak et al. |
| 2015/0123084 | A1* | 5/2015 | Kim ............... H01L 27/1251 257/43 |
| 2015/0206977 | A1 | 7/2015 | Katoh et al. |
| 2016/0013321 | A1 | 1/2016 | Kobayashi et al. |
| 2016/0066409 | A1* | 3/2016 | Kwon ............ H01L 51/0097 174/254 |
| 2016/0087022 | A1 | 3/2016 | Tsai et al. |
| 2016/0181339 | A1* | 6/2016 | Lee ................ H01L 27/1248 257/40 |
| 2016/0218305 | A1* | 7/2016 | Kim ................... G02F 1/1345 |
| 2016/0372497 | A1* | 12/2016 | Lee ............... G02F 1/136213 |
| 2017/0062760 | A1 | 3/2017 | Kim |
| 2017/0162606 | A1 | 6/2017 | Yan et al. |
| 2017/0262109 | A1 | 9/2017 | Choi et al. |
| 2017/0266569 | A1 | 9/2017 | Ohara |
| 2017/0288006 | A1 | 10/2017 | Kawata |
| 2019/0115407 | A1 | 4/2019 | Cho et al. |

FOREIGN PATENT DOCUMENTS

| | | |
|---|---|---|
| KR | 10-2017-0024200 | 3/2017 |
| KR | 10-2017-0044167 | 4/2017 |
| KR | 20170106621 | 9/2017 |
| TW | 201724616 | 7/2017 |

\* cited by examiner

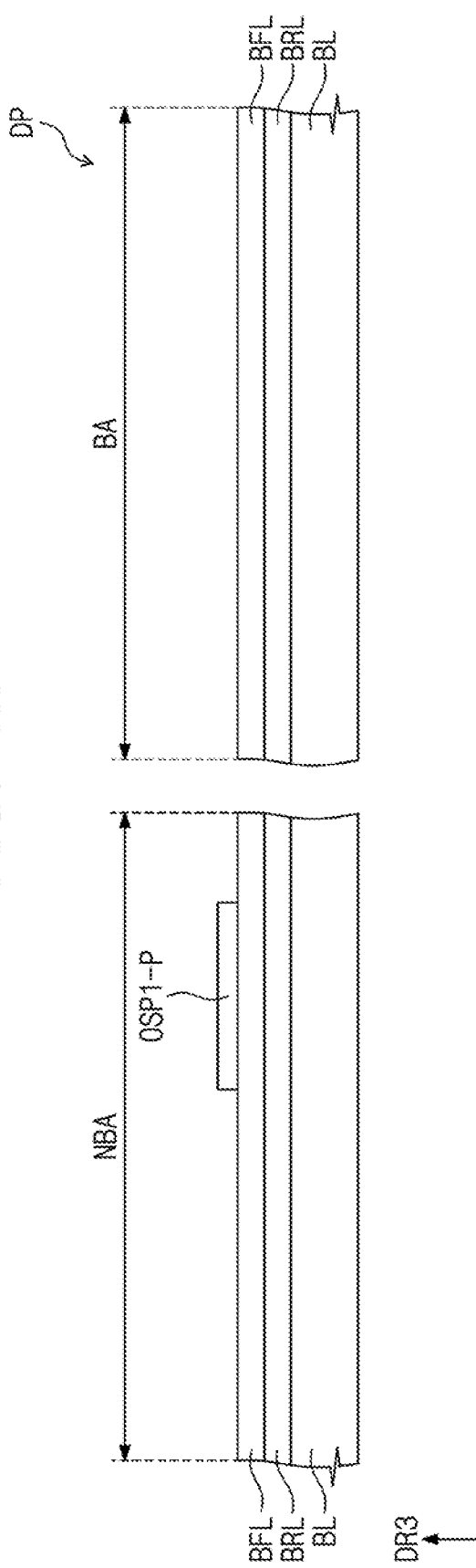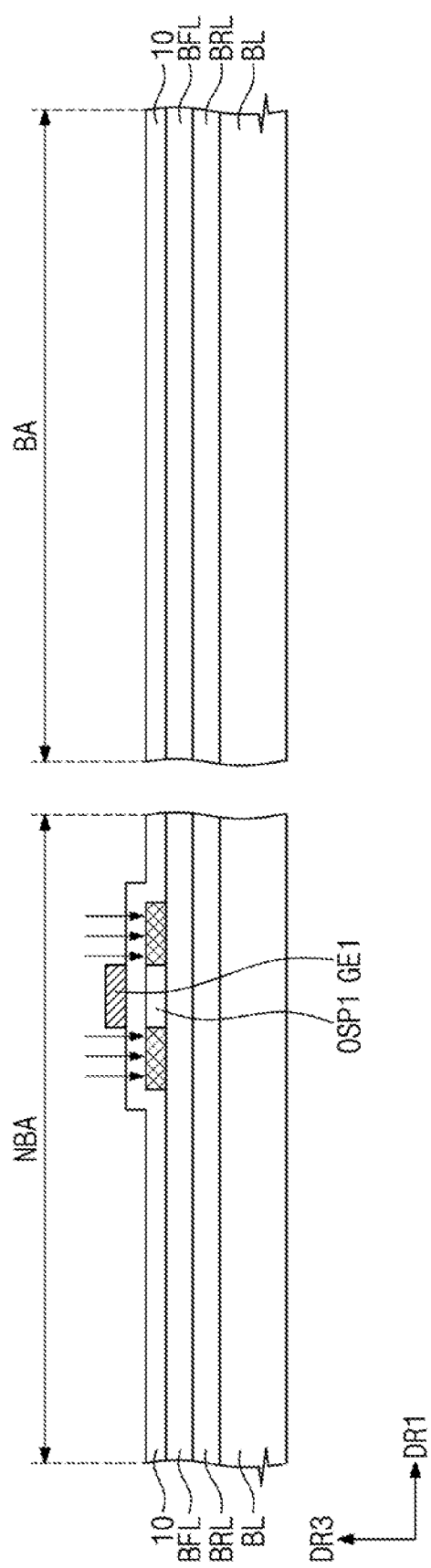

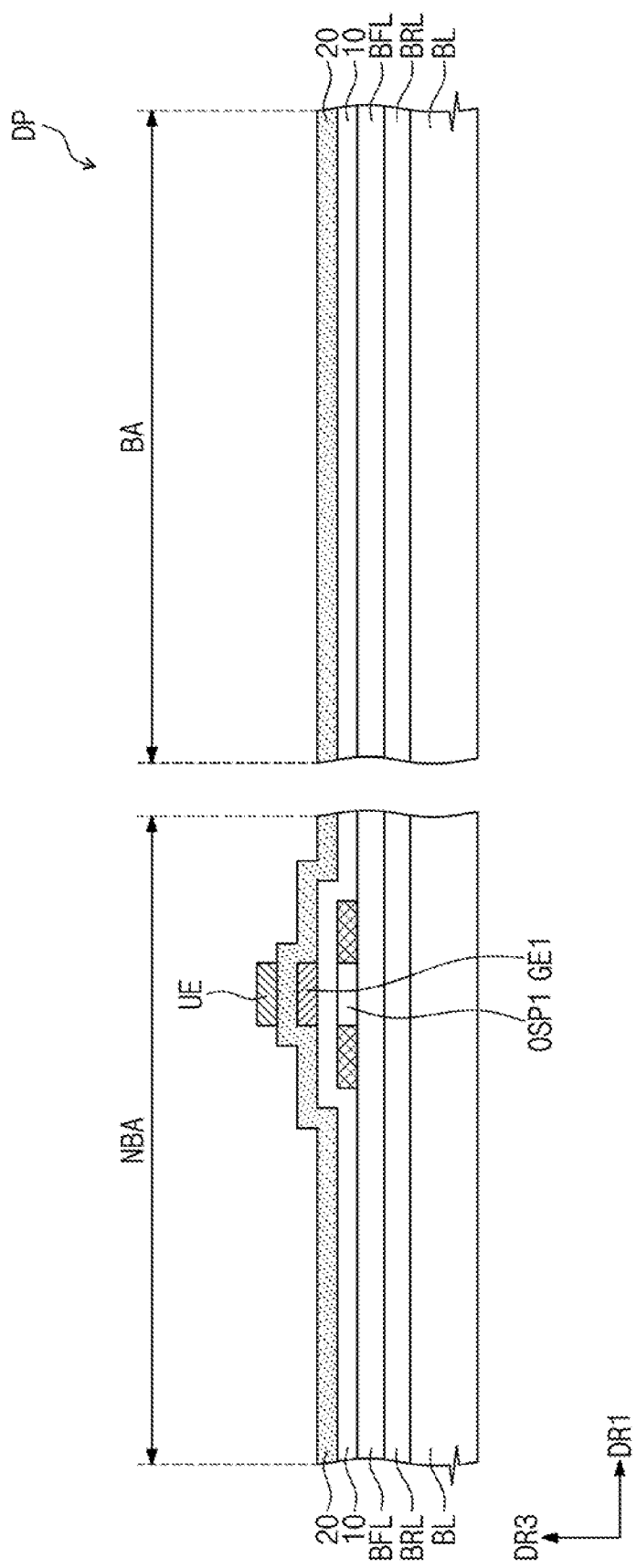

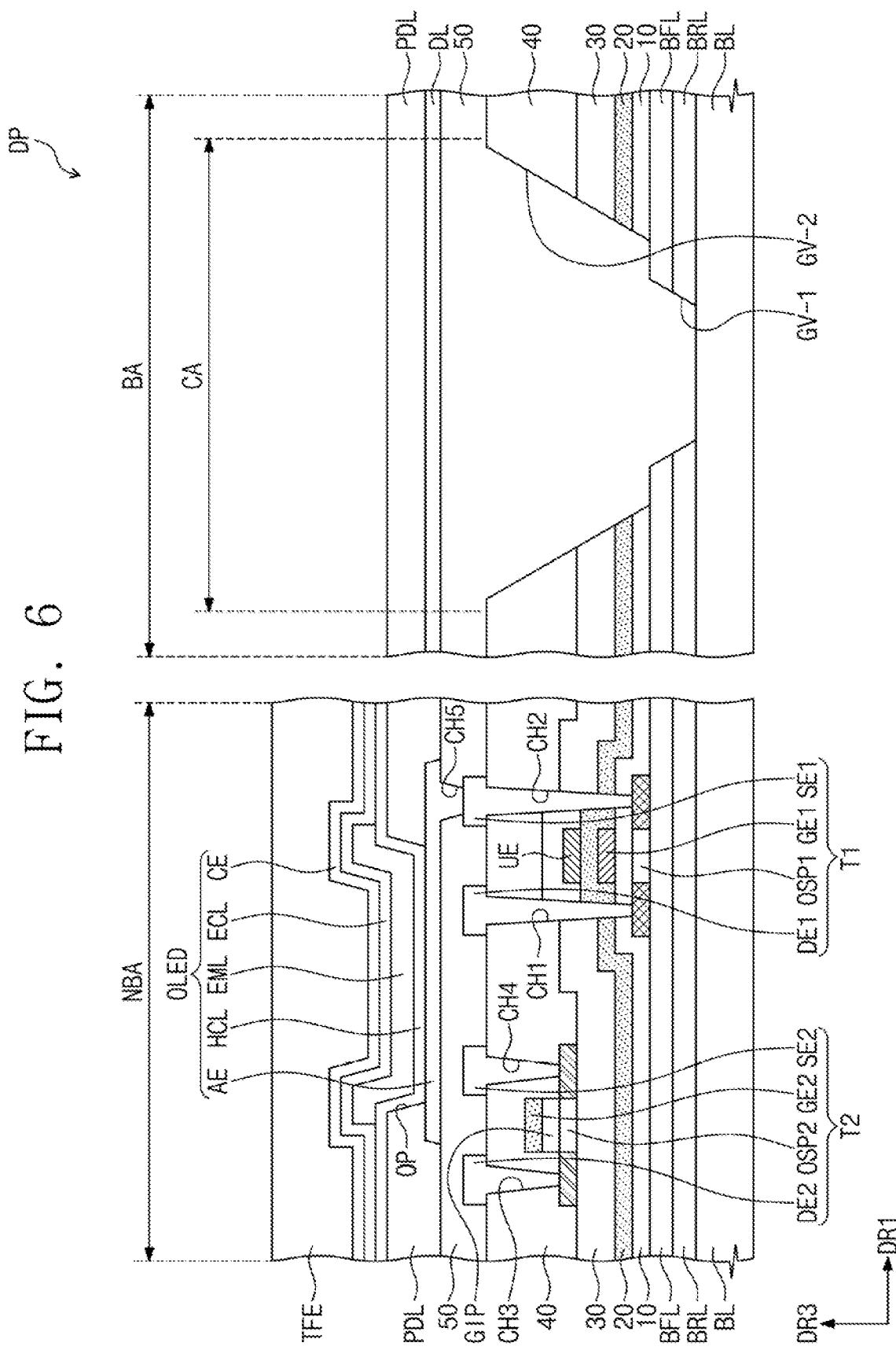

DISPLAY PANEL AND METHOD OF FABRICATING THE SAME

CROSS-REFERENCE TO RELATED APPLICATIONS

This U.S. non-provisional patent application is a Continuation of co-pending U.S. patent application Ser. No. 16/115,730, filed on Aug. 29, 2018, which claims priority under 35 U.S.C. § 119 to Korean Patent Application No. 10-2017-0133551, filed on Oct. 13, 2017; Korean Patent Application No. 10-2018-0017945, filed on Feb. 13, 2018; and Korean Patent Application No. 10-2018-0029301, filed on Mar. 13, 2018, the contents of which are hereby incorporated by reference in their entirety.

TECHNICAL FILED

The present disclosure relates to a display panel and, more specifically, to a display panel and a method of fabricating the display panel.

DISCUSSION OF THE RELATED ART

A display device includes a plurality of pixels and a driving circuit (e.g., a scan driving circuit and a data driving circuit) for controlling the plurality of pixels. Each of the pixels includes a display element and a pixel driving circuit for controlling the display element. The pixel driving circuit includes a plurality of thin-film transistors that are organically connected to each other.

SUMMARY

A display panel includes a base layer having a first region and a second region that is bent with respect to the first region. At least one inorganic layer overlaps both the first region and the second region and is disposed on the base layer. A lower groove is formed within the at least one inorganic layer and overlaps the second region. A first thin-film transistor is disposed on the at least one inorganic layer and includes a silicon semiconductor pattern overlapping the first region. A second thin-film transistor is disposed on the at least one inorganic layer and includes an oxide semiconductor pattern overlapping the first region. A plurality of insulating layers overlap both the first region and the second region. An upper groove is formed within the plurality of insulating layers and the upper groove is extended from the lower groove. A signal line electrically connects to the second thin-film transistor. An organic layer overlaps both the first region and the second region and is disposed in both the lower groove and the upper groove. A luminescent device is disposed on the organic layer and overlaps the first region.

A method of fabricating a display panel includes forming at least one inorganic layer on a base layer. The base layer includes a first region and a second region extended from the first region. The at least one inorganic layer overlaps the first region and the second region of the base layer. A silicon semiconductor pattern is formed on the at least one inorganic layer. The silicon semiconductor pattern overlaps the first region of the base layer. A first control electrode is formed on the silicon semiconductor pattern. The first control electrode overlaps the silicon semiconductor pattern, with a first insulating layer interposed between the first control electrode and the silicon semiconductor pattern. An upper electrode is formed on the first control electrode. The upper electrode overlaps the first control electrode, with a second insulating layer interposed between the upper electrode and the first control electrode. A third insulating layer is formed covering the upper electrode. An oxide semiconductor pattern is formed on the third insulating layer. A second control electrode is formed on the oxide semiconductor pattern, the second control electrode overlaps the oxide semiconductor pattern. A fourth insulating layer is formed covering the second control electrode. A first etching step is performed including partially removing the first to fourth insulating layers, thereby forming a first contact hole and a second contact hole respectively exposing a first portion and a second portion of the silicon semiconductor pattern and forming an upper groove exposing a portion of the at least one inorganic layer overlapped with the second region. A second etching step is formed including partially removing the fourth insulating layer, thereby forming a third contact hole and a fourth contact hole respectively exposing a first portion and a second portion of the oxide semiconductor pattern, and of partially removing the at least one inorganic layer, thereby forming a lower groove in the second region of the at least one inorganic layer, the lower groove extending from the upper groove. An electrode forming step is performed including forming a first input electrode and a first output electrode, which are respectively connected to the first portion and the second portion of the silicon semiconductor pattern, and forming a second input electrode and a second output electrode, which are respectively connected to the first portion and the second portion of the oxide semiconductor pattern. An organic layer is formed covering the first input electrode, the first output electrode, the second input electrode, and the second output electrode, the organic layer being disposed within the upper groove and the lower groove. A third etching step is performed including partially removing the organic layer, thereby forming a fifth contact hole exposing the first output electrode. A luminescent device is formed, which is electrically connected to the first output electrode, on the organic layer.

A method of fabricating a display panel includes forming at least one inorganic layer on a base layer. The base layer includes a first region and a second region extended from the first region. The at least one inorganic layer overlaps both the first region and the second region of the base layer. Insulating layers are formed overlapping both the first region and the second region of the base layer. Semiconductor patterns are formed, overlapping the first region of the base layer, on the at least one inorganic layer, the semiconductor patterns including a silicon semiconductor pattern and an oxide semiconductor pattern. A first etching step is performed including partially removing the insulating layers to expose a portion of the silicon semiconductor pattern and a portion of the at least one inorganic layer overlapping the second region. A second etching step is performed including partially removing the insulating layers, thereby exposing a portion of the oxide semiconductor pattern and removing a portion of the at least one inorganic layer overlapping the second region. Electrodes are formed, which are connected to the exposed portion of the silicon semiconductor pattern and the exposed portion of the oxide semiconductor pattern. An organic layer is formed covering the electrodes, the organic layer being disposed within the removed portion of the at least one inorganic layer and the removed portion of the insulating layers. A luminescent device and a signal line are formed on the organic layer. The luminescent device and the signal line are electrically connected to corresponding ones of the electrodes. The second region is bent.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 5A to 5M are cross-sectional views illustrating a process of fabricating a display panel according to an exemplary embodiment of the inventive concept;

FIGS. 6 to 9 are cross-sectional views illustrating a portion of a display panel according to an exemplary embodiment of the inventive concept;

DETAILED DESCRIPTION

Figure 1A:
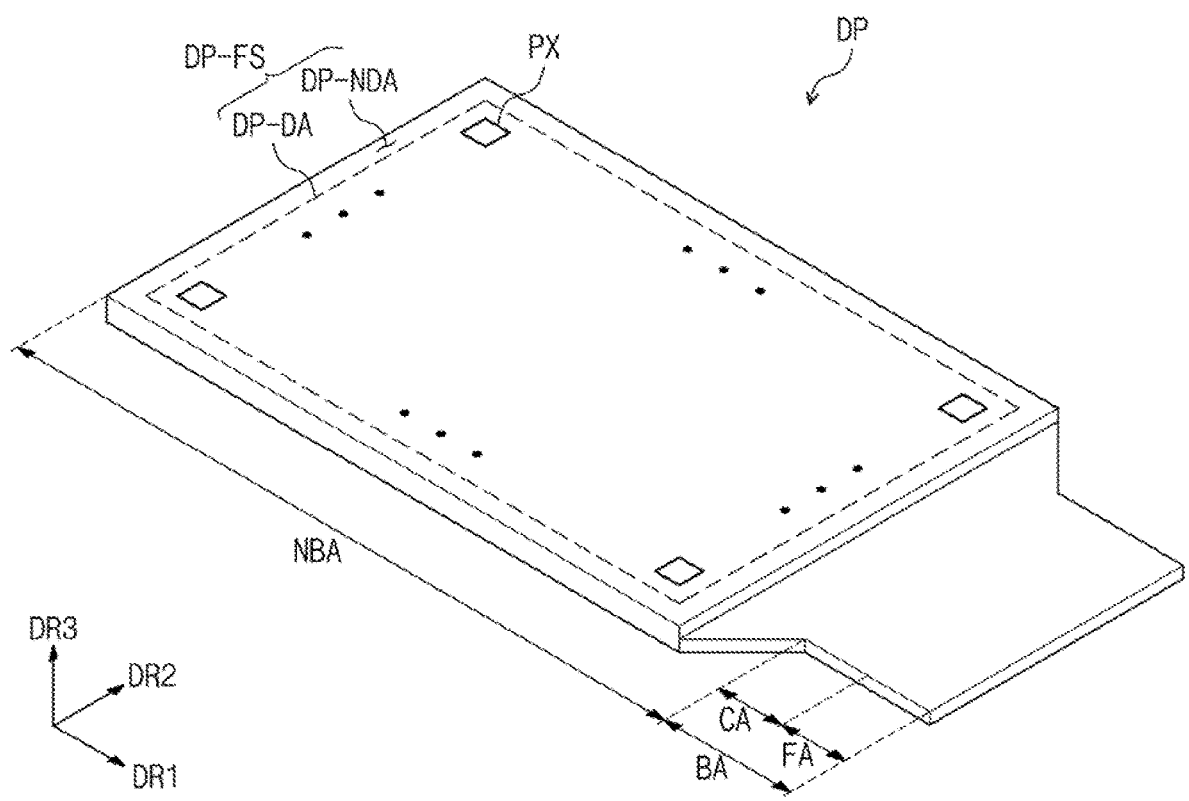
FIGS. 1A and 1B are perspective views illustrating a display panel according to an exemplary embodiment of the inventive concept.

Exemplary embodiments of the inventive concept will now be described more fully with reference to the accompanying drawings. The inventive concept may, however, be embodied in many different forms and should not be construed as being limited to the embodiments set forth herein. In the drawings, the thicknesses of layers and regions may be exaggerated for clarity. Like reference numerals in the drawings and specification may denote like elements, and to the extent that a detailed description of some elements are omitted, it may be assumed that these elements are at least similar to corresponding elements that are described elsewhere in the specification.

It will be understood that when an element is referred to as being "connected" or "coupled" to another element, it can be directly connected or coupled to the other element or intervening elements may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 1B:
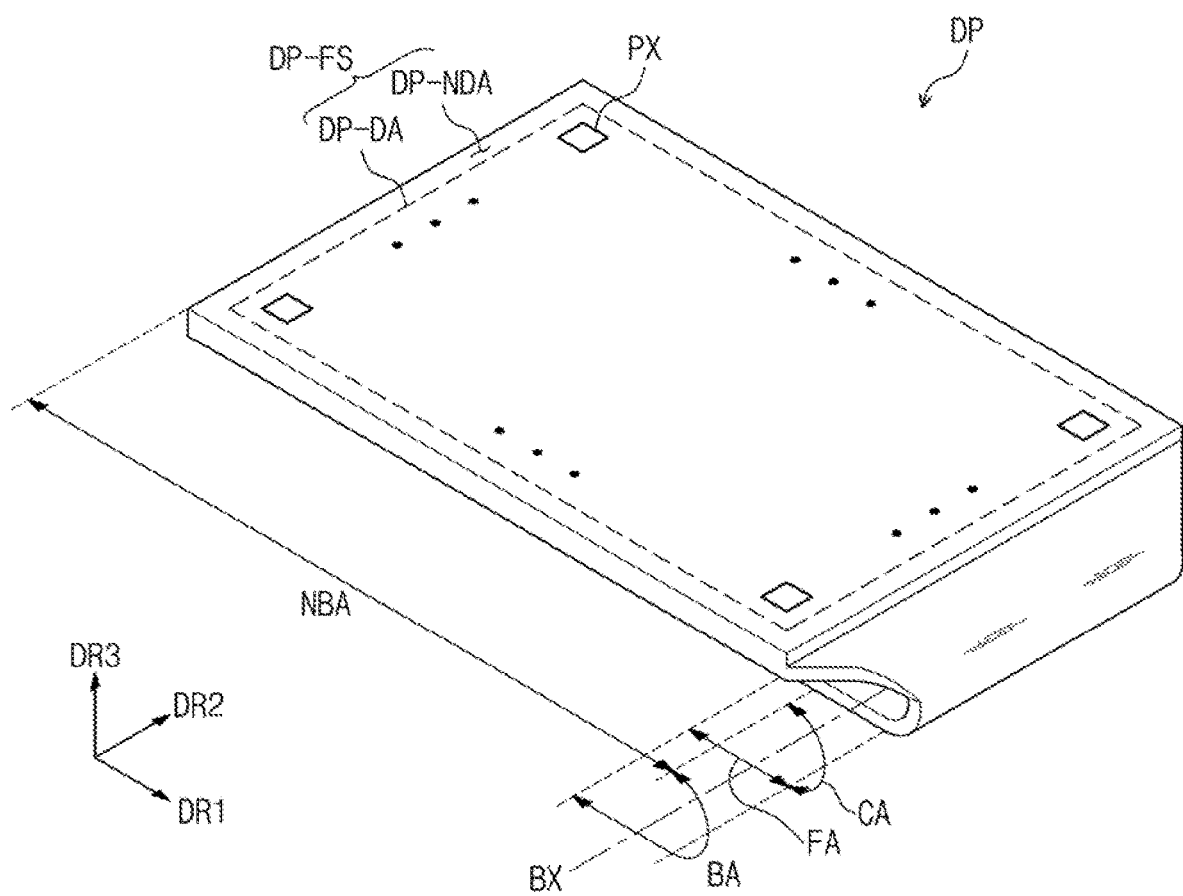
Figure 2:
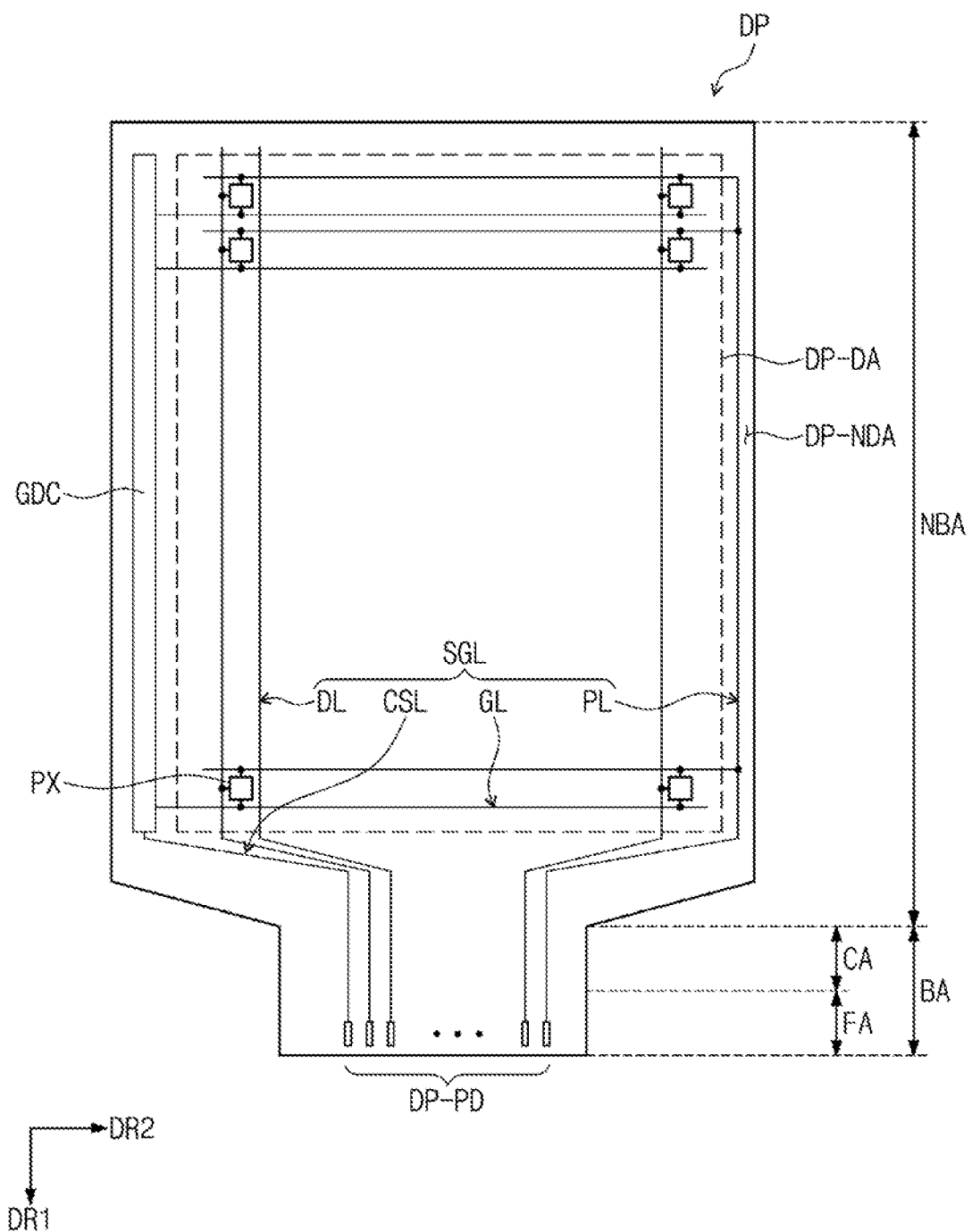
FIG. 2 is a plan view illustrating a display panel according to an exemplary embodiment of the inventive concept.

FIGS. 1A and 1B are perspective views illustrating a display panel DP according to an exemplary embodiment of the inventive concept. FIG. 2 is a plan view of the display panel DP according to an exemplary embodiment of the inventive concept. FIG. 2 illustrates connection structure between elements (e.g., pixels PX, a driving circuit GDC, and signal lines SGL) constituting the display panel DP.

A plane of a front surface DP-FS of the display panel DP in an unfolded state may be parallel to a plane defined by a first direction axis DR1 and a second direction axis DR2. A direction normal to the front surface DP-FS of the display panel DP (e.g., a thickness direction of the display panel DP) will be referred to as a third direction axis DR3. In each of the various layers constituting the display panel DP, a top or front surface may be differentiated from a bottom or rear surface, based on the third direction axis DR3. Hereinafter, first to third directions may be directions indicated by the first to third direction axes DR1, DR2, and DR3, respectively, and will be identified with the same reference numbers.

As shown in FIG. 1A, the front surface DP-FS of the display panel DP may include a display region DP-DA, which includes the pixels PX to be seen by a user, and a non-display region DP-NDA, which is disposed adjacent to the display region DP-DA. The non-display region DP-NDA may be a region, in which the pixels PX are not disposed. Some of the signal lines SGL and/or the driving circuit GDC may be disposed in the non-display region DP-NDA.

As shown in FIG. 1A, the display region DP-DA may be rectangular or tetragonal. The non-display region DP-NDA may surround the display region DP-DA. However, the inventive concept is not limited thereto, and the shapes of the display region DP-DA and the non-display region DP-NDA may be otherwise arranged. For example, the non-display region DP-NDA may be disposed in only two regions of the front surface DP-FS, which are opposite to each other in the first direction DR1. In an exemplary embodiment of the present inventive concept, the display region DP-DA may be circular.

According to an exemplary embodiment of the present inventive concept, a portion of the non-display region DP-NDA may have a width (e.g., a length in the second direction DR2) that is smaller than that of the display region DP-DA. This may make it possible to reduce an area of a bending region, as will be described below.

As shown in FIG. 1B, the display panel DP may be bent, and as a result of such a bending, the display panel DP may be divided into a first or non-bending region NBA and a second or bending region BA. When the second region BA is in the bent state, the second region BA may include a curvature region CA, which is bent with a specific curvature, and a facing region FA, which faces the first region NBA.

As shown in FIG. 2, the display panel DP may include a driving circuit GDC, a plurality of signal lines SGL, a plurality of signal pads DP-PD, and a plurality of pixels PX.

The pixels PX may be classified into a plurality of groups, according to display colors of the pixels. For example, the pixels PX may include red pixels, green pixels, and blue pixels. In an exemplary embodiment of the present inventive concept, the pixels PX may further include white pixels. Even when pixels are included in different groups, the pixel driving circuits of the pixels may be configured to have the same structure.

The driving circuit GDC may include a scan driving circuit. The scan driving circuit may be configured to generate a plurality of scan signals and sequentially output the scan signals to a plurality of scan lines GL to be described below. In addition, the scan driving circuit may be configured to output other control signals to a driving circuit of the pixel PX.

The scan driving circuit may include a plurality of thin-film transistors that are formed by the same process as the driving circuit of the pixel PX (e.g., by a low temperature polycrystalline silicon (LTPS) process or a low temperature polycrystalline oxide (LTPO) process).

The signal lines SGL may include scan lines GL, data lines DL, a power line PL, and a control signal line CSL. Each of the scan lines GI may be connected to a corresponding pixel of the plurality of pixels PX, and each of the data lines DL may be connected to a corresponding pixel of the plurality of pixels PX. The power line PL may be connected to each of the pixels PX. The control signal line CSL may provide control signals to the scan driving circuit. The signal pads DP-PD may be connected to corresponding signal lines of the plurality of signal lines SGL.

A circuit board may be electrically connected to the display panel DP. The circuit board may be a rigid or flexible circuit board. A driving chip may be mounted on the circuit board.

The driving chip may be mounted on the display panel DP. If the driving chip is mounted on the display panel DP, the design or arrangement of the signal lines SGL may be changed. The driving chip may be connected to the data lines DL, and signal lines may connect the driving chip to the signal pads DP-PD.

Figure 3A:
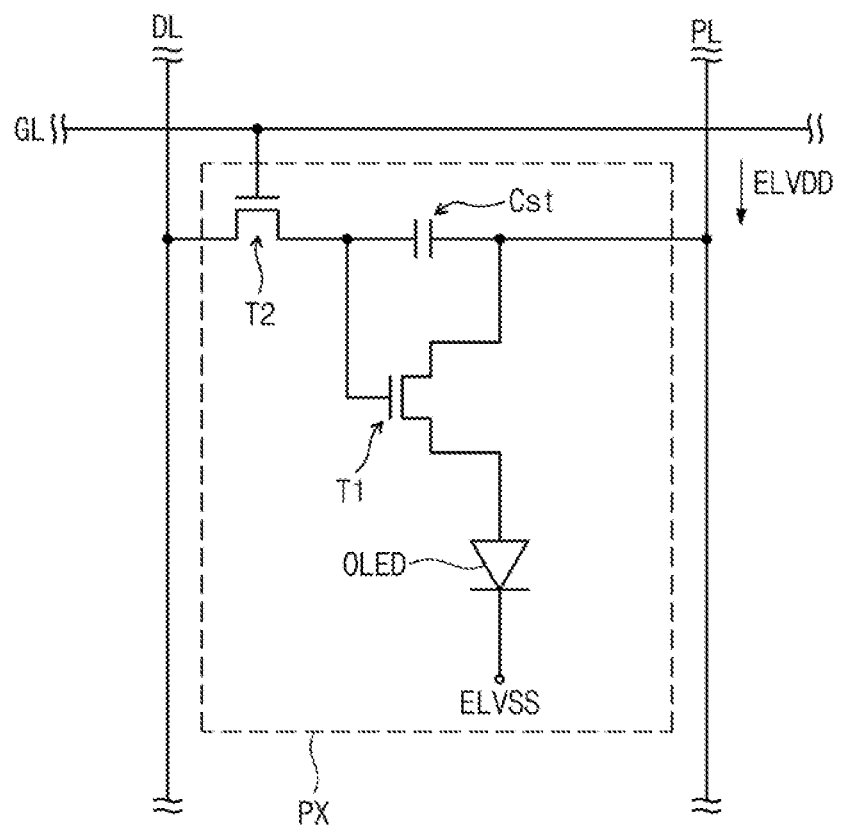
FIG. 3A is an equivalent circuit diagram illustrating a pixel according to an exemplary embodiment of the inventive concept.
Figure 3B:
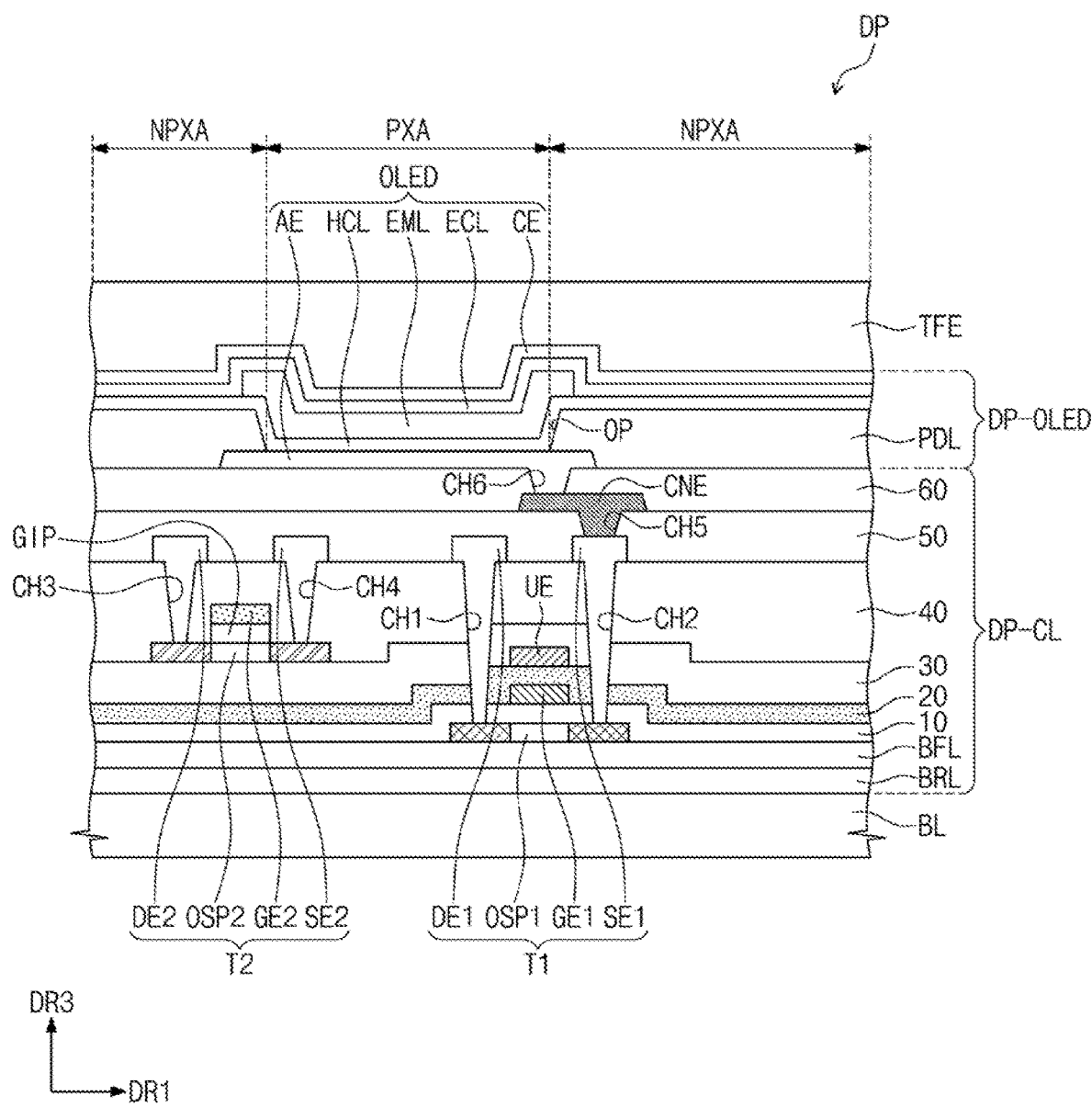
FIGS. 3B and 3C are cross-sectional views illustrating a portion of a pixel according to an exemplary embodiment of the inventive concept.
Figure 3C:
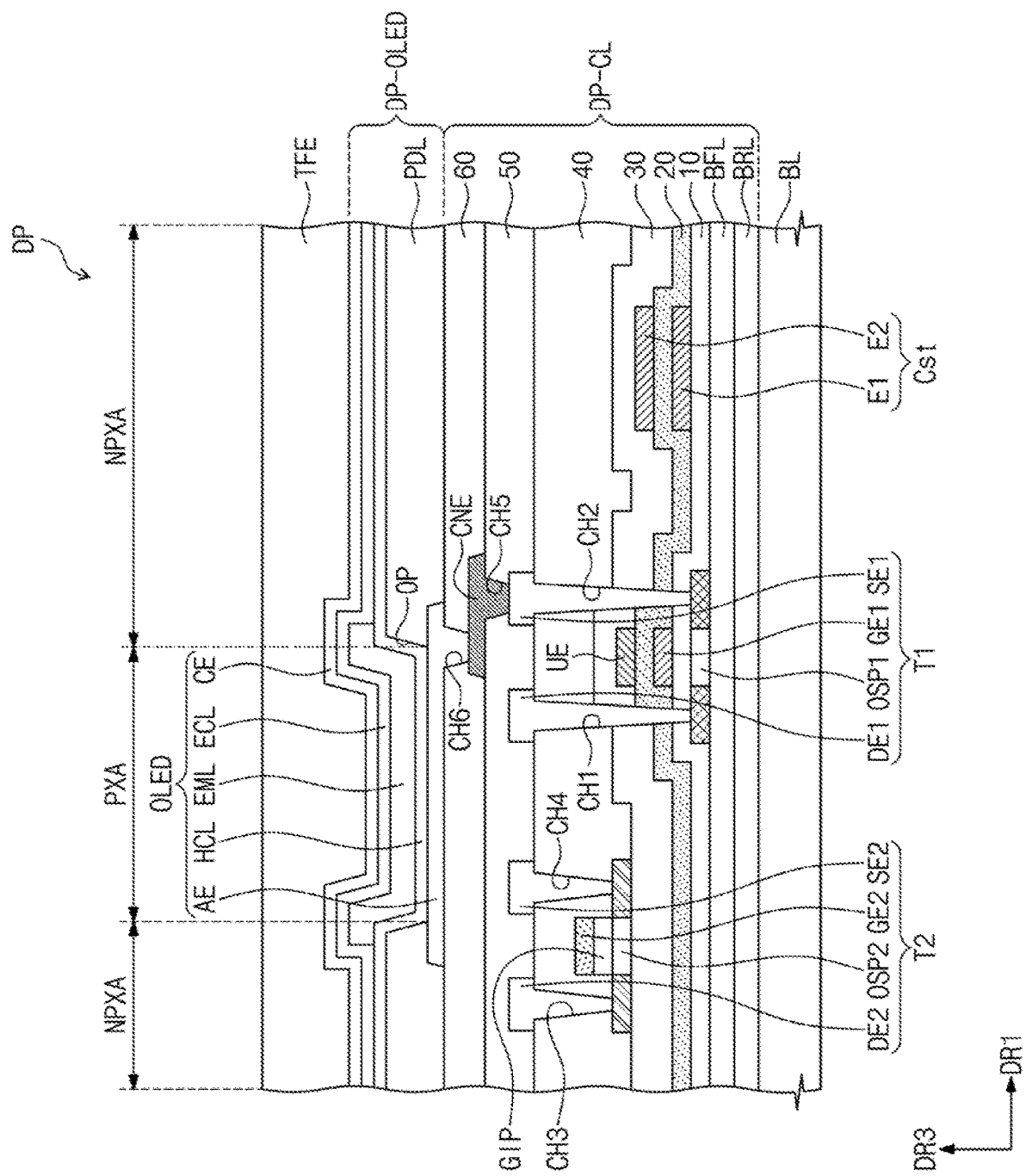
Figure 4A:
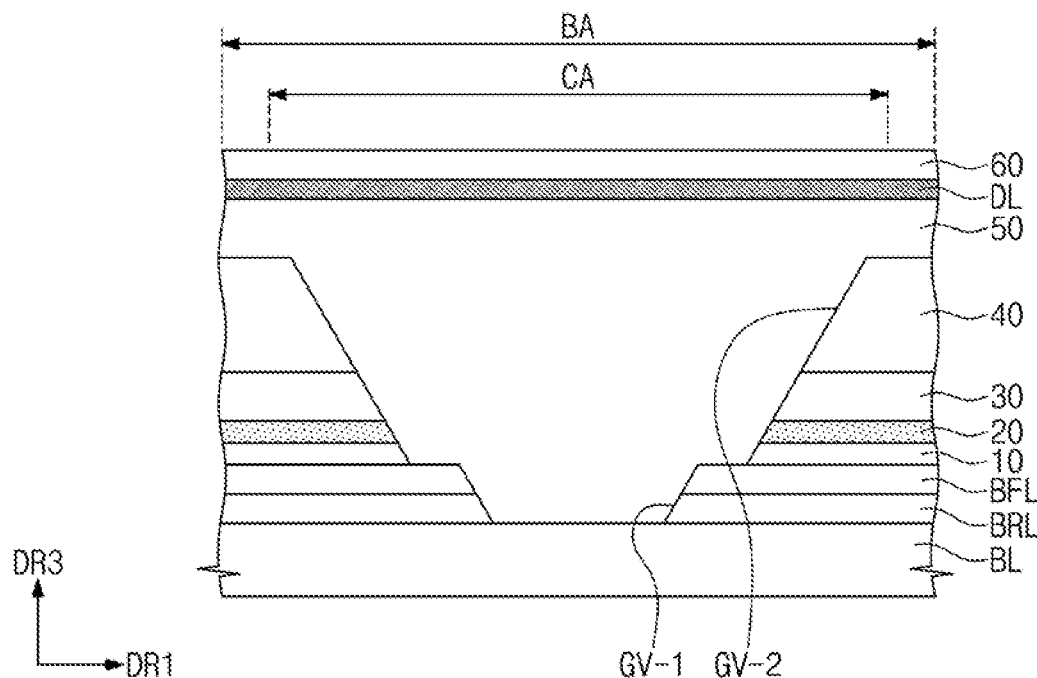
FIGS. 4A and 4B are cross-sectional views illustrating a bending region of a display panel according to an exemplary embodiment of the inventive concept.
Figure 4B:
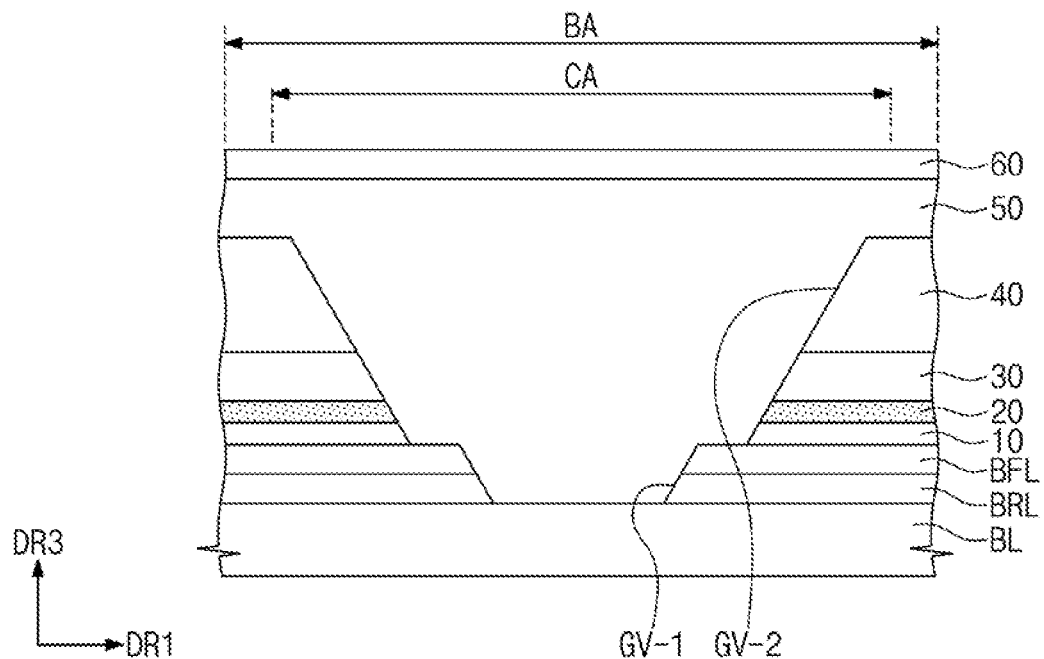

FIG. 3A is an equivalent circuit diagram illustrating the pixel PX according to an exemplary embodiment of the inventive concept. FIGS. 3B and 3C are cross-sectional views illustrating a portion of the pixel PX according to an exemplary embodiment of the inventive concept. FIGS. 4A and 4B are cross-sectional views illustrating a bending region BA of the display panel DP according to an exemplary embodiment of the inventive concept.

FIG. 3A illustrates a scan line GL, a data line DL, a power line PL, and a pixel PX connected to the lines. In an exemplary embodiment of the present inventive concept, the pixel PX may be a light-emission type pixel, but the inventive concept is not limited thereto. For example, the pixel PX may include an organic light emitting diode or a quantum-dot light-emitting diode, which is used as a luminescent device. A luminescent layer of the organic light emitting diode may include an organic luminescent material. A luminescent layer of the quantum-dot light-emitting diode may include quantum dots and/or quantum rods. For the sake of simplicity, the description that follows will refer to an example in which an organic light emitting pixel is used as the pixel PX, how it is to be understood that the present inventive concept may be implemented with other types of pixels.

The pixel PX may include an organic light emitting diode OLED and a pixel driving circuit for driving the organic light emitting diode OLED. The organic light emitting diode OLED may be a top-emission type diode or a bottom-emission type diode. In an exemplary embodiment of the present inventive concept, the pixel driving circuit may include a first thin-film transistor T1 (or a driving transistor), a second thin-film transistor T2 (or a switching transistor), and a capacitor Cst. A first power voltage ELVDD may be provided to the first thin-film transistor T1, and a second power voltage ELVSS may be provided to the organic light emitting diode OLED. The second power voltage ELVSS may be lower than the first power voltage ELVDD.

The first thin-film transistor T1 may be connected to the organic light emitting diode OLED. The first thin-film transistor T1 may control a driving current flowing through the organic light emitting diode OLED, depending on an amount of electric charge stored in the capacitor Cst. The second thin-film transistor T2 may be configured to output a data signal applied to the data line DL, in response to a scan signal applied to the scan line GL. The capacitor Cst may be charged to have a voltage corresponding to a data signal received from the second thin-film transistor T2.

The structure of the pixel PX is not limited to the example of FIG. 3A and may be variously changed. Unlike that shown in FIG. 3A, the pixel circuit controlling the organic light emitting diode OLED may be configured to include three or more (e.g., six or seven) thin-film transistors. The organic light emitting diode OLED may be coupled between the power line PL and the second thin-film transistor T2.

FIG. 3B illustrates a vertical section of a portion of the pixel PX including the first thin-film transistor T1, the second thin-film transistor T2, and the organic light emitting diode OLED. As shown in FIG. 3B, the display panel DP may include a base layer BL and a circuit device layer DP-CL, a display device layer DP-OLED, and a thin encapsulation layer, which are disposed on the base layer BL. The display panel DP may further include functional layers, such as an anti-reflection layer and a refractive index adjusting layer. The circuit device layer DP-CL may include at least a plurality of insulating layers and a circuit device. Hereinafter, the insulating layers may include organic layers and/or inorganic layers.

The circuit device may include signal lines, pixel driving circuits, and so forth. The circuit device layer may be formed by forming an insulating layer, a semiconductor layer, and a conductive layer using a coating or depositing process and then patterning the insulating layer, the semiconductor layer, and the conductive layer using a photolithography process. The display device layer DP-OLED may include a luminescent device. The display device layer DP-OLED may further include an organic layer, which may be formed of the same material as the pixel definition layer PDL.

The base layer BL may be formed of or may otherwise include a synthetic resin film. The synthetic resin layer may include a thermosetting resin. The synthetic resin layer may be a polyimide-based resin layer, however, the inventive concept is not limited to a specific material. The synthetic resin layer may include acryl resins, methacryl resins, polyisoprene resins, vinyl resins, epoxy resins, urethane resins, cellulose resins, siloxane resins, polyamide resins, and/or perylene resins. In an exemplary embodiment of the present inventive concept, the base layer BL may include a glass substrate, a metal substrate, and/or an organic/inorganic composite substrate.

The base layer BL may be sectioned in the same manner as the display panel DP described with reference to FIGS.

1A to 2. For example, the base layer BL may include a first region NBA and a second region BA bent from the first region NBA. For example, the second region BA may be extended from the first region NBA and may be bendable.

At least one inorganic layer may be formed on a top surface of the base layer BL. The inorganic layer may include aluminum oxide, titanium oxide, silicon oxide silicon oxynitride, zirconium oxide, and/or hafnium oxide. For example, a plurality of inorganic layers may have a multi-layered structure. The multi-layered inorganic layers may constitute a barrier layer BRL and/or a buffer layer BFL to be described below. In an exemplary embodiment of the present inventive concept, the barrier layer BRL and/or the buffer layer BFL may be optionally omitted.

The barrier layer BRL may be configured to prevent contaminants from infiltrating into the display panel DP. The barrier layer BRL may include a silicon oxide layer and a silicon nitride layer. In an exemplary embodiment of the present inventive concept, the barrier layer BRL may include a plurality of silicon oxide layers and a plurality of silicon nitride layers that are alternately stacked.

The buffer layer BFL may be disposed on the barrier layer BRL. The buffer layer BFL may be configured to increase an adhesion strength between the base layer BL and conductive or semiconductor patterns. The buffer layer BFL may include a silicon oxide layer and a silicon nitride layer. In an exemplary embodiment of the present inventive concept, the buffer layer BFL may include a plurality of silicon oxide layers and a plurality of silicon nitride layers that are alternately stacked.

A first semiconductor pattern OSP1 may be disposed on the buffer layer BFL. The first semiconductor pattern OSP1 may include silicon. The first semiconductor pattern OSP1 may be formed of or may otherwise include polycrystalline silicon. However, the inventive concept is not limited thereto, and the first semiconductor pattern OSP1 may be formed of or may otherwise include amorphous silicon. The first semiconductor pattern OSP1 may include an input region (or a first portion), an output region (or a second portion), and a channel region (or a third portion) defined between the input and output regions. The channel region of the first semiconductor pattern OSP1 may be defined to correspond to a first control electrode GE1 to be described below. The input region and the output region may be doped with impurities, thereby providing the input region with a conductivity that is higher than that of the channel region. For example, the input region and the output region may be doped to have an n-type conductivity. In an exemplary embodiment of the present inventive concept, the first thin-film transistor T1 is illustrated to be of an n-type, but in an exemplary embodiment of the present inventive concept, the first thin-film transistor T1 may be a p-type transistor.

A first insulating layer 10 may be disposed on the buffer layer BFL. The first insulating layer 10 may commonly overlap a plurality of the pixels PX (e.g., see FIG. 1A) and may cover the first semiconductor pattern OSP1. The first insulating layer 10 may be an inorganic layer and/or an organic layer and may have a single- or multi-layered structure. The first insulating layer 10 may include aluminum oxide, titanium oxide, silicon oxide, silicon oxynitride, zirconium oxide, and/or hafnium oxide. In an exemplary embodiment of the present inventive concept, the first insulating layer 10 may be a silicon oxide layer having a single-layered structure.

The first control electrode GE1 may be disposed on the first insulating layer 10. The first control electrode GE1 may at least overlap a channel region of the first semiconductor pattern OSP1.

A second insulating layer 20 may be disposed on the first insulating layer 10 to cover the first control electrode GE1. The second insulating layer 20 may commonly overlap a plurality of the pixels PX (e.g., see FIG. 1). The second insulating layer 20 may be an inorganic layer and/or an organic layer and may have a single-layered structure or multi-layered structure. The second insulating layer 20 may include aluminum oxide, titanium oxide, silicon oxide, silicon oxynitride, zirconium oxide, and/or hafnium oxide. In an exemplary embodiment of the present inventive concept, the second insulating layer 20 may be a single silicon oxide layer.

An upper electrode UE may be further disposed on the second insulating layer 20. The upper electrode UE may overlap the first control electrode GE1.

A third insulating layer 30 may be disposed on the second insulating layer 20 and may cover the upper electrode UE. The third insulating layer 30 may be an inorganic layer and/or an organic layer and may have a single- or multi-layered structure. The third insulating layer 30 may be formed of or may otherwise include aluminum oxide, titanium oxide, silicon oxide, silicon oxynitride, zirconium oxide, and/or hafnium oxide. In an exemplary embodiment of the present inventive concept, the third insulating layer 30 may be a single silicon oxide layer.

A second semiconductor pattern OSP2 may be disposed on the third insulating layer 30. The second semiconductor pattern OSP2 may include oxide semiconductors. The second semiconductor pattern OSP2 may include a crystalline or amorphous oxide semiconductor. For example, the oxide semiconductors may include metal oxides, whose metallic element is zinc (Zn), indium (In), gallium (Ga), tin (Sn), and/or titanium (Ti), or may include mixtures of zinc (Zn), indium (In), gallium (Ga), tin (Sn), and/or titanium (Ti) and oxides thereof. As an example, the oxide semiconductor may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), zinc-tin oxide (ZTO), and/or the like.

The second semiconductor pattern OSP2 may include an input region (or a first portion), an output region (or a second portion), and a channel region (or a third portion) defined between the input region and the output region. The input region and the output region may contain impurities or dopants. The channel region of the second semiconductor pattern SP2 may be defined to correspond to a second control electrode GE2 to be described below.

A reduced metallic element may be used for the impurities in the second semiconductor pattern SP2. The input region and the output region may contain a metallic element reduced from the metal oxide of the channel region. Accordingly, it may be possible to reduce a leakage current of the second thin-film transistor T2, and thus, the second thin-film transistor T2 may be used as a switching device with greater on/off characteristics.

An insulating pattern GIP may be disposed on the channel region of the second semiconductor pattern OSP2. The second control electrode GE2 may be disposed on the insulating pattern GIP. The second control electrode GE2 may overlap, at least, the insulating pattern GIP. An edge of the insulating pattern GIP may be aligned along an edge of the second control electrode GE2. The second control electrode GE2 may have the same shape as the insulating pattern GIP, when viewed in a plan view. The second control electrode GE2 may be a structure within the insulating pattern GIP, when viewed in a plan view.

A fourth insulating layer 40 may be disposed on the third insulating layer 30 to cover the second semiconductor pattern OSP2 and the second control electrode GE2. The fourth insulating layer 40 may be an inorganic layer and/or an organic layer and may have a single- or multi-layered structure. The fourth insulating layer 40 may include aluminum oxide, titanium oxide, silicon oxide, silicon oxynitride, zirconium oxide, and/or hafnium oxide. In an exemplary embodiment of the present inventive concept, the fourth insulating layer 40 may include a silicon oxide layer and a silicon nitride layer. In an exemplary embodiment of the present inventive concept, the fourth insulating layer 40 may include a plurality of silicon oxide layers and a plurality of silicon nitride layers, which are alternately stacked.

A first input electrode DE1, a first output electrode SE), a second input electrode DE2, and a second output electrode SE2 may be disposed on the fourth insulating layer 40. The first input electrode DE1 and the first output electrode SE1 may be coupled to the first semiconductor pattern OSP1 through a first contact hole CH1 and a second contact hole CH2, which are formed to expose the input region and the output region, respectively, of the first semiconductor pattern OSP1. The first contact hole CH1 and the second contact hole CH2 may penetrate the first insulating layer 10 to the fourth insulating layer 40.

The second input electrode DE2 and the second output electrode SE2 may be coupled to the second semiconductor pattern OSP2 through a third contact hole CH3 and a fourth contact hole CH4, which are formed to expose the input region and the output region, respectively, of the second semiconductor pattern OSP2. The third contact hole CH3 and fourth contact hole CH4 may penetrate the fourth insulating layer 40.

A fifth insulating layer 50 may be disposed on the fourth insulating layer 40 to cover the first input electrode DE1, the first output electrode SE1, the second input electrode DE2, and the second output electrode SE2. The fifth insulating layer 50 may be an organic layer and may have a single- or multi-layered structure.

A connection electrode CNE may be disposed on the fifth insulating layer 50. The connection electrode CNE may be connected to the first output electrode SE1 through a fifth contact hole CH5 penetrating the fifth insulating layer 50. A sixth insulating layer 60 or a passivation layer may be disposed on the fifth insulating layer 50 to cover the connection electrode CNE. The sixth insulating layer 60 may be an organic layer and may have a single- or multi-layered structure.

In an exemplary embodiment of the present inventive concept, the fifth insulating layer 50 and the sixth insulating layer 60 may be a polyimide resin layer having a single-layered structure. However, the inventive concept is not limited thereto, and in an exemplary embodiment of the present inventive concept, the fifth insulating layer 50 and the sixth insulating layer 60 may include acryl resins, methacryl resins, polyisoprene resins, vinyl resins, epoxy resins, urethane resins, cellulose resins, siloxane resins, polyamide resins, and/or perylene resins.

The organic light emitting diode OLED may be disposed on the sixth insulating layer 60. An anode AE of the organic light emitting diode OLED may be disposed on the sixth insulating layer 60. The anode AE may be connected to the connection electrode CNE through a sixth contact hole CH6 penetrating the sixth insulating layer 60. A pixel definition layer PDL may be disposed on the sixth insulating layer 60.

The pixel definition layer PDL may have an opening OP that exposes at least a portion of the anode AE. The opening OP of the pixel definition layer PDL may define a light-emitting region PXA of each pixel. For example, a plurality of the pixels PX (e.g., see FIG. 1A) may be regularly arranged on a flat surface of the display panel DP (e.g., see FIG. 1A). Regions, in which the pixels PX are disposed, may be 'pixel regions', and each of the pixel regions may include the light-emitting region PXA and a non-light-emitting region NPXA adjacent to the light-emitting region PXA. The non-light-emitting region NPXA may enclose the light-emitting region PXA.

The display region DP-DA of FIGS. 1A and 1B may include a plurality of pixel regions. For example, the display region DP-DA may include a plurality of the light-emitting regions PXA and the non-light-emitting region NPXA, which encloses the plurality of the light-emitting regions PXA. The hole control layer HCL may be commonly disposed in the light-emitting region PXA and the non-light-emitting region NPXA. The common layer, such as the hole control layer HCL, may be commonly disposed in a plurality of the pixels PX. The hole control layer HCL may include a hole transport layer and a hole injection layer.

An organic light emitting layer EML may be disposed on the hole control layer HCL. The organic light emitting layer EML may be locally disposed exclusively on a region corresponding to the opening OP. The organic light emitting layer EML may be divided into a plurality of patterns that are respectively formed in the pixels PX.

In an exemplary embodiment of the present inventive concept, the organic light emitting layer EML is illustrated to have a patterned structure, but in an exemplary embodiment of the present inventive concept, the organic light emitting layer EML may be commonly disposed in a plurality of the pixels PX. Here, the organic light emitting layer EML may be configured to emit a white-color light. Furthermore, the organic light emitting layer EML may have a multi-layered structure.

An electron control layer ECL may be disposed on the organic light emitting layer EML. The electron control layer ECL may include an electron transport layer and an electron injection layer. A cathode CE may be disposed on the electron control layer ECL. The electron control layer ECL and the cathode CE may be commonly disposed in a plurality of the pixels PX.

A thin encapsulation layer TFE may be disposed on the cathode CE. The thin encapsulation layer TFE may commonly cover a plurality of the pixels PX. In an exemplary embodiment of the present inventive concept, the thin encapsulation layer TFE may directly cover the cathode CE. In an exemplary embodiment of the present inventive concept, a capping layer may cover the cathode CE. In an exemplary embodiment of the present inventive concept, a stacking structure of the organic light emitting diode OLED may have a shape obtained by reversing the structure illustrated in FIG. 3B.

The thin encapsulation layer TFE may include an inorganic layer and/or an organic layer. In an exemplary embodiment of the present inventive concept, the thin encapsulation layer TFE may include two inorganic layers and an organic layer therebetween. In an exemplary embodiment of the present inventive concept, the thin encapsulation layer TFE may include a plurality of inorganic layers and a plurality of organic layers, which are alternately stacked (e.g. an inorganic layer over an organic layer over an inorganic layer, etc.).

The inorganic encapsulation layer may protect the organic light emitting diode OLED from moisture or oxygen, and the organic encapsulation layer may protect the organic light emitting diode OLED from contaminants (e.g., dust particles). The inorganic encapsulation layer may include a silicon nitride layer, a silicon oxynitride layer, a silicon oxide layer, a titanium oxide layer, and/or an aluminum oxide layer, but the inventive concept is not limited thereto. The organic encapsulation layer may include an acrylic organic layer, but the inventive concept is not limited thereto.

In an exemplary embodiment of the present inventive concept, the first thin-film transistor T1 may contain silicon (e.g. poly silicon), thereby having high electron mobility. The second thin-film transistor T2 may contain an oxide semiconductor material, and this may make it possible to reduce a leakage current. As a result, it may be possible to reduce a driving voltage of the pixel PX (e.g., see FIG. 3A) and to prevent the pixel PX from malfunctioning.

In an exemplary embodiment of the present inventive concept, a first electrode E1 and a second electrode E2 of the capacitor Cst may be formed by the same process as elements of the first thin-film transistor T1, as shown in FIG. 3C.

The first electrode E1 of the capacitor Cst may be disposed on the first insulating layer 10. The first electrode E1 may be formed by the same process as the first control electrode GE1. The first electrode E1 may be connected to the first control electrode GEL. The second insulating layer 20 may cover the first electrode E1. The second electrode E2 of the capacitor Cst may be disposed on the second insulating layer 20.

In an exemplary embodiment of the present inventive concept, the upper electrode UE may be electrically connected to the second electrode E2. Furthermore, the upper electrode UE and the second electrode E2 may be formed through the same process, and in an exemplary embodiment of the present inventive concept, the upper electrode UE and the second electrode E2 may be connected to each other, thereby forming a single body. The third insulating layer 30 may be disposed on the second insulating layer 20 to cover the second electrode E2 and the upper electrode UE.

Each of FIGS. 4A and 4B illustrates a vertical section of the curvature region CA of FIG. 2, taken parallel to the first direction DR1. FIG. 4A is a vertical section of a portion that overlaps the signal line DL, and FIG. 4B is a vertical section of a portion, in which the signal line DL is not disposed. In FIG. 4A, the data line DL is illustrated as the signal line SGL.

As shown in the vertical sections of FIGS. 4A and 4B, the second region BA may have a stacking structure that is similar to that of the first region NBA (e.g., of the display region DP-DA). The barrier layer BRL, the buffer layer BFL, and the first to sixth insulating layers 10 to 60 may be sequentially disposed on the top surface of the base layer BL.

A groove GV-1 (hereinafter referred to as a "lower groove") may be defined in the barrier layer BRL and/or the buffer layer BFL to overlap the second region BA. The lower groove GV-1 may be defined in the curvature region CA. For example, the inorganic layers BRL and BFL, which are placed below the first semiconductor pattern OSP1 (e.g., see FIGS. 3B and 3C), may overlap the display region DP-DA and may extend to the second region BA. The lower groove GV-1 may be defined in the inorganic layers BRL and BFL. When measured in the first direction DR1, a width of the base layer BL exposed by the lower groove GV-1 may be smaller than a width of the curvature region CA.

A groove GV-2 (hereinafter referred to as an "upper groove") may be defined in the first to fourth insulating layers 10 to 40 and may overlap the second region BA. The upper groove GV-2 may be defined in the curvature region CA. In an exemplary embodiment of the present inventive concept, the first to fourth insulating layers 10 to 40 may partially expose a top surface of the topmost layer of the inorganic layers including the barrier layer BRL and the buffer layer BFL.

Side surfaces of the barrier layer BRL and the buffer layer BFL defining the lower groove GV-1 may be inclined at an angle, when viewed in a cross-sectional view. Side surfaces of the first to fourth insulating layers 10 to 40 defining the upper groove GV-2 may be inclined at an angle, when viewed in a cross-sectional view.

In an exemplary embodiment of the present inventive concept, when measured in the first direction DR1, a width of the upper groove GV-2 at the level of the fourth insulating layer 40 may be larger than a width of the curvature region CA.

The fifth insulating layer 50, which is an organic layer, may be disposed in the lower groove GV-1 and the upper groove GV-2. The fifth insulating layer 50 may be in contact with a top surface of the base layer BL, an inclined surface of the lower groove GV-1, and an inclined surface of the upper groove GV-2. The fifth insulating layer 50 may be in contact with a portion of the top surface of the buffer layer BFL exposed through the first to sixth insulating layers 10 to 60. By providing the organic layer in the bending region, flexibility of the bending region may be increased.

At least a portion of the signal line DL may be disposed on the fifth insulating layer 50. The sixth insulating layer 60 may cover and protect the signal line DL. Another portion of the signal line DL (e.g., located on the display region DP-DA) may be disposed on a layer different from the fifth insulating layer 50. For example, the other portion of the signal line DL may be disposed on the fourth insulating layer 40. The portion and the other portion of the signal line DL may be connected through contact holes penetrating the fifth insulating layer 50. These contact holes may be disposed in the non-display region DP-NDA of the first region NBA.

In an exemplary embodiment of the present inventive concept, at least one of the layers disposed on the display region DP-DA may be extended onto a top surface of the sixth insulating layer 60.

FIGS. 5A to 5M are cross-sectional views illustrating a process of fabricating the display panel DP, according to an exemplary embodiment of the inventive concept. Each of FIGS. 5A to 5M is provided to comparatively illustrate two regions corresponding to those of FIGS. 3B and 4A. For concise description, an element previously described with reference to FIGS. 1 to 4B may be identified by the same reference number without repeating an overlapping description thereof.

As shown in FIG. 5A, at least one inorganic layer may be formed on the first region NBA and the second region BA of the base layer BL. In the fabricating process of the display panel, the base layer BL may be placed on a working substrate. The working substrate may be removed, after the fabricating process of the display panel.

Inorganic layers may be formed by depositing, coating, or printing an inorganic material. A silicon oxide layer and a silicon nitride layer may be sequentially formed to form the barrier layer BRL. A silicon oxide layer and a silicon nitride layer may be sequentially formed on the barrier layer BRL to form the buffer layer BFL.

As shown in FIG. 5A, a first preliminary semiconductor pattern OSP1-P may be formed on the inorganic layers. The first preliminary semiconductor pattern OSP1-P may be formed by forming and pattering a semiconductor layer. The semiconductor layer may be crystallized before or after the patterning of the semiconductor layer. A doping process may be performed on the first preliminary semiconductor pattern OSP1-P.

Thereafter, as shown in FIG. 5B, the first insulating layer 10 may be formed on the first region NBA and the second region BA of the inorganic layer. The first insulating layer 10 may be formed by a depositing, coating, or printing process. Insulating layers to be disposed on the first insulating layer 10 may also be formed by a depositing, coating, or printing process.

The first control electrode GE1 may be formed on the first insulating layer 10. The formation of the first control electrode GE1 may include forming a conductive layer on the first insulating layer 10 and then patterning the conductive layer. The first electrode E1 of the capacitor Cst may be formed by the same process as the first control electrode GE1.

Next, the first preliminary semiconductor pattern OSP1-P may be doped using the first control electrode GE1 as a mask. A region (hereinafter referred to as a "channel region") overlapping the first control electrode GE1 may remain undoped, and two regions (hereinafter referred to as an "input region" and an "output region"), which are located at both sides of the channel region, may be doped. In an exemplary embodiment of the present inventive concept, n-type dopants (e.g., group V elements) may be used for the doping process. As a result, the first semiconductor pattern OSP1 may be formed.

Hereinafter, as shown in FIG. 5C, the second insulating layer 20 may be formed on the first region NBA and the second region BA of the first insulating layer 10 to cover the first control electrode GE1. The upper electrode UE may be formed on the second insulating layer 20. The second electrode E2 of the capacitor Cst may be formed by the same process as the upper electrode UE.

Figure 5D:
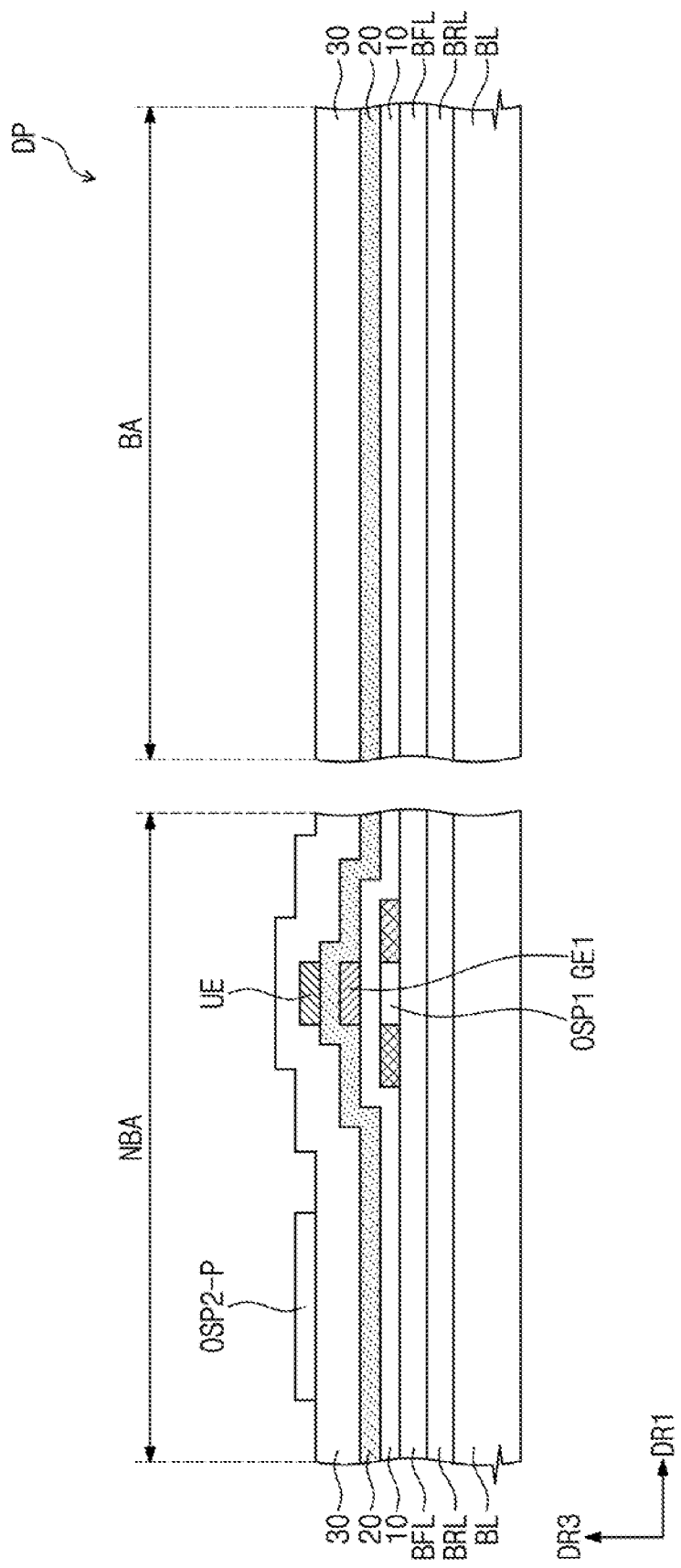

Thereafter, as shown in FIG. 5D, the third insulating layer 30 may be formed on the first region NBA and the second region BA of the second insulating layer 20 to cover the upper electrode UE. A second preliminary semiconductor pattern OSP2-P may be formed on the third insulating layer 30. The second preliminary semiconductor pattern OSP2-P may be formed from a semiconductor layer through a photolithography process.

Figure 5E:
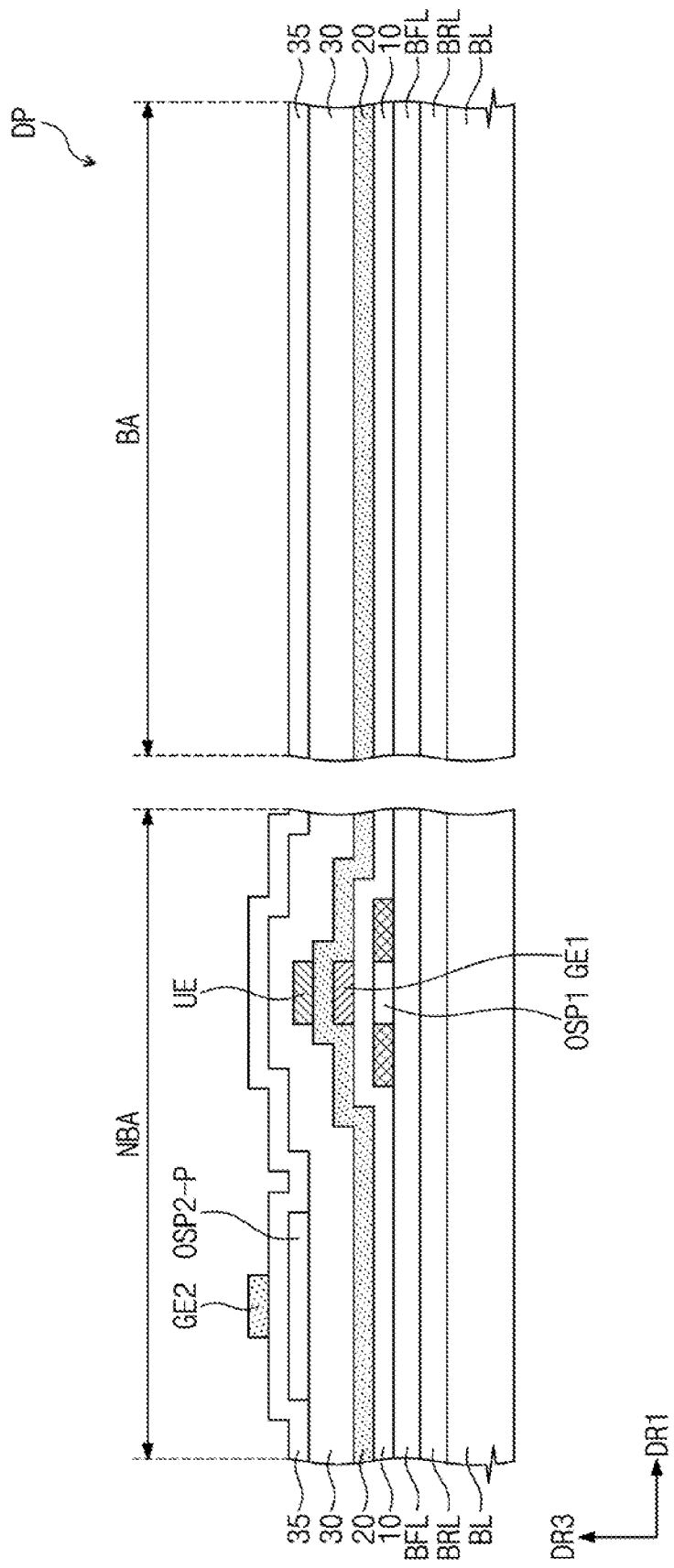

Next, as shown in FIG. 5E, an intermediate insulating layer 35 may be formed on the first region NBA and the second region BA of the third insulating layer 30 to cover the second preliminary semiconductor pattern OSP2-P. The second control electrode GE2 may be formed on the intermediate insulating layer 35. The second control electrode GE2 may be formed from a conductive layer through a photolithography process.

Figure 5F:
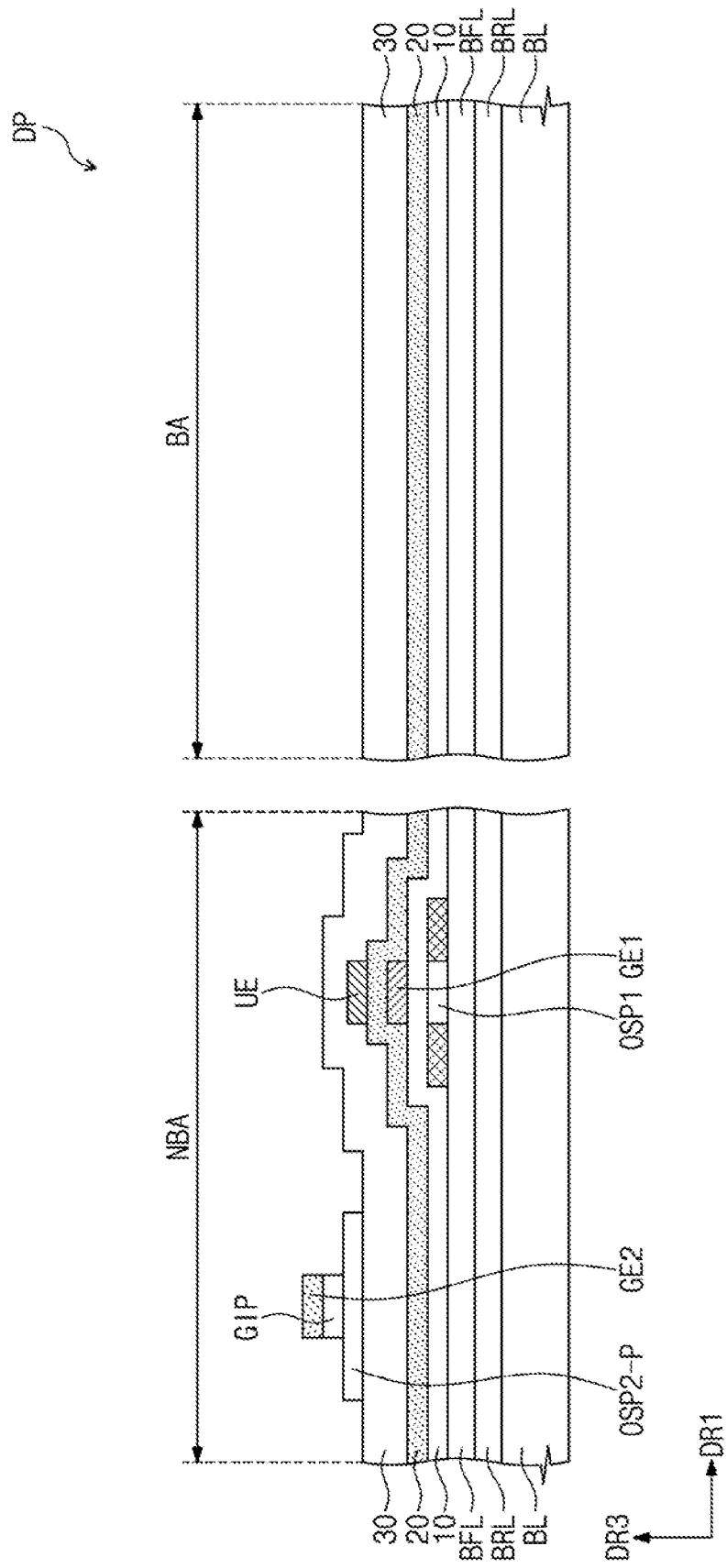

Thereafter, as shown in FIG. 5F, the insulating pattern GIP may be formed from the intermediate insulating layer 35 of FIG. 5E. The insulating pattern GIP may be formed by pattering the intermediate insulating layer 35 using an etching gas. In an exemplary embodiment of the present inventive concept, the second control electrode GE2 may be used as an etching mask for selectively etching the intermediate insulating layer 35. Thus, edges of the insulating pattern GIP and the second control electrode GE2 may be aligned to each other.

Figure 5G:
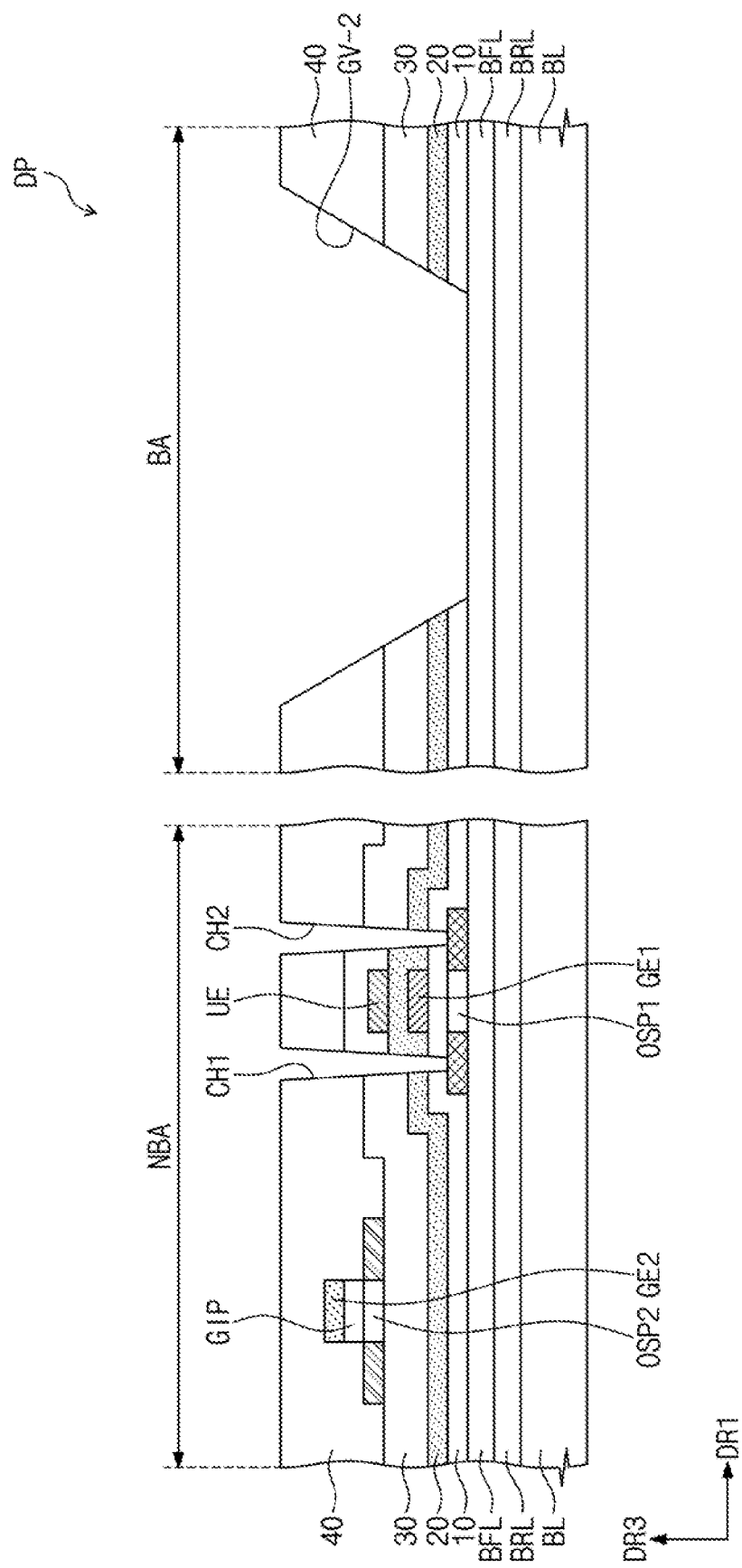

Next, as shown in FIG. 5G, the fourth insulating layer 40 may be formed on the first region NBA and the second region BA of the third insulating layer 30 to cover the second control electrode GE2. A silicon oxide layer and a silicon nitride layer may be sequentially formed.

In the process of forming the fourth insulating layer 40, regions of the second preliminary semiconductor pattern OSP2-P (e.g., see FIG. 5F) that are exposed to the outside may be reduced. For example, two opposite regions of the second preliminary semiconductor pattern OSP2-P may be reduced, and the reduced regions may be an input region and an output region. The input region and the output region may contain a metallic material that is reduced from a metal oxide semiconductor material. A region, which overlaps the insulating pattern GIP and is placed between the input region and the output region, may be a channel region. As a result, the first semiconductor pattern OSP1 may be formed. An additional reduction process may be further performed on the exposed regions of the second preliminary semiconductor pattern OSP2-P (e.g., see FIG. 5F).

Thereafter, a portion of the insulating layers 10 to 40 may be removed (hereinafter, a first etching step). The contact holes CH1 and CH2 may expose the input region and the output region of the first semiconductor pattern OSP1. During the formation of the contact holes CH1 and CH2, the first to fourth insulating layers 10 to 40 may be partially removed on the second region BA, thereby forming the upper groove GV-2.

Figure 5H:
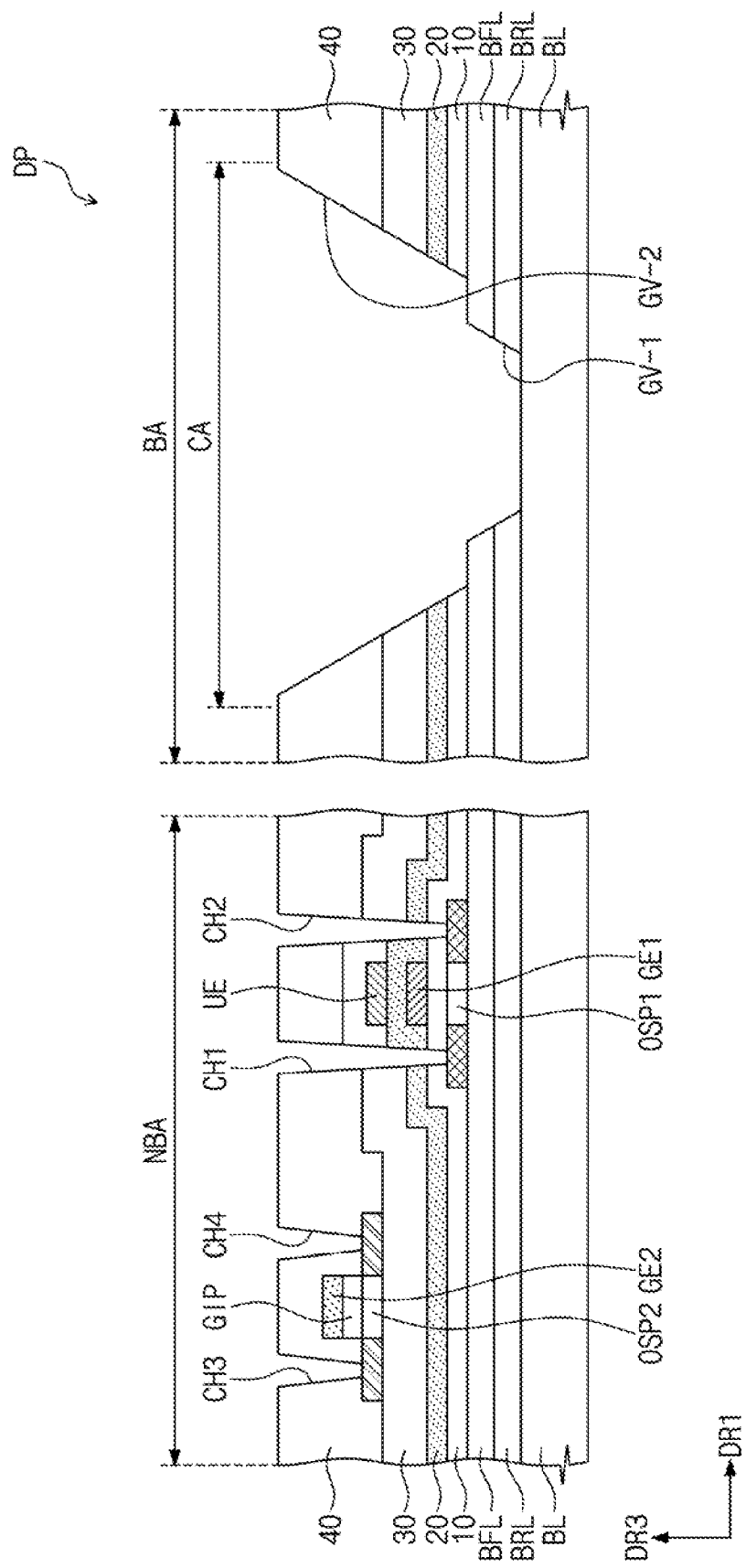

Thereafter, as shown in FIG. 5H, other portion of the insulating layers 10 to 40 and a portion of the inorganic layers may be removed (hereinafter, a second etching step). The contact holes CH3 and CH4 may expose the input region and the output region of the second semiconductor pattern OSP2. During the formation of the contact holes CH3 and CH4, the barrier layer BRL and the buffer layer BFL may be partially removed on the second region BA, thereby forming the lower groove GV-1.

As shown in FIGS. 5G and 5H, the contact holes CH1, CH2, CH3, and CH4 and the grooves GV-1 and GV-2 may be formed by using a mask and an etching gas or by using a laser. Since each of the grooves GV-1 and GV-2 is formed using the same process as corresponding ones of the contact holes CH1, CH2, CH3, and CH4, it may be possible to reduce the total number of masks for the fabrication process. Furthermore, since the upper groove GV-2 and the lower groove GV-1 are formed by different processes, the upper groove GV-2 and the lower groove GV-1 may have a height difference, and thus, a portion of the top surface of the buffer layer BFL may be exposed through the insulating layers 10 to 40.

Figure 5I:
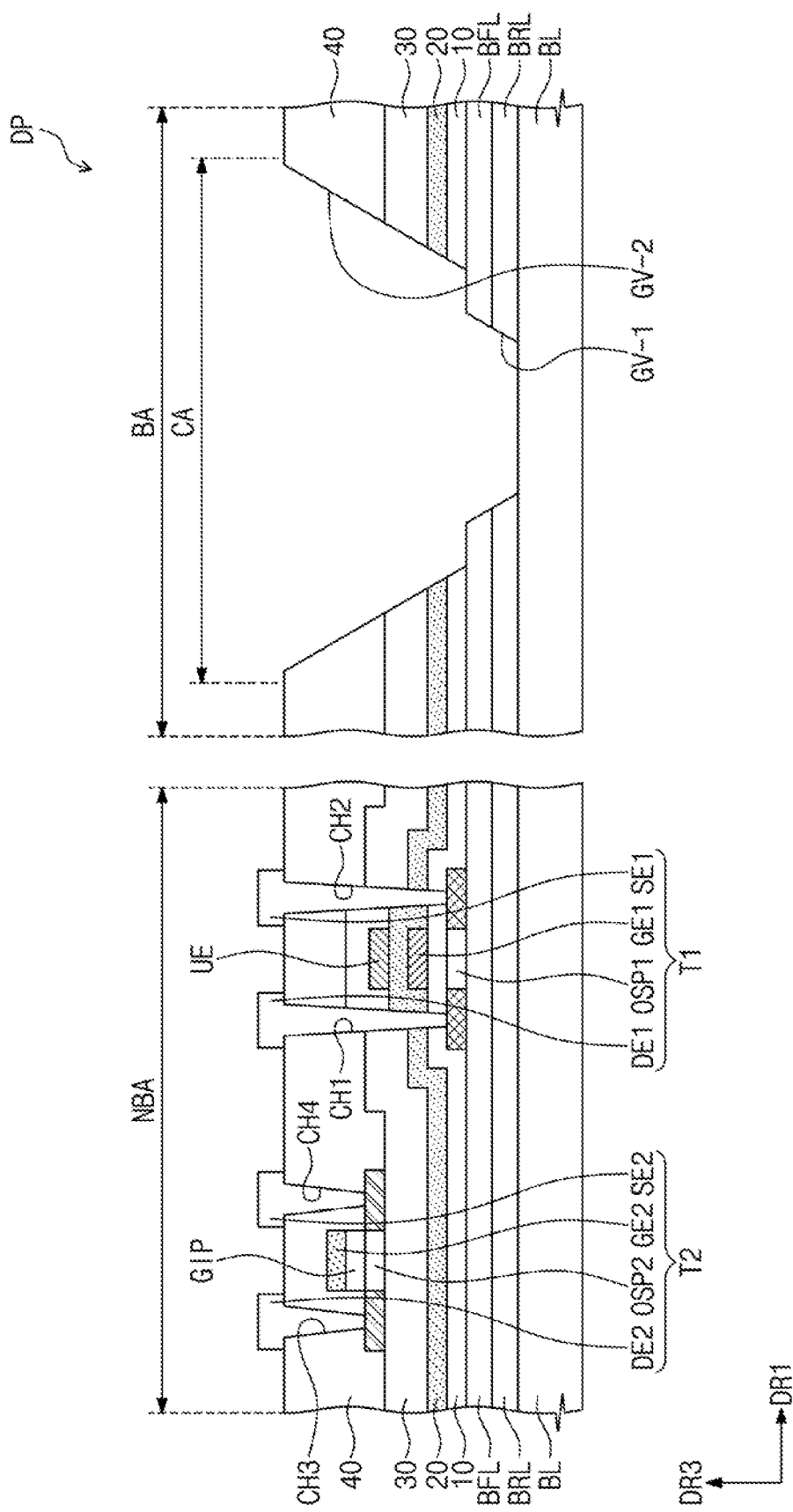

Next, as shown in FIG. 5I, the electrodes DE1, SE1, SE2, and DE2 may be formed on the fourth insulating layer 40. The electrodes DE1, SE1, SE2, and DE2 may be formed through a deposition process.

Figure 5J:
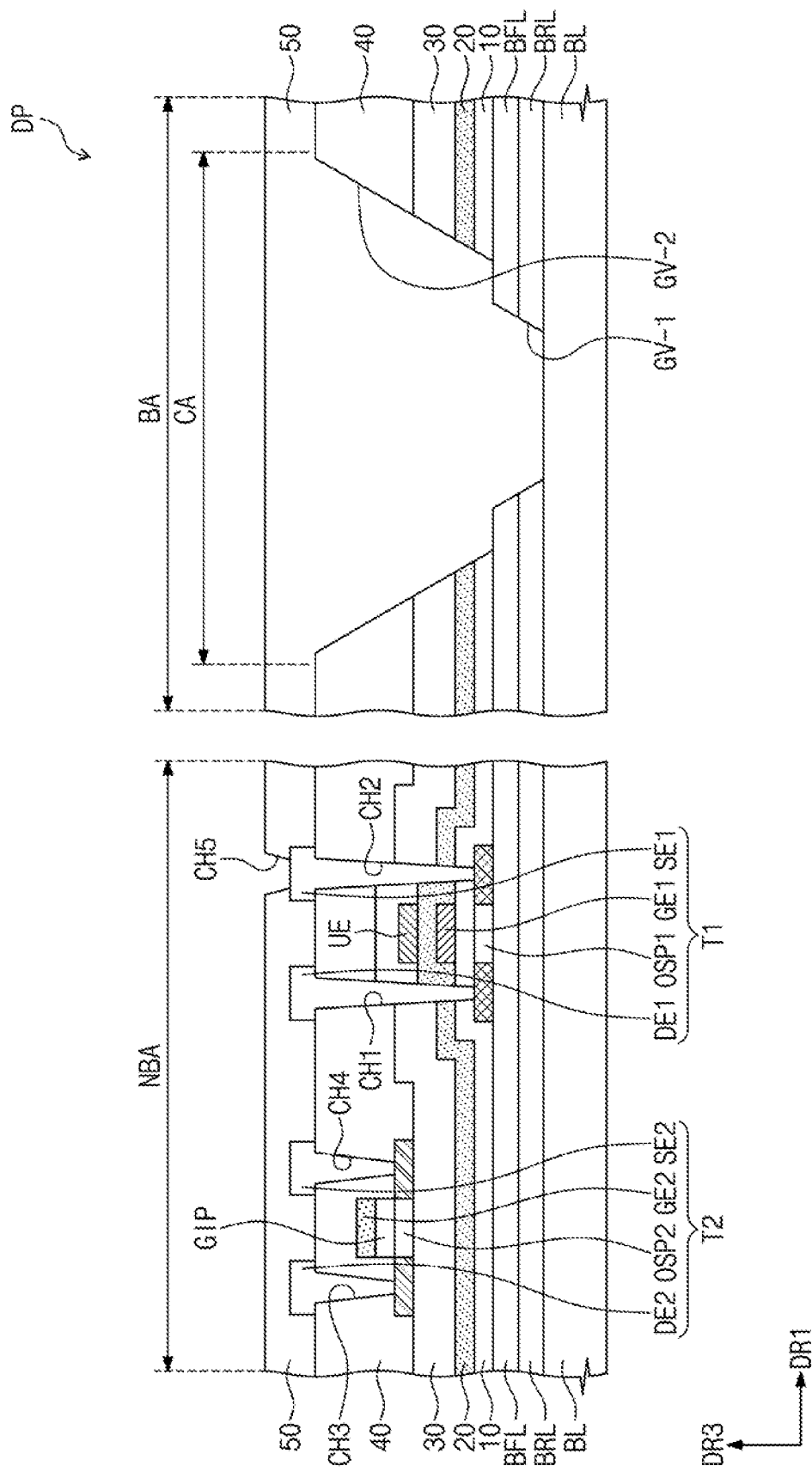

Thereafter, as shown in FIG. 5J, the fifth insulating layer 50 may be formed on the fourth insulating layer 40 to cover the electrodes DE1, SE1, SE2, and DE2. The fifth insulating layer 50 may overlap the first region NBA and the second region BA. The fifth insulating layer 50 may be disposed in the lower groove GV-1 and the upper groove GV-2. The fifth contact hole CH5 exposing the first output electrode SE1 may be formed in the fifth insulating layer 50.

Figure 5K:
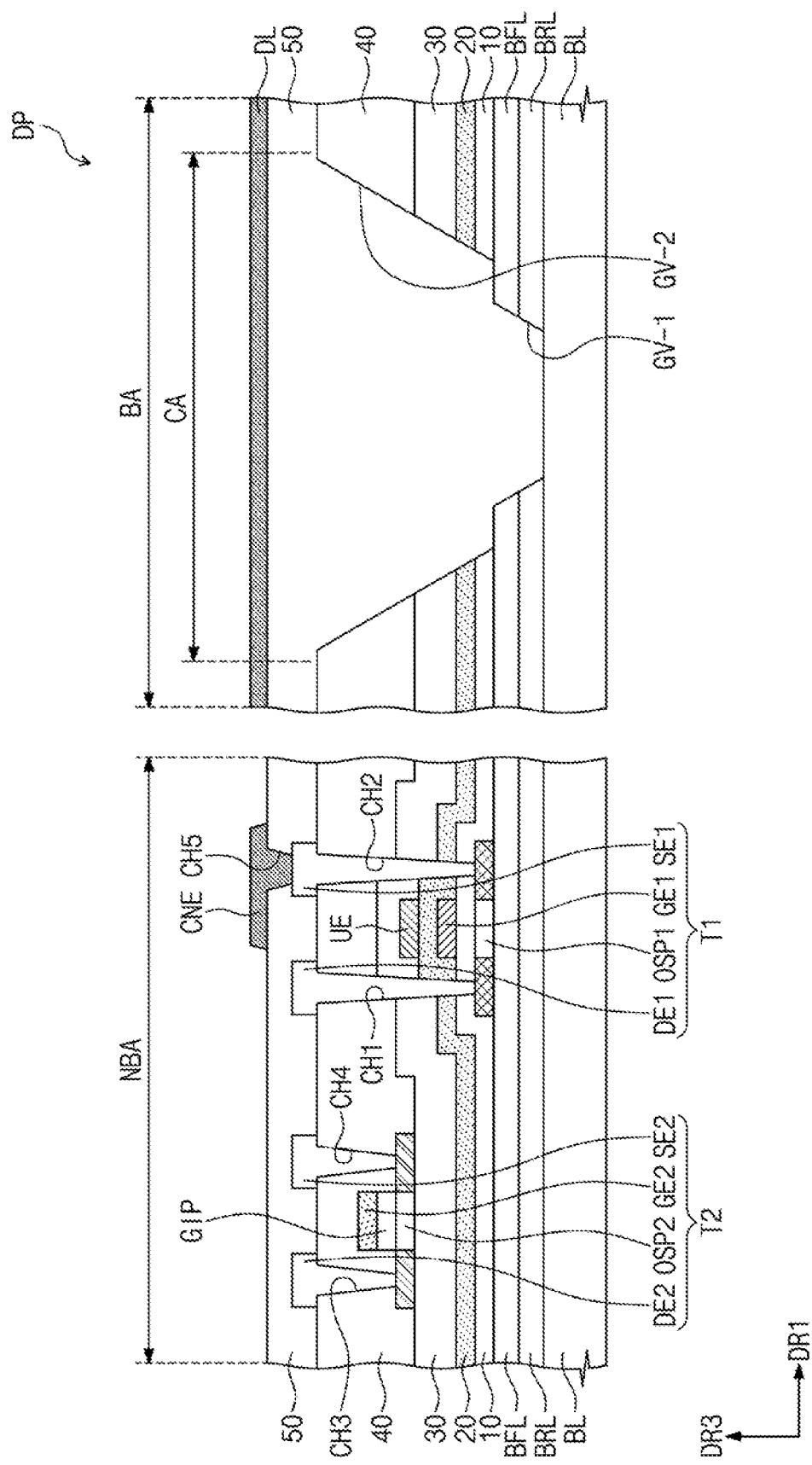

Next, as shown in FIG. 5K, the connection electrode CNE may be formed on the fifth insulating layer 50. A portion of the signal line DL overlaps the second region BA may be formed by the same process as the connection electrode CNE.

Figure 5L:
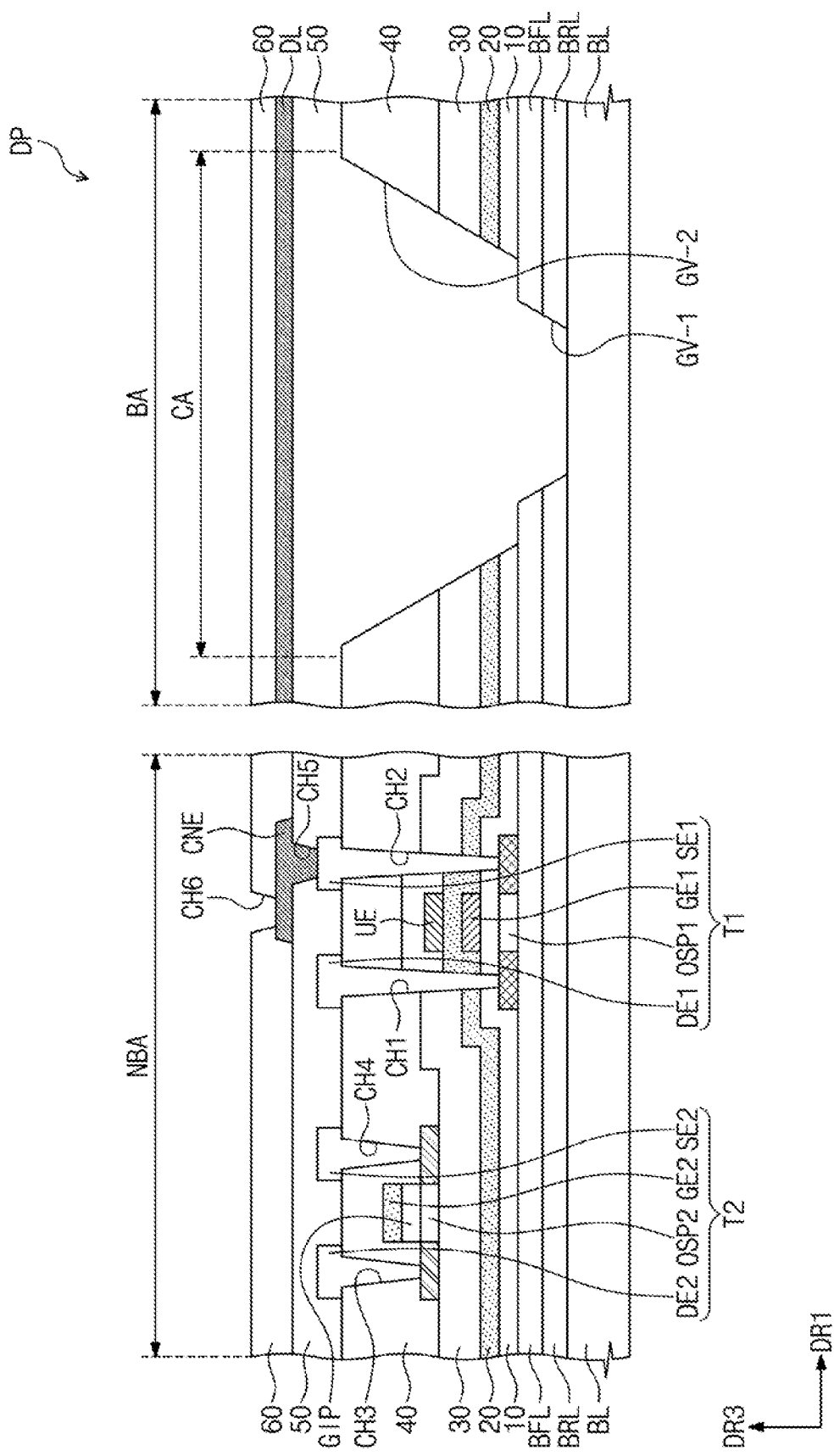

Thereafter, as shown in FIG. 5L, the sixth insulating layer 60 may be formed on the fifth insulating layer 50 to cover not only the connection electrode CNE but also the portion of the signal line DL overlaps the second region BA. The sixth contact hole CH6 may be formed in the sixth insulating layer 60 to expose a top surface of the connection electrode CNE.

Figure 5M:
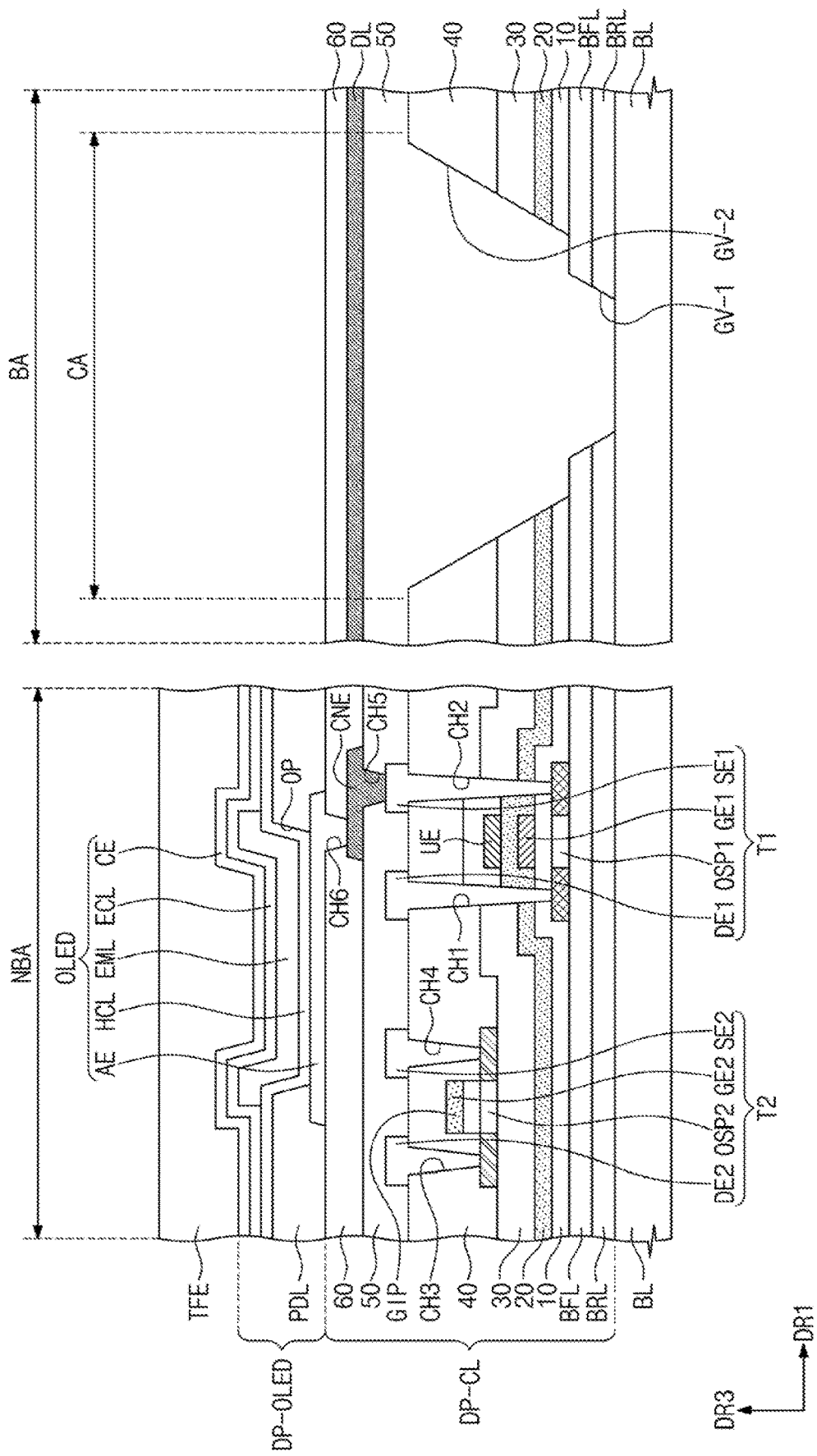

Next, as shown in FIG. 5M, the organic light emitting diode OLED may be formed on the sixth insulating layer 60. The anode AE may be formed on the sixth insulating layer 60 and may be connected to the connection electrode CNE through the sixth contact hole CH6. The pixel definition layer PDL may be formed on the sixth insulating layer 60 to expose a center portion of the anode AE. A preliminary pixel definition layer may be formed on the sixth insulating layer 60. The opening OP may be formed in the preliminary pixel definition layer.

Next, the hole control layer HCL, the light emitting layer EML, the electron control layer ECL, and the cathode CE may be sequentially formed on the first region NBA of the pixel definition layer PDL. The hole control layer HCL, the light emitting layer EML, the electron control layer ECL, and the cathode CE may overlap at least the display region DP-DA (e.g., see FIG. 2), when viewed in a plan view.

The thin encapsulation layer TFE may be formed on the cathode CE. An organic encapsulation layer and/or an inorganic encapsulation layer may be formed by a depositing or inkjet printing process. The thin encapsulation layer TFE may be formed exclusively on the first region NBA and not on the second region BA.

FIGS. 6 to 9 are cross-sectional views illustrating a portion of the display panel DP according to an exemplary embodiment of the inventive concept. Each of FIGS. 6 to 9 illustrate a section corresponding to FIG. 5M. For concise description, an element previously described with reference to FIGS. 1 to 5M may be identified by the same reference number without repeating an overlapping description thereof.

As shown in FIG. 6, the connection electrode CNE and the sixth insulating layer 60 may be omitted. The anode AE may be directly disposed on the fifth insulating layer 50 and may be connected to the first output electrode SE1 through the fifth contact hole CH5. A portion of the signal line DL overlapping the second region BA may be directly disposed on the fifth insulating layer 50.

The portion of the signal line DL overlapping the second region BA may be formed by the same process as the anode AE. The portion of the signal line DL overlapping the second region BA and the anode AE may include the same material and may have the same layer structure.

Figure 7:
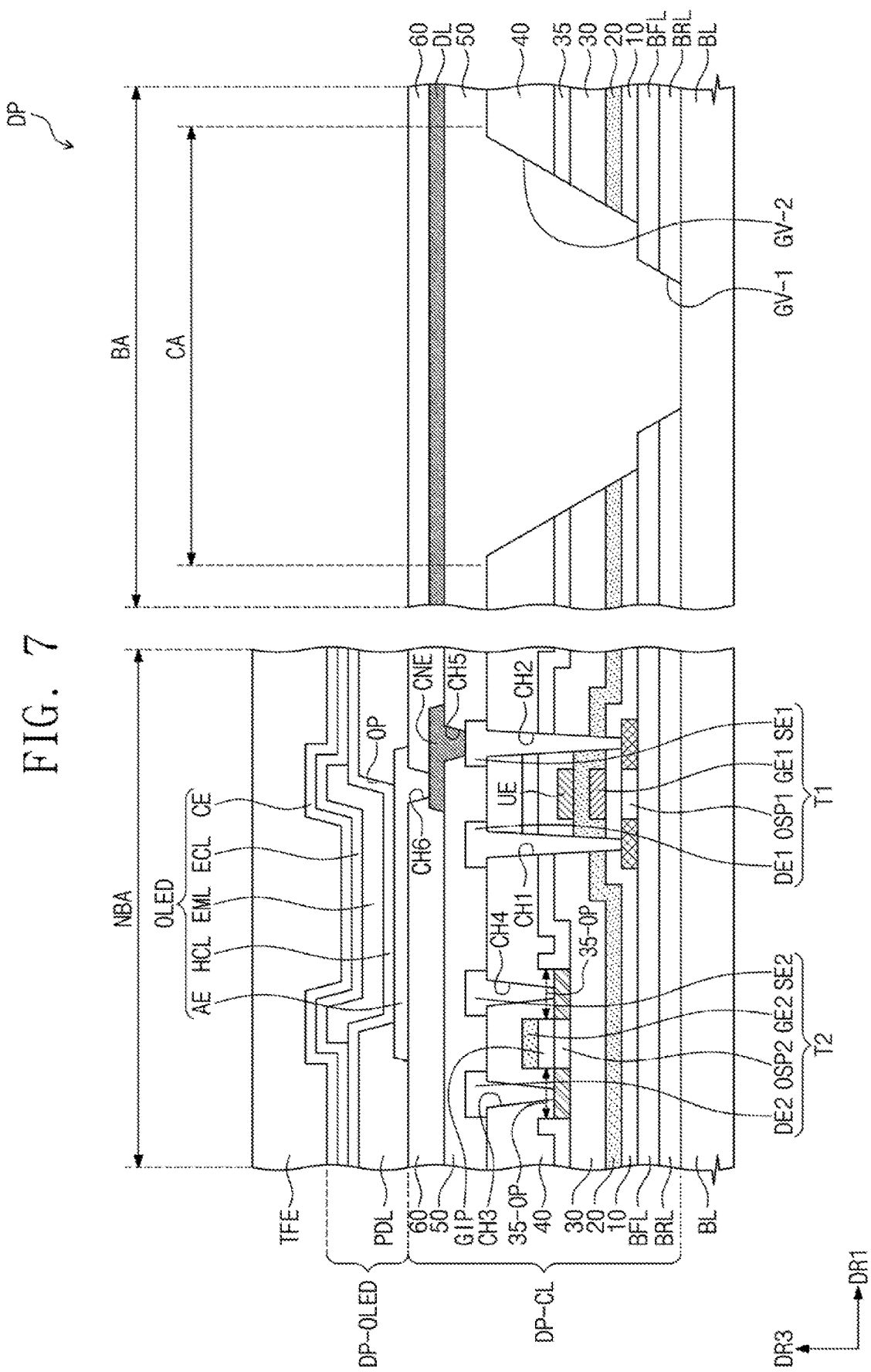

As shown in FIG. 7, the intermediate insulating layer 35 may be further disposed between the third insulating layer 30 and the fourth insulating layer 40. The intermediate insulating layer 35 may overlap the first region NBA and the second region BA.

Openings 35-OP corresponding to the input region and the output region of the second semiconductor pattern OSP2 may be formed in the intermediate insulating layer 35. As shown in FIG. 5E, the openings 35-OP may be formed after the formation of the intermediate insulating layer 35 and the second control electrode GE2. Thereafter, the fourth insulating layer 40 may be formed. The upper groove GV-2 may be formed by removing not only the first to fourth insulating layers 10 to 40 but also by removing the intermediate insulating layer 35.

In an exemplary embodiment of the present inventive concept, the third contact hole CH3 and the fourth contact hole CH4 may penetrate the intermediate insulating layer 35 and the fourth insulating layer 40, and in this case, the additional process for forming the openings 35-OP in the intermediate insulating layer 35 may be omitted.

Figure 8:
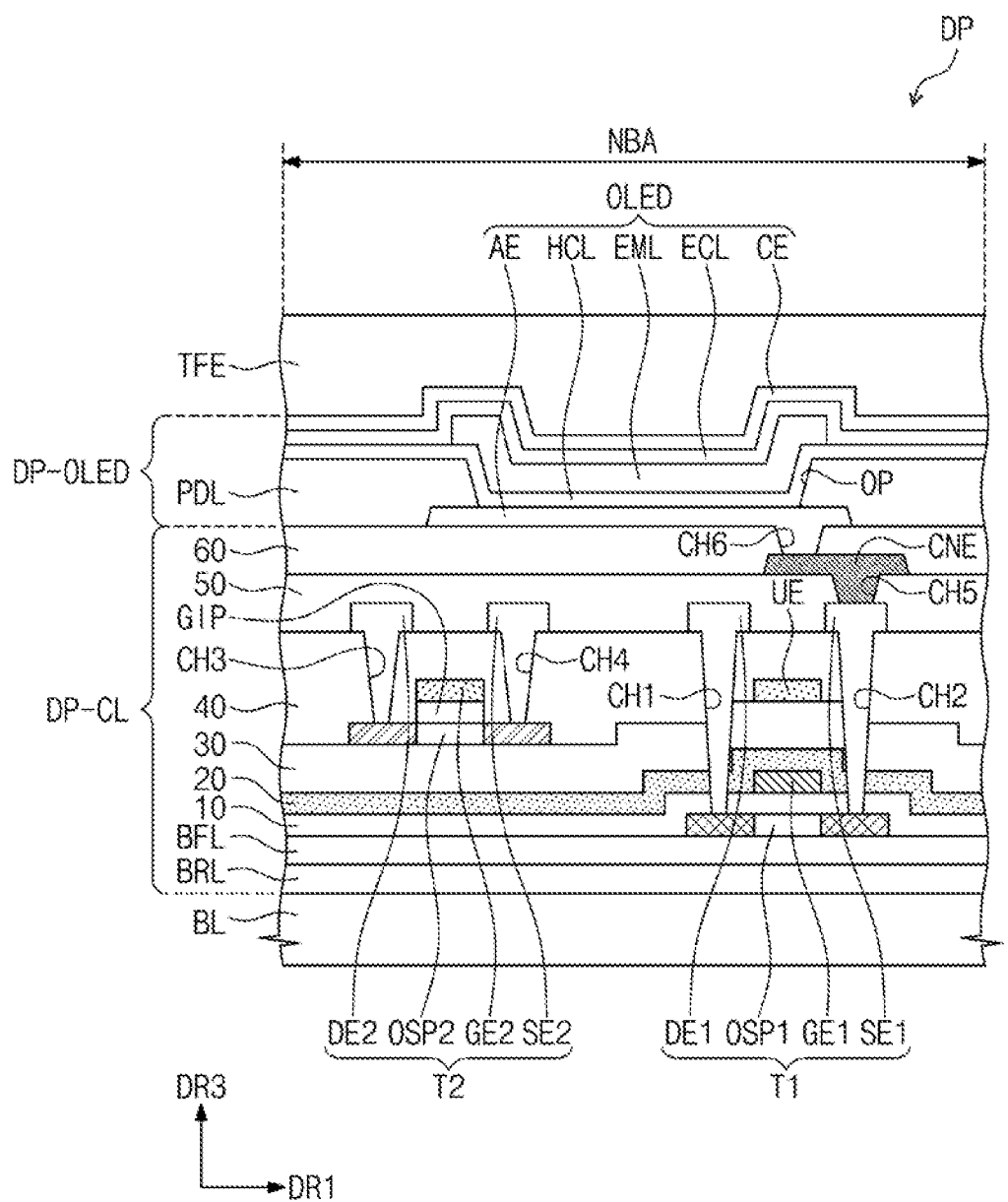

Referring to FIG. 8, the upper electrode UE and the second control electrode GE2 may include the same material and have the same stacking structure. The upper electrode UE and the second control electrode GE2 may be formed from the same conductive layer.

The upper electrode UE may be formed in the step of FIG. 5E, rather than in the step of FIG. 5C. However, after the formation of the intermediate insulating layer 35 shown in FIG. 5E and before formation of a conductive layer, the intermediate insulating layer 35 may be patterned to form the insulating pattern GIP. A conductive layer may be formed on the third insulating layer 30 to cover the insulating pattern GIP, and then, the conductive layer may be patterned to form the upper electrode UE and the second control electrode GE2. The second electrode E2 may also be formed by the same process as the upper electrode UE.

Figure 9:
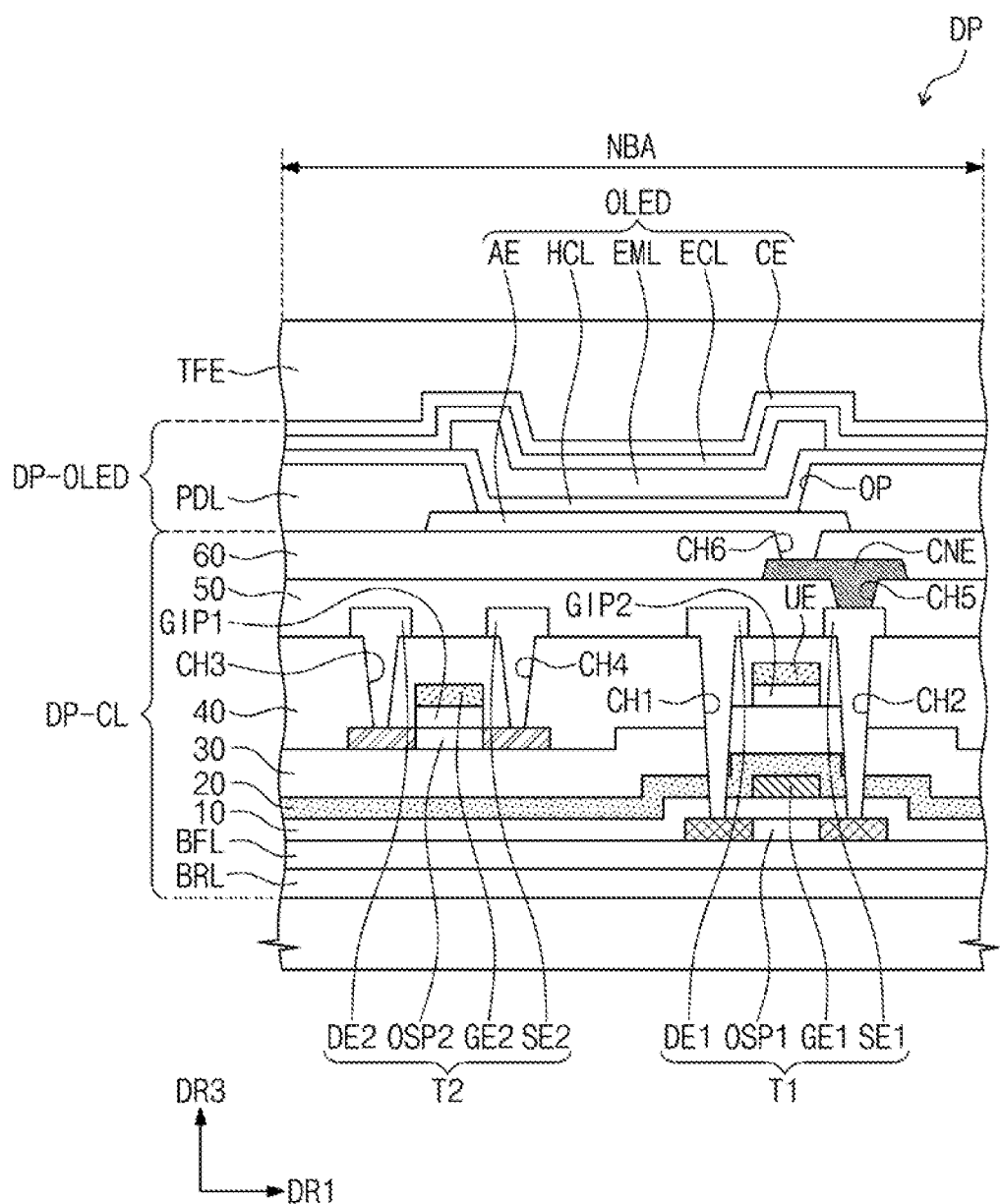

As shown in FIG. 9, the upper electrode UE and the second control electrode GE2 may be disposed on the same layer, may include the same material, and may have the same stacking structure. The upper electrode UE and the second control electrode GE2 may be formed from the same conductive layer.

The upper electrode UE may be formed in the step of FIG. 5E, rather than in the step of FIG. 5C, and in this case, the display panel DP may have the structure of FIG. 9. For example, a process of forming the second control electrode GE2 may include forming a conductive layer on the intermediate insulating layer 35 and then patterning the conductive layer, and here, the upper electrode UE may be formed using the process for forming the second control electrode GE2. Thereafter, the intermediate insulating layer 35 may be etched using the second control electrode GE2 and the upper electrode UE as an etch mask.

A first insulating pattern GIP1 and a second insulating pattern GIP2, which overlap the second control electrode GE2 and the upper electrode UE, respectively, may be formed from the intermediate insulating layer 35 of FIG. 5E. An edge of the second insulating pattern GIP2 may be aligned along an edge of the upper electrode UE. The upper electrode UE may have the same shape as that of the second insulating pattern GIP2, when viewed in a plan view.

FIGS. 10A to 10G are cross-sectional views illustrating a portion of the display panel DP according to an exemplary embodiment of the inventive concept. Each of FIGS. 10A to 10G illustrates a section corresponding to FIG. 5M. For concise description, an element previously described with reference to FIGS. 1 to 9 may be identified by the same reference number without repeating an overlapping description thereof.

As shown in FIGS. 10A to 10G, the display panel DP may further include a light blocking pattern LSP, which is disposed between the buffer layer BFL and the first insulating layer 10 and overlaps the second semiconductor pattern OSP2.

The light blocking pattern LSP may be formed of or may otherwise include a material having high optical absorptivity or high optical reflectance. The light blocking pattern LSP may be disposed below the second semiconductor pattern OSP2 to prevent external light from being incident into the second semiconductor pattern SP2. In this case, it may be possible to prevent a voltage-current property of the second semiconductor pattern SP2 from being affected by an external light and thereby to prevent a leakage current from occurring in the second semiconductor pattern SP2.

Figure 10A:
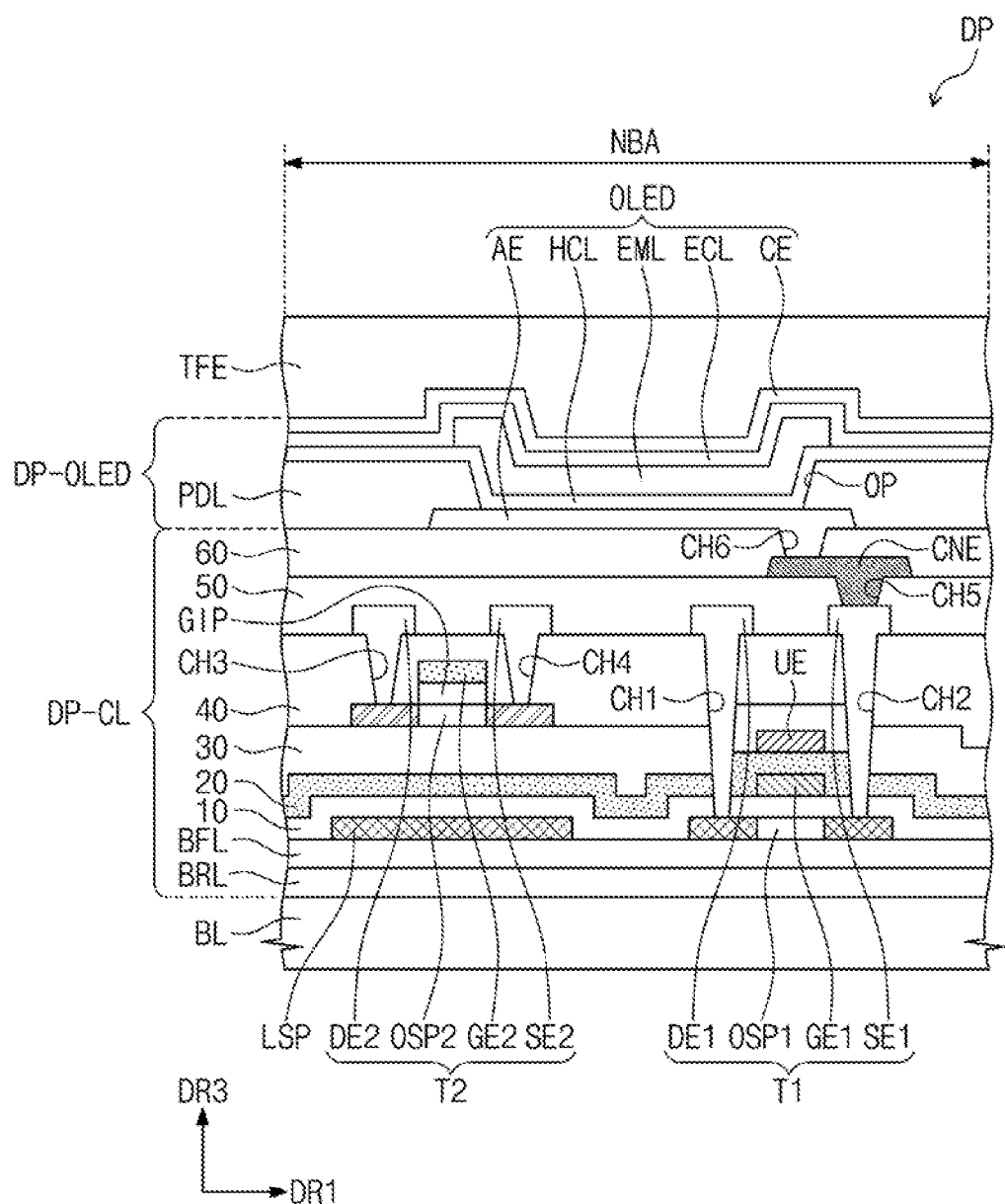
FIGS. 10A to 10G are cross-sectional views illustrating a portion of a display panel according to an exemplary embodiment of the inventive concept.

As shown in FIG. 10A, the light blocking pattern LSP may include the same material as that of the first semiconductor pattern OSP1. For example, the light blocking pattern LSP may include a doped crystalline semiconductor pattern. The light blocking pattern LSP may be formed by the same process as the first preliminary semiconductor pattern OSP1-P of FIG. 5A. Thereafter, the light blocking pattern LSP may be doped during the process illustrated in FIG. 5B.

Figure 10B:
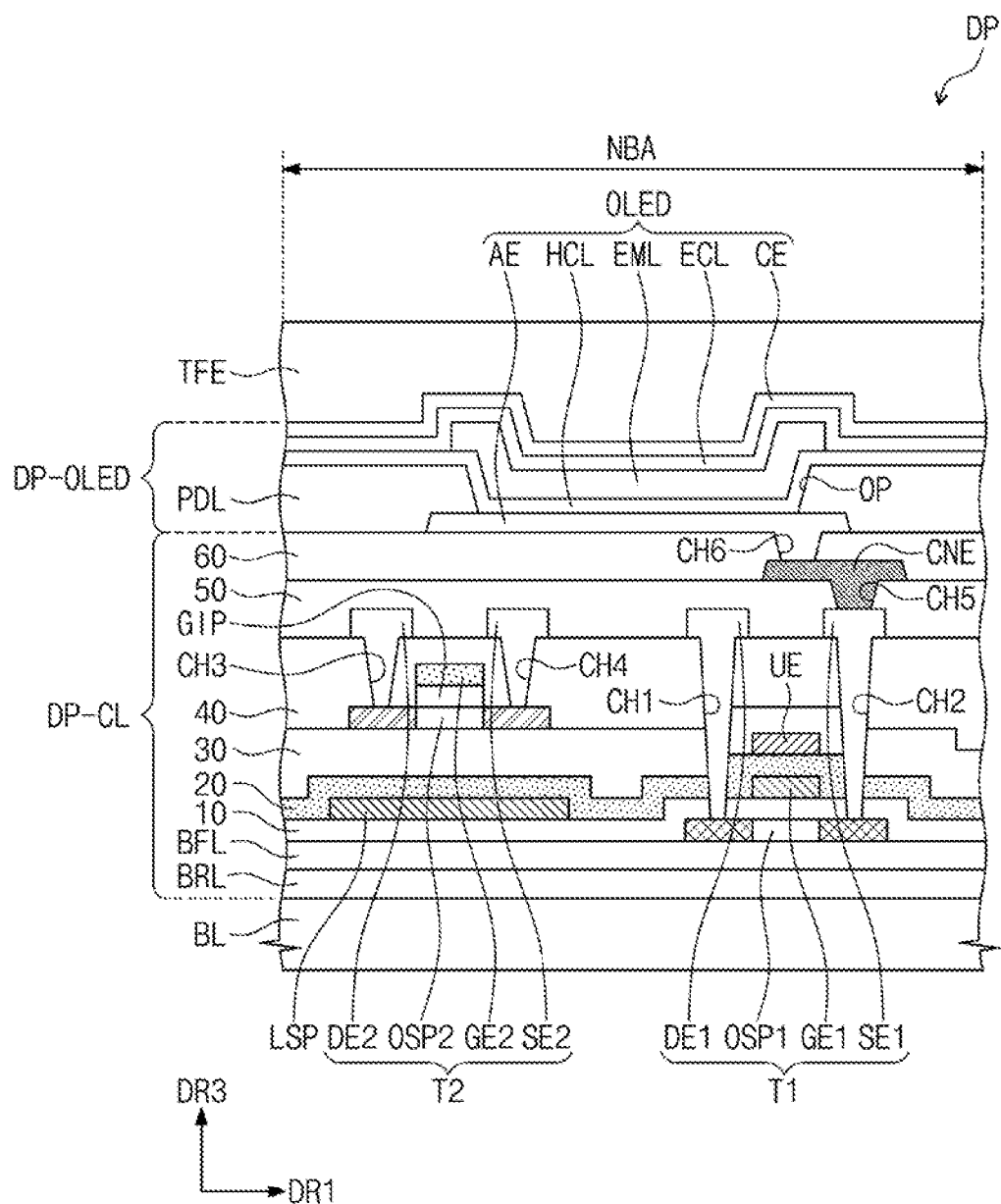
Figure 10C:
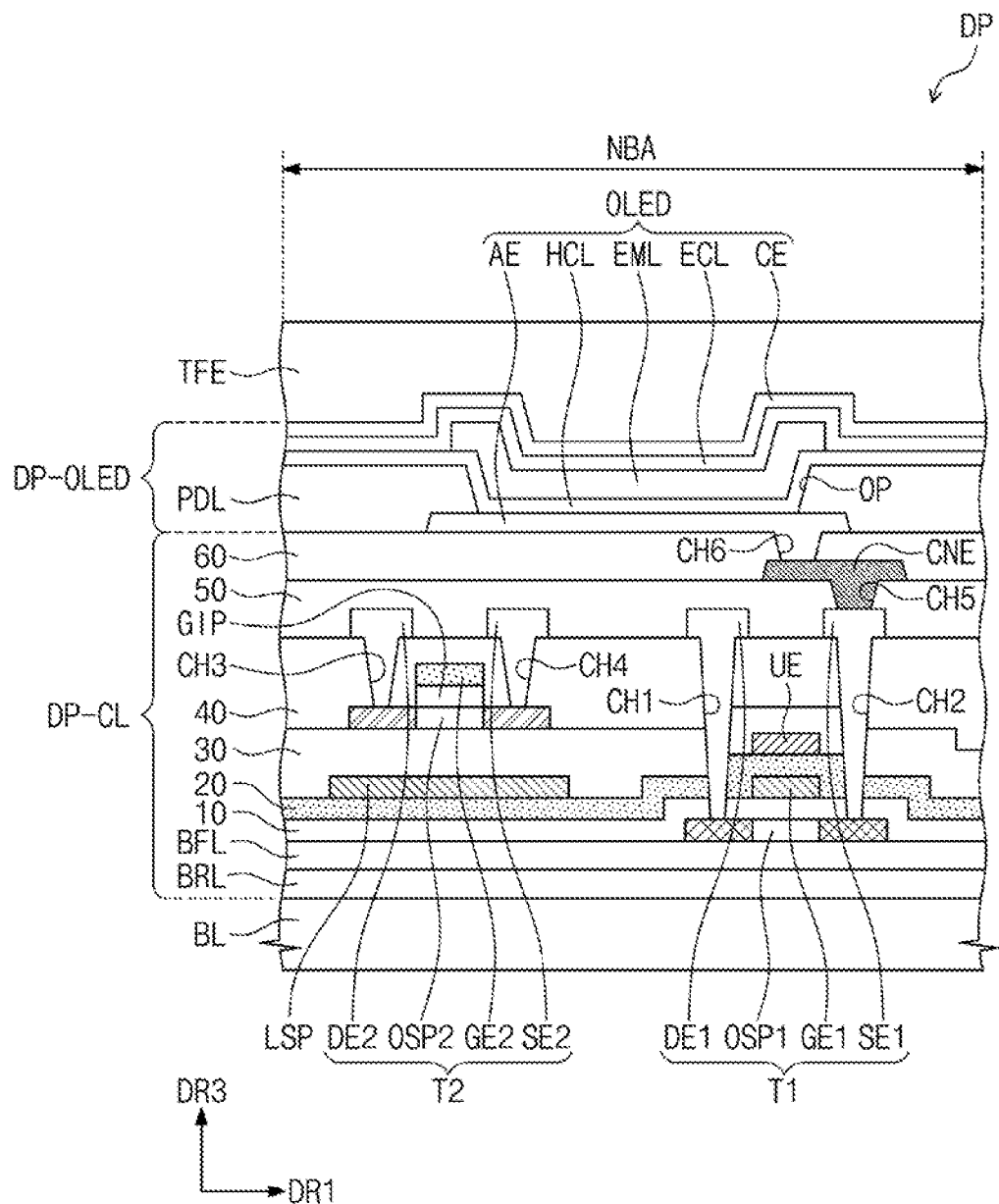

As shown in FIG. 10B, the light blocking pattern LSP may include the same material as the first control electrode GEL. The light blocking pattern LSP may be formed by the same process as the first control electrode GE1 shown in FIG. 5B. As shown in FIG. 10C, the light blocking pattern LSP may include the same material as the upper electrode UE. The light blocking pattern LSP may be formed by the same process as the upper electrode UE shown in FIG. 5C. The light blocking pattern LSP may have a single- or multi-layered structure. The light blocking pattern LSP may have the same stacking structure as the first control electrode GE1 or the upper electrode UE. Similar to the first control electrode GE1, the light blocking pattern LSP may include a molybdenum layer.

In FIGS. 10A to 10C, the light blocking pattern LSP may be a floating electrode. The light blocking pattern LSP to be described below may be configured to receive a specific voltage or a specific signal.

Figure 10D:
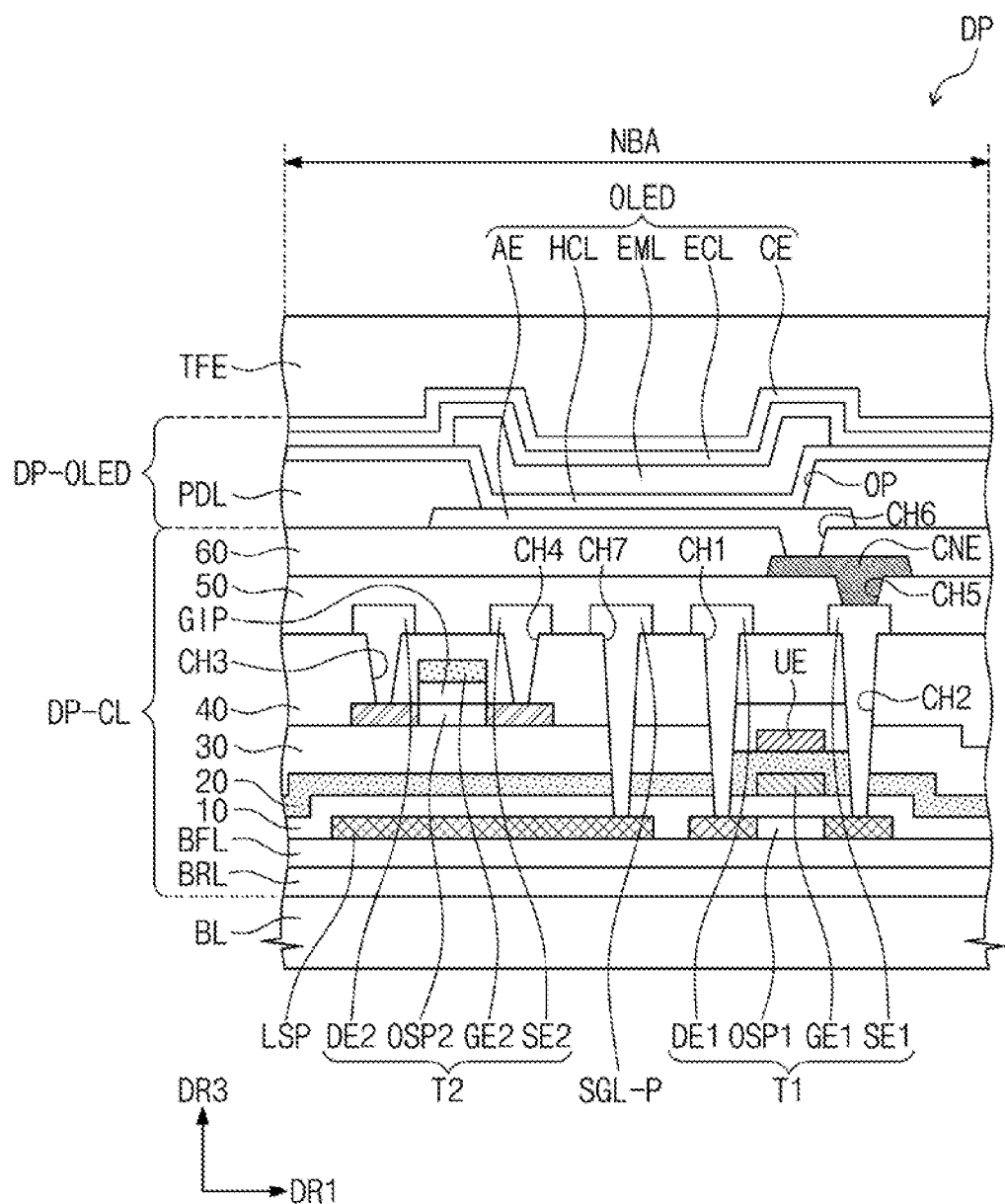
Figure 10E:
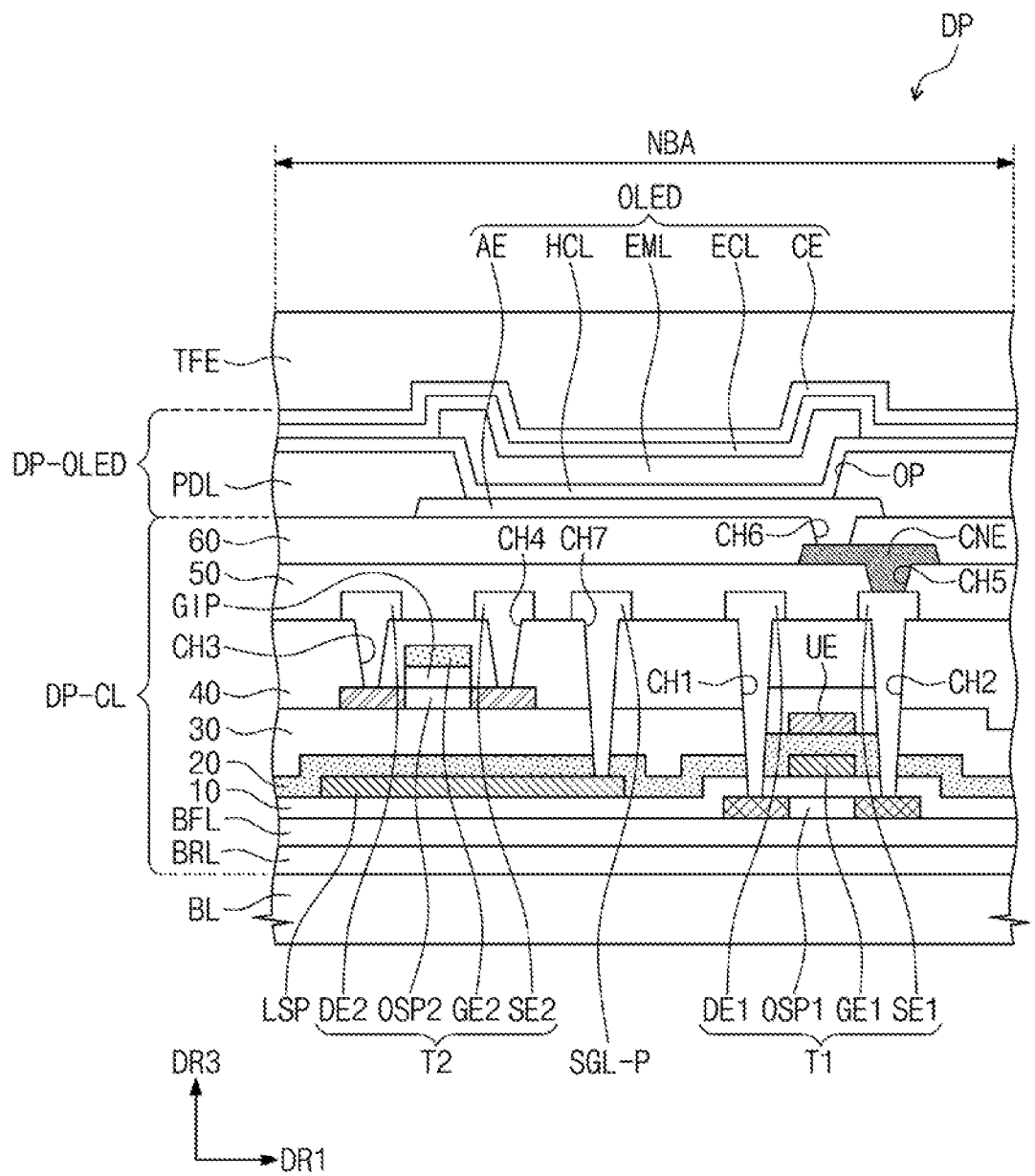
Figure 10F:
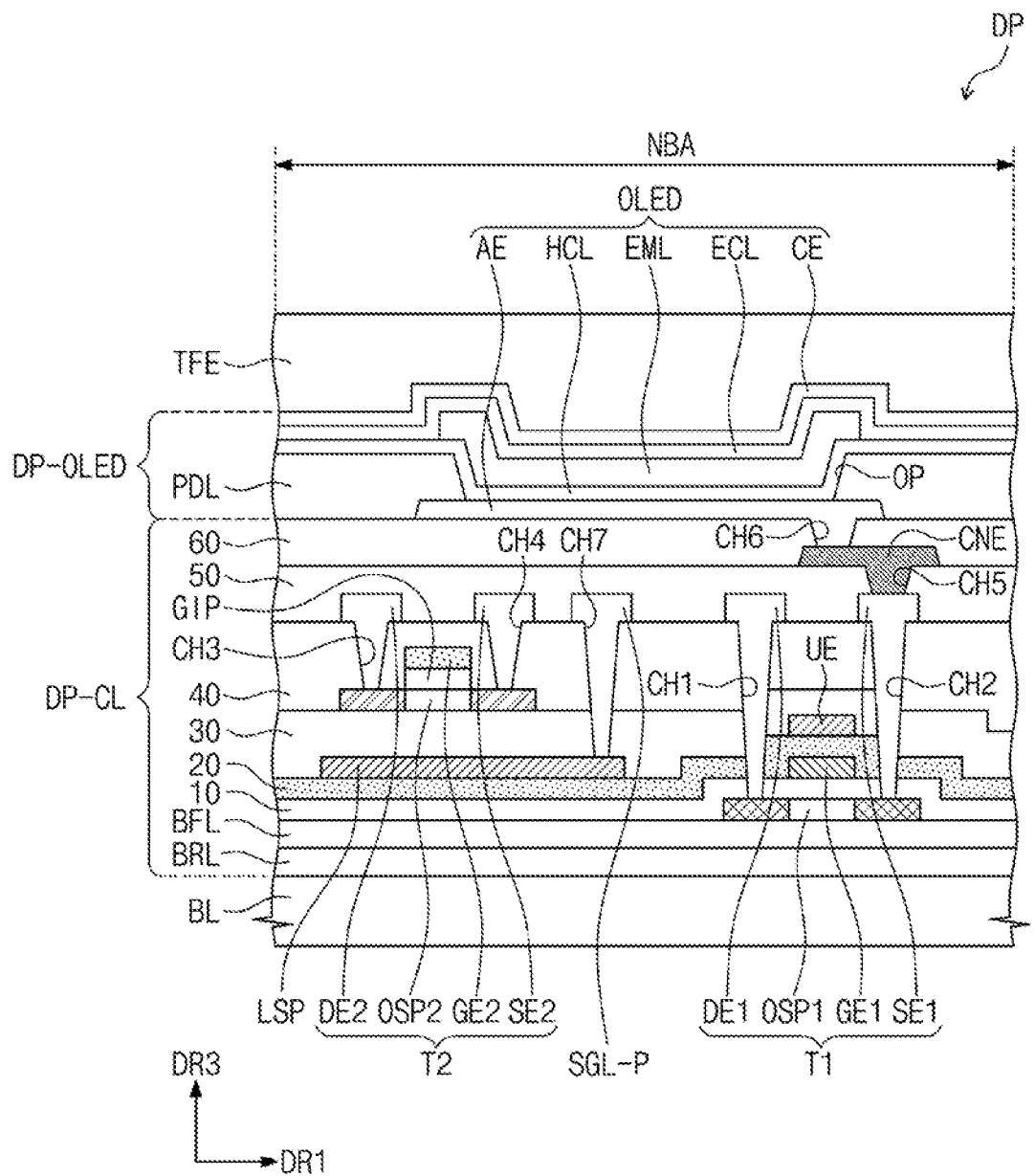

As shown in FIGS. 10D to 10F, the light blocking pattern LSP may be connected to a signal line SGL-P. The signal line SGL-P and the first input electrode DE1 may be formed on the same layer through the same process, as illustrated in FIGS. 10D to 10F. The light blocking pattern LSP and the signal line SGL-P may be connected to each other through a seventh contact hole CH7, which is formed to penetrate the first to fourth insulating layers 10 to 40.

As shown in FIG. 10E, the light blocking pattern LSP may be disposed on the first insulating layer 10, and the light blocking pattern LSP and the signal line SGL-P may be connected to each other through the seventh contact hole C17 penetrating the second to fourth insulating layers 20 to 40. As shown in FIG. 10F, the light blocking pattern LSP may be disposed on the second insulating layer 20, and the light blocking pattern LSP and the signal line SGL-P may be connected to each other through the seventh contact hole CH7 penetrating the third and fourth insulating layers 30 and 40.

The light blocking pattern LSP of FIG. 10E may have a small height difference from the third insulating layer 30, compared with the light blocking pattern LSP of FIG. 10F. Furthermore, the third insulating layer 30 in contact with the second semiconductor pattern OSP2 may prevent diffusion of impurities in the light blocking pattern LSP. Since, as shown in FIG. 10E, the second insulating layer 20 covers the light blocking pattern LSP, it may be possible to deposit the third insulating layer 30 without the light blocking pattern LSP contaminating the third insulating layer 30. The second insulating layer 20 may be a silicon nitride layer, and the third insulating layer 30 may be a silicon oxide layer.

Due to a process error, the second thin-film transistor T2 may have a threshold voltage that is different from a desired value, in an exemplary embodiment of the present inventive concept, a specific bias voltage may be applied to the light blocking pattern LSP of FIGS. 10D to 10F, and in this case, the second thin-film transistor T2 may be controlled to have a desired threshold voltage. For example, in the case where the threshold voltage of the second thin-film transistor T2 is smaller than a desired value, the second thin-film transistor T2 may suffer from an increased leakage current. In this case, by applying a bias voltage to the light blocking pattern LSP of the second thin-film transistor T2, it may be possible to compensate the negative shift phenomenon in threshold voltage of the second thin-film transistor T2.

Figure 10G:
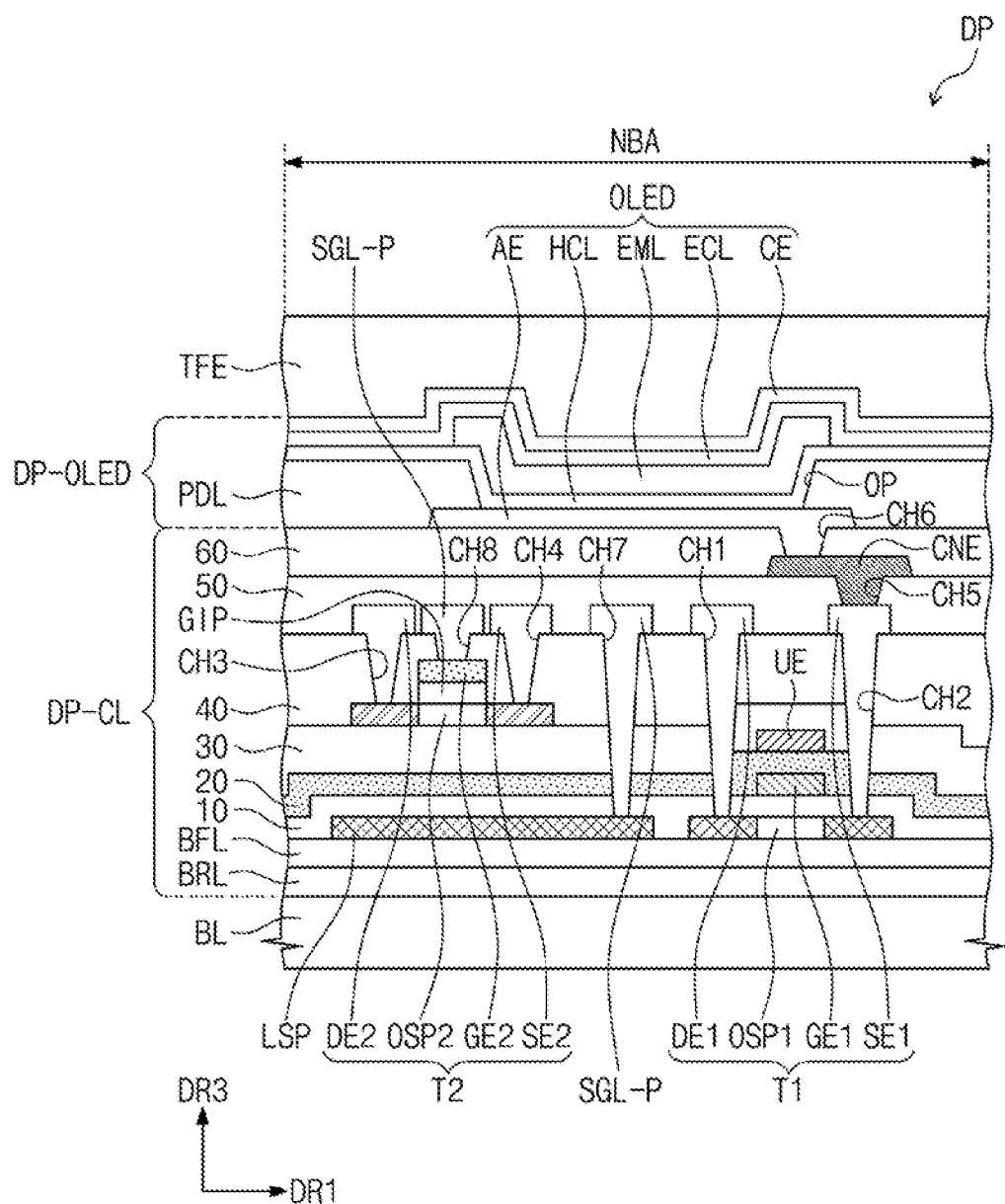

As shown in FIG. 10G, the signal line SGL-P may be connected to the second control electrode GE2 through an eighth contact hole CH8. The signal line SGL-P may be configured to electrically connect the light blocking pattern LSP, which is formed of a crystalline semiconductor material, to the second control electrode GE2. Accordingly, the light blocking pattern LSP may be used as a control electrode of controlling flow of electric charge in the channel region of the second semiconductor pattern SP2. For example, the second thin-film transistor T2 may include two control electrodes, which are electrically connected to each other.

The two control electrodes may be configured to receive the same signal. In an exemplary embodiment of the present inventive concept, the light blocking pattern LSP of FIG. 10G may be disposed on other layer, as shown in FIGS. 10E and 10F.

FIGS. 11A to 11L are cross-sectional views illustrating a portion of a display panel according to an exemplary embodiment of the inventive concept. In the display panels DP of FIGS. 11A to 11L, the shape of the signal line DL may be partly different from that in the display panel DP of FIG. 5M.

As shown in FIGS. 11A to 11D, the signal line DL may include a first portion DL1-P1, a second portion DL1-P2, and a third portion DL1-P3. The first portion DL1-P1 may be connected to the pixel PX (e.g., see FIG. 2), and the third portion DL1-P3 may be connected to a corresponding one of the signal pads DP-PD (e.g., see FIG. 2) or another driving chip. The second portion DL1-P2 may connect the first portion DL1-P1 to the third portion DL1-P3 through the seventh contact hole CH7 and the eighth contact hole CH8. The second portion DL1-P2 may overlap the curvature region CA.

Figure 11A:
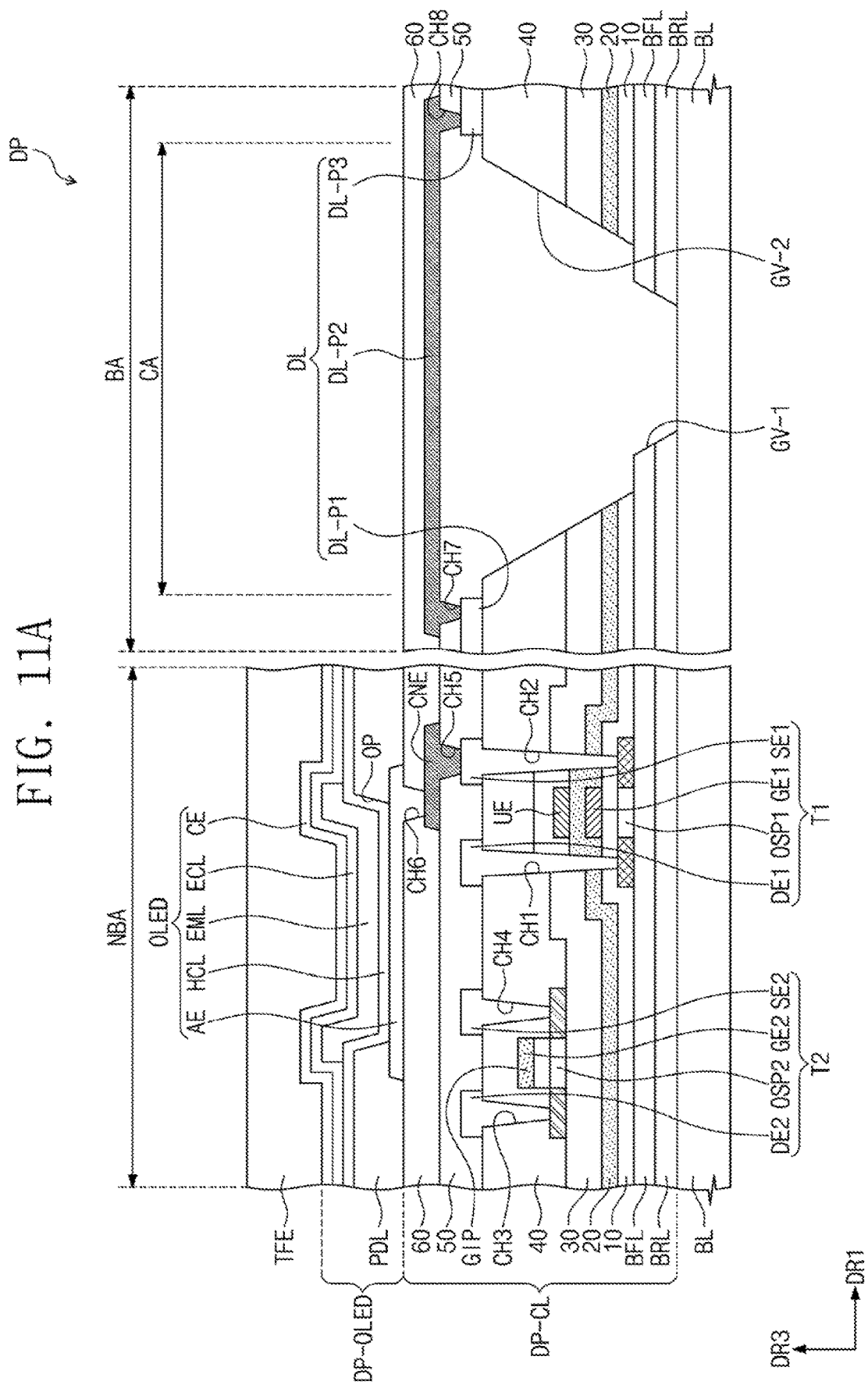
FIGS. 11A to 11L are cross-sectional views illustrating a portion of a display panel according to an embodiment of the inventive concept.

As shown in FIG. 11A, the first portion DL1-P1 and the third portion DL1-P3 may be formed by the same process as the input and output electrodes DE1, SE1, SE2, and DE2 of the transistors T1 and T2 and may be formed on the same layer as the input and output electrodes DE1, SE1, SE2, and DE2 of the transistors T1 and T2. Each of the seventh contact hole CH7 and the eighth contact hole CH8 may penetrate the fifth insulating layer 50. Each of the seventh contact hole CH7 and the eighth contact hole CH8 may be formed by the same process as the fifth contact hole CH5.

Figure 11B:
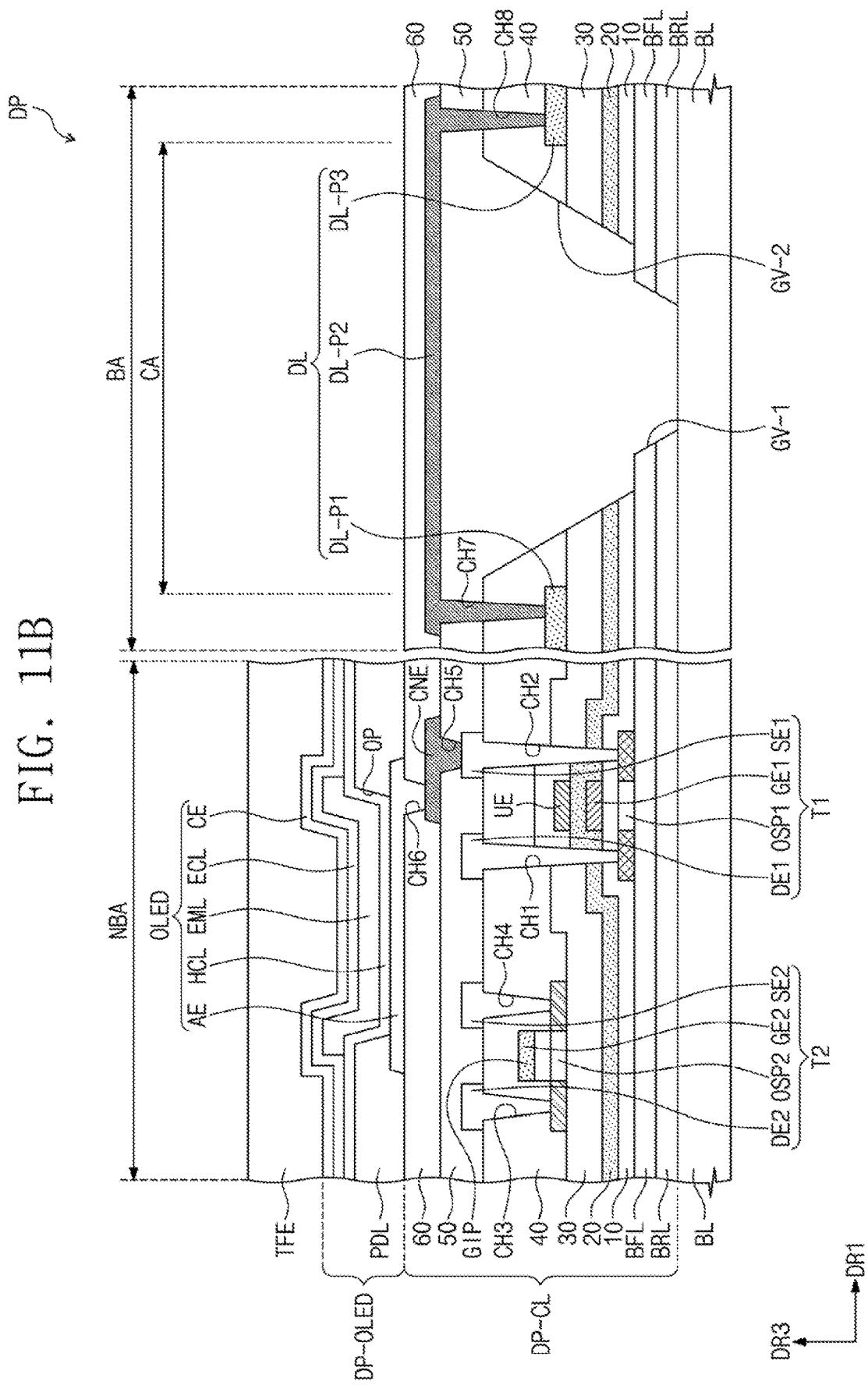

As shown in FIG. 11B, the first portion DL1-P1 and the third portion DL1-P3 may be formed by the same process as the second control electrode GE2 and may be formed on the same layer as the second control electrode GE2. Each of the seventh contact hole CH7 and the eighth contact hole CH8 may penetrate the fourth insulating layer 40 and the fifth insulating layer 50. Each of the seventh contact hole CH7 and the eighth contact hole CH8 may be formed using the process for forming the fourth contact hole CH4 and the fifth contact hole CH5. In an exemplary embodiment of the present inventive concept, the seventh contact hole CH7 and the eighth contact hole CH8 may be formed by an additional process.

Figure 11C:
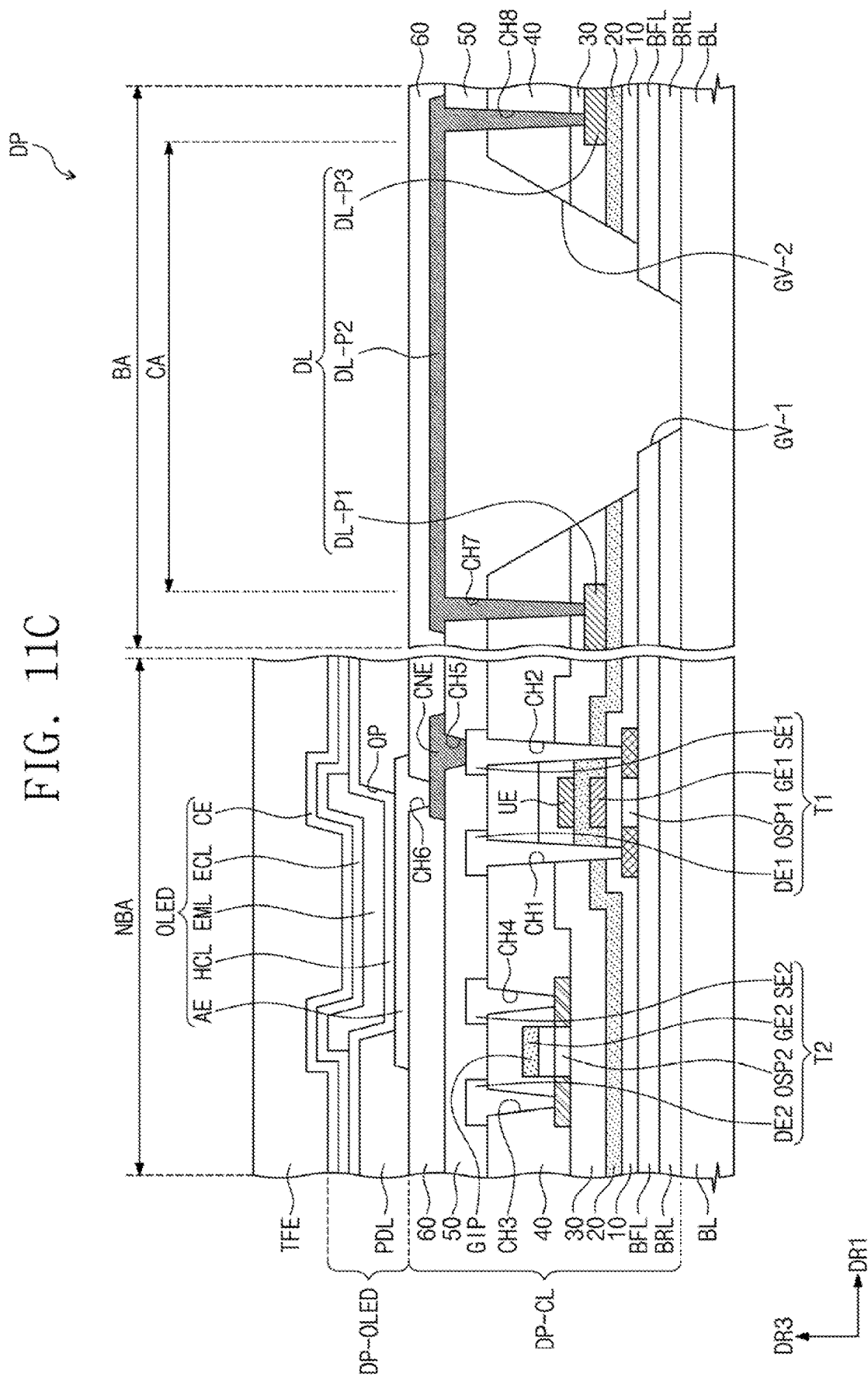

As shown in FIG. 11C, the first portion DL1-P1 and the third portion DL1-P3 may be formed by the same process as the upper electrode UE and may be formed on the same layer as the upper electrode UE. Each of the seventh contact hole CH7 and the eighth contact hole CH8 may penetrate the third insulating layer 30, the fourth insulating layer 40, and the fifth insulating layer 50.

Figure 11D:
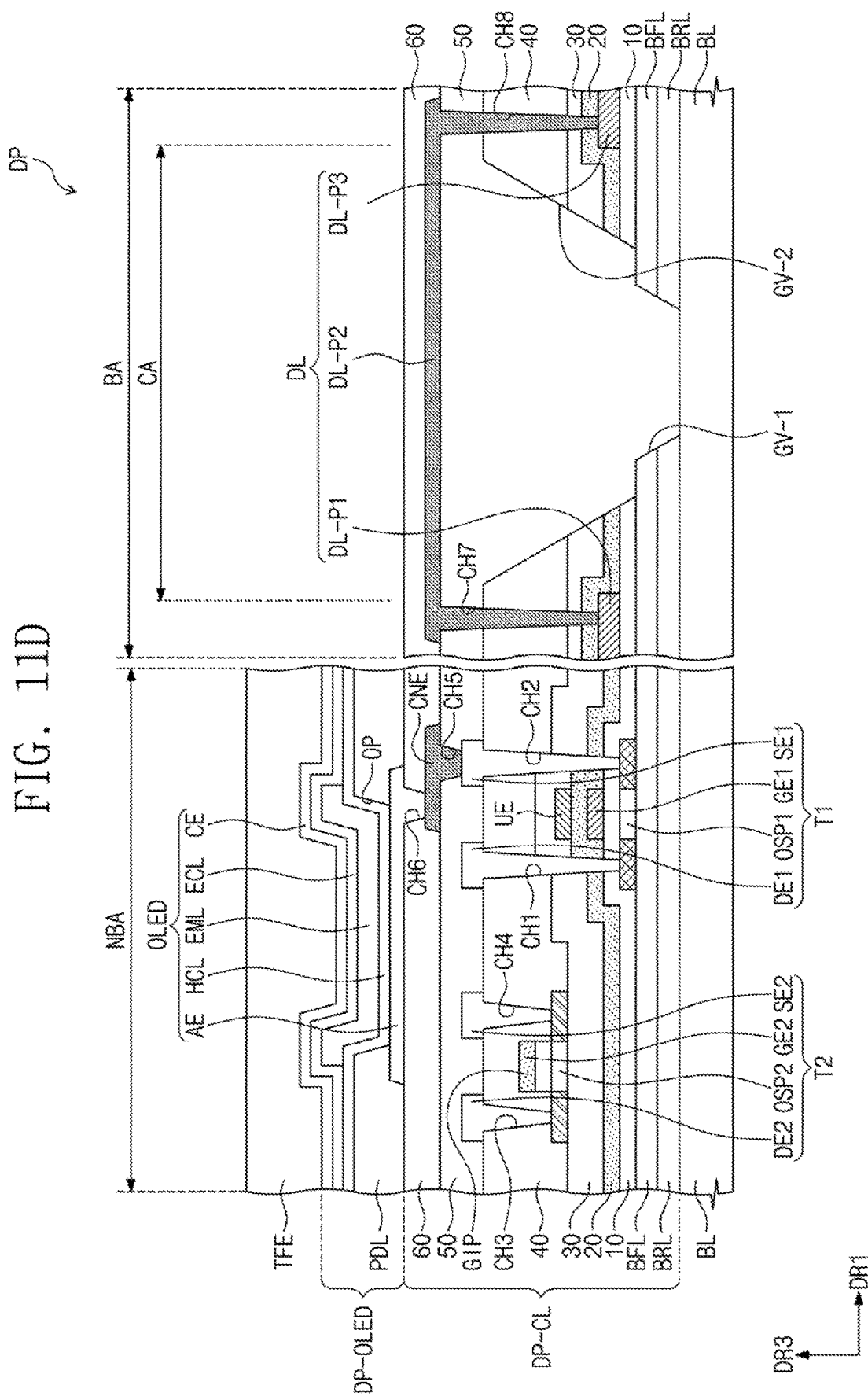

As shown in FIG. 11D, the first portion DL1-P1 and the third portion DL1-P3 may be formed by the same process as the first control electrode GE1 and may be formed on the same layer as the first control electrode GE1. Each of the seventh contact hole CH7 and the eighth contact hole CH8 may penetrate the second insulating layer 20, the third insulating layer 30, the fourth insulating layer 40, and the fifth insulating layer 50.

In the approach discussed above with respect to FIGS. 11C and 11D, each of the seventh contact hole CH7 and the eighth contact hole CH8 may be formed using the process for forming the second contact hole CH2 and the fifth contact hole CH5. In an exemplary embodiment of the present inventive concept, the seventh contact hole CH7 and the eighth contact hole CH8 may be formed by an additional process.

Each of the display panels DP of FIGS. 11E to 11J may further include a first connection electrode CNE-D1 and a second connection electrode CNE-D2, compared with the display panels DP of FIGS. 11A to 11D.

Figure 11E:
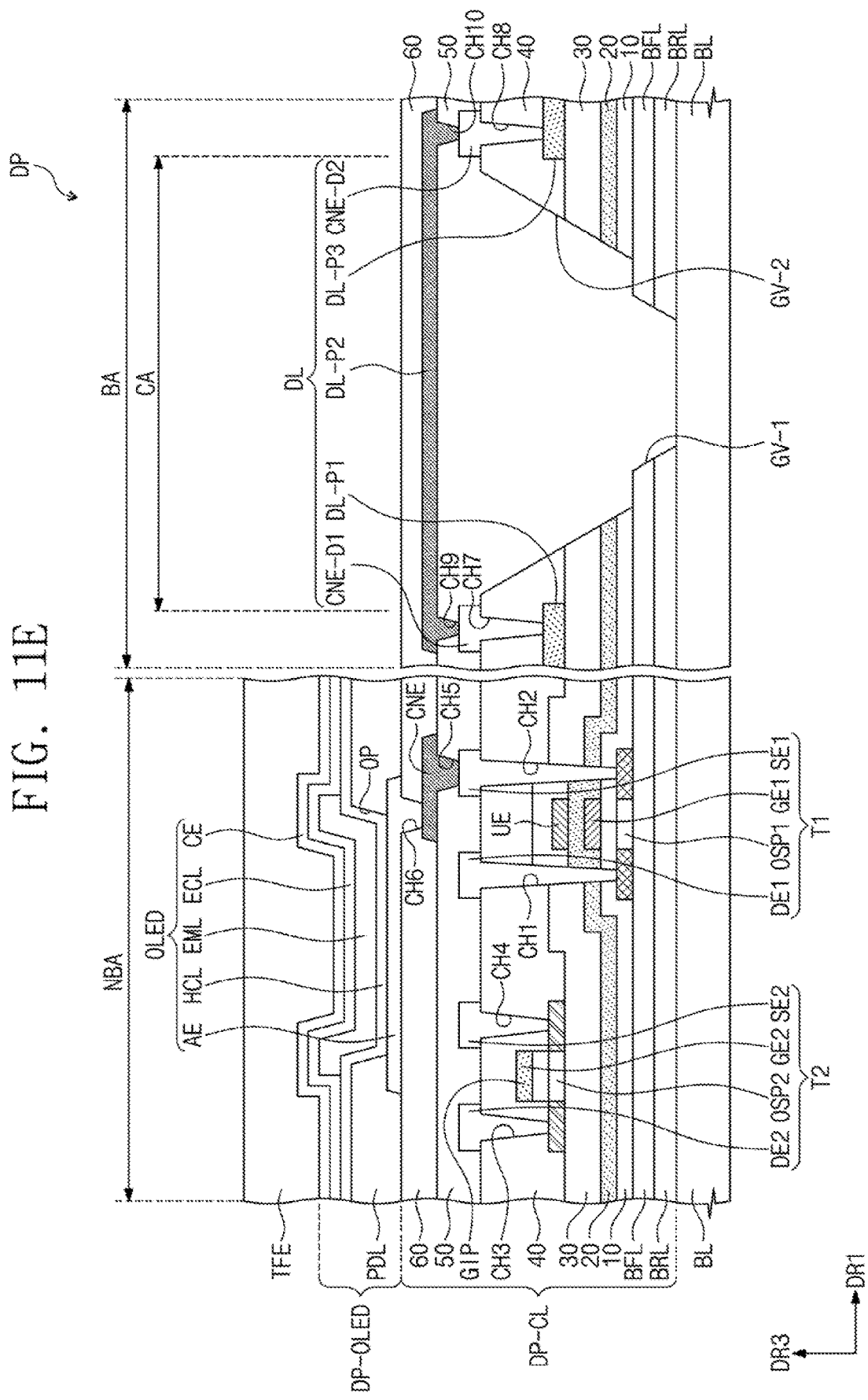

As shown in FIG. 11E, the first portion DL1-P1 and the third portion DL1-P3 may be formed by the same process as the second control electrode GE2 and may be formed on the same layer as the second control electrode GE2. The first connection electrode CNE-D1 and the second connection electrode CNE-D2 may be formed by the same process as the input and output electrodes DE1, SE1, SE2, and DE2 of the transistors T1 and T2 and may be formed on the same layer as the input and output electrodes DE1, SE1, SE2, and DE2 of the transistors T1 and T2.

The seventh contact hole CH7 may connect the first connection electrode CNE-D1 to the first portion DL1-P1, and the eighth contact hole CH8 may connect the second connection electrode CNE-D2 to the third portion DL1-P3. Each of the seventh contact hole CH7 and the eighth contact hole CH8 may be formed by the same process as the fourth contact hole CH4. A ninth contact hole CH9 may connect the second portion DL1-P2 to the first connection electrode CNE-D1, and a tenth contact hole CH10 may connect the second portion DL1-P2 to the second connection electrode CNE-D2. Each of the ninth contact hole CH9 and the tenth contact hole CH10 may be formed by the same process as the fifth contact hole CH5.

Figure 11F:
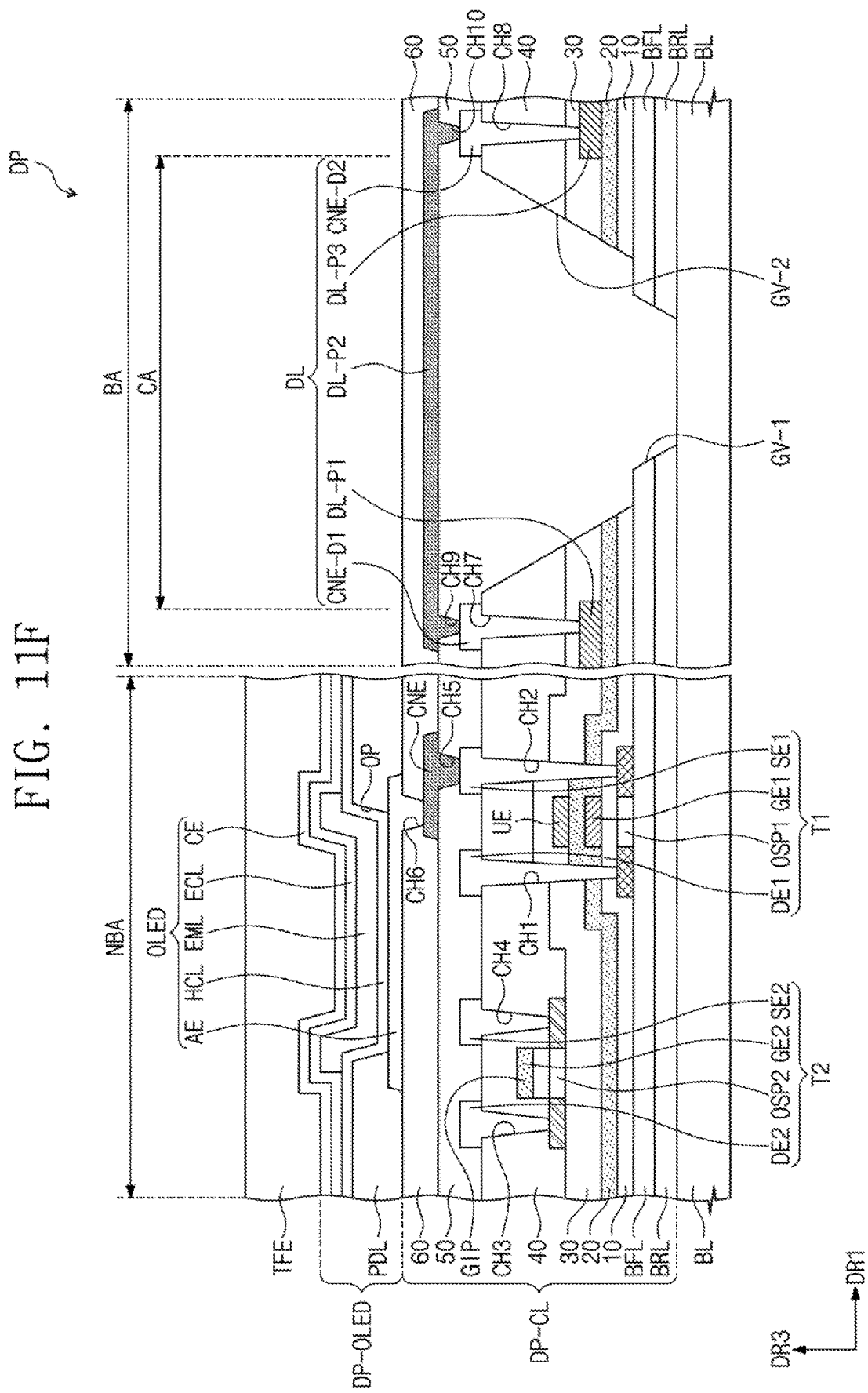
Figure 11G:
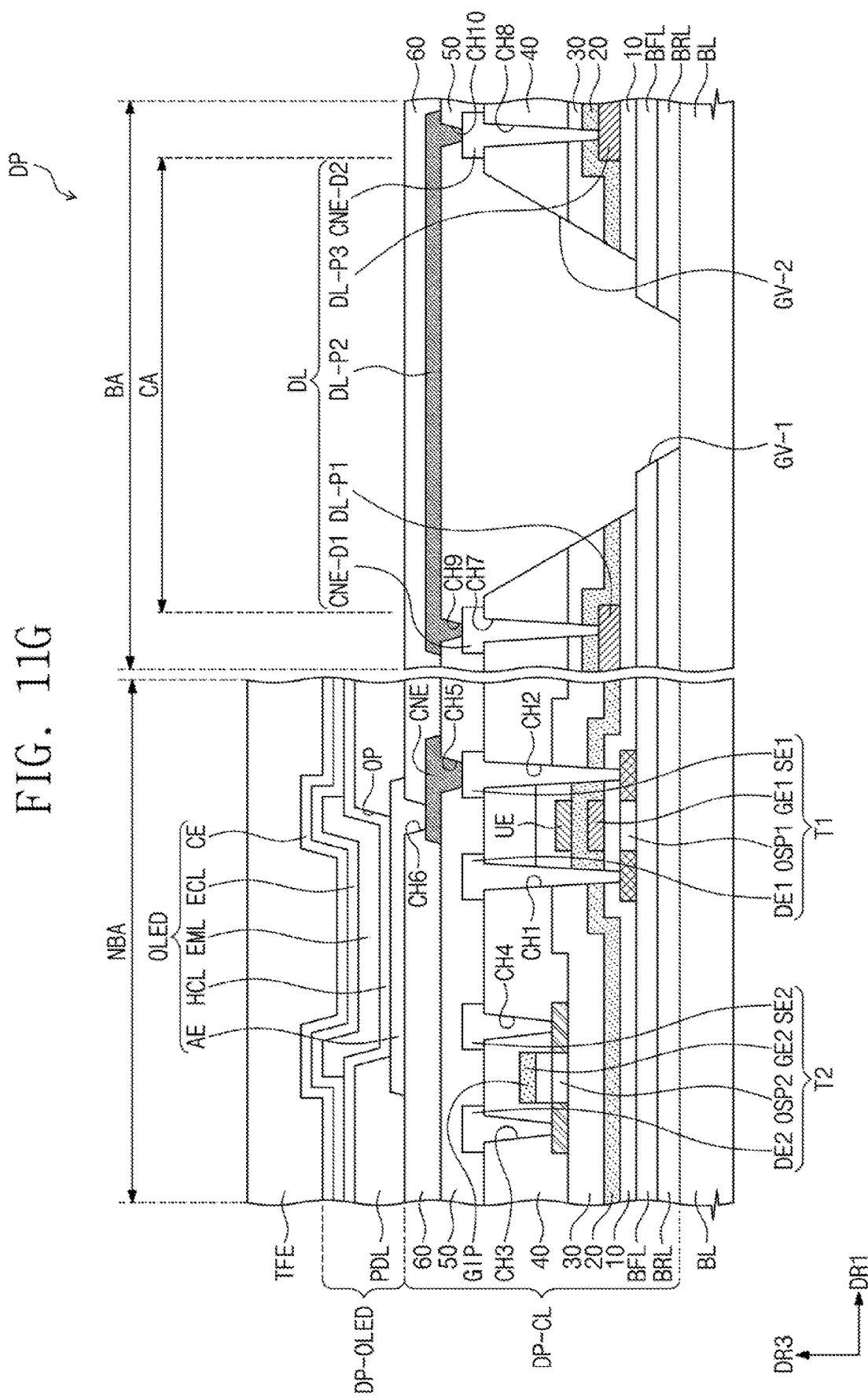
Figure 11H:
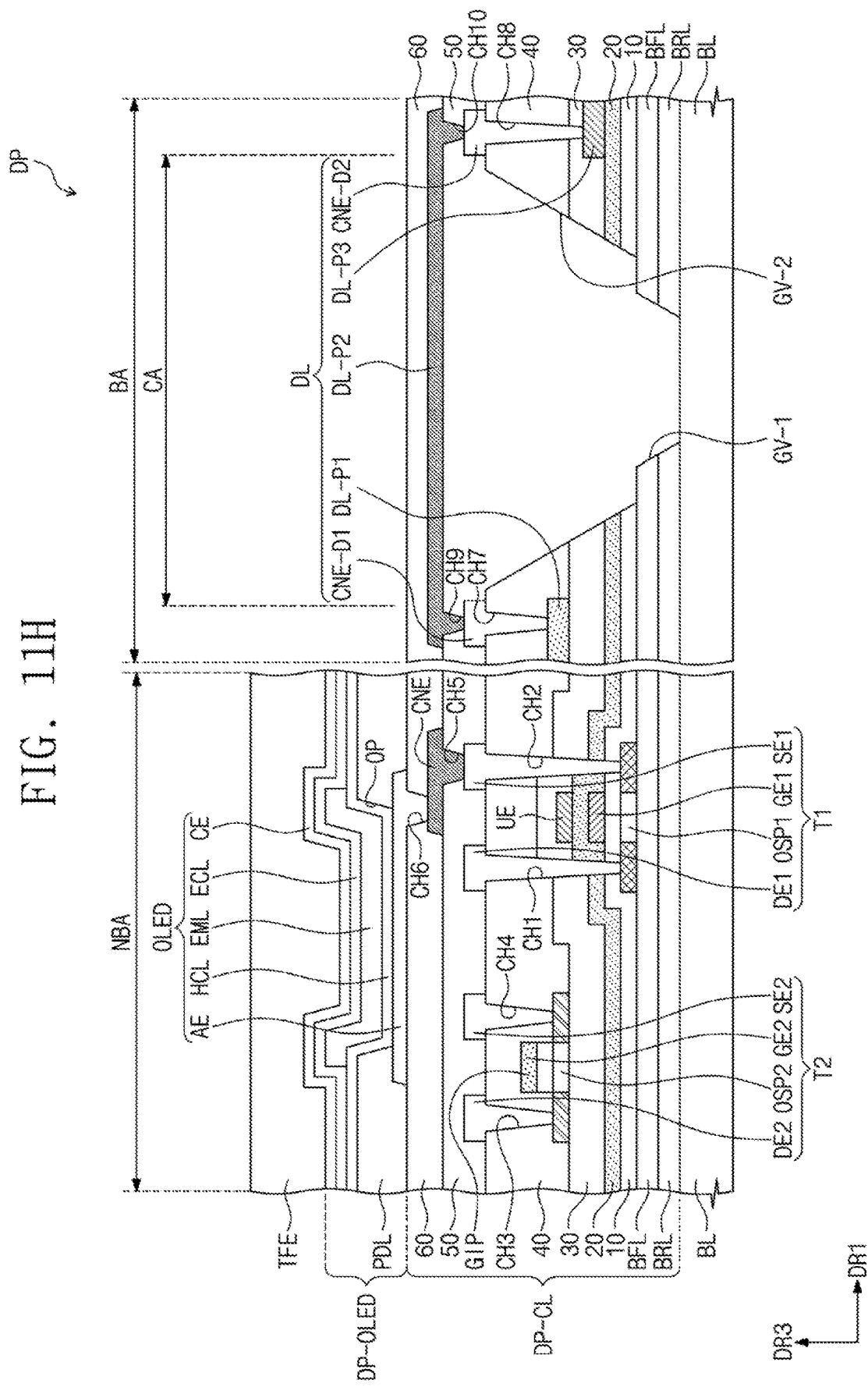
Figure 11I:
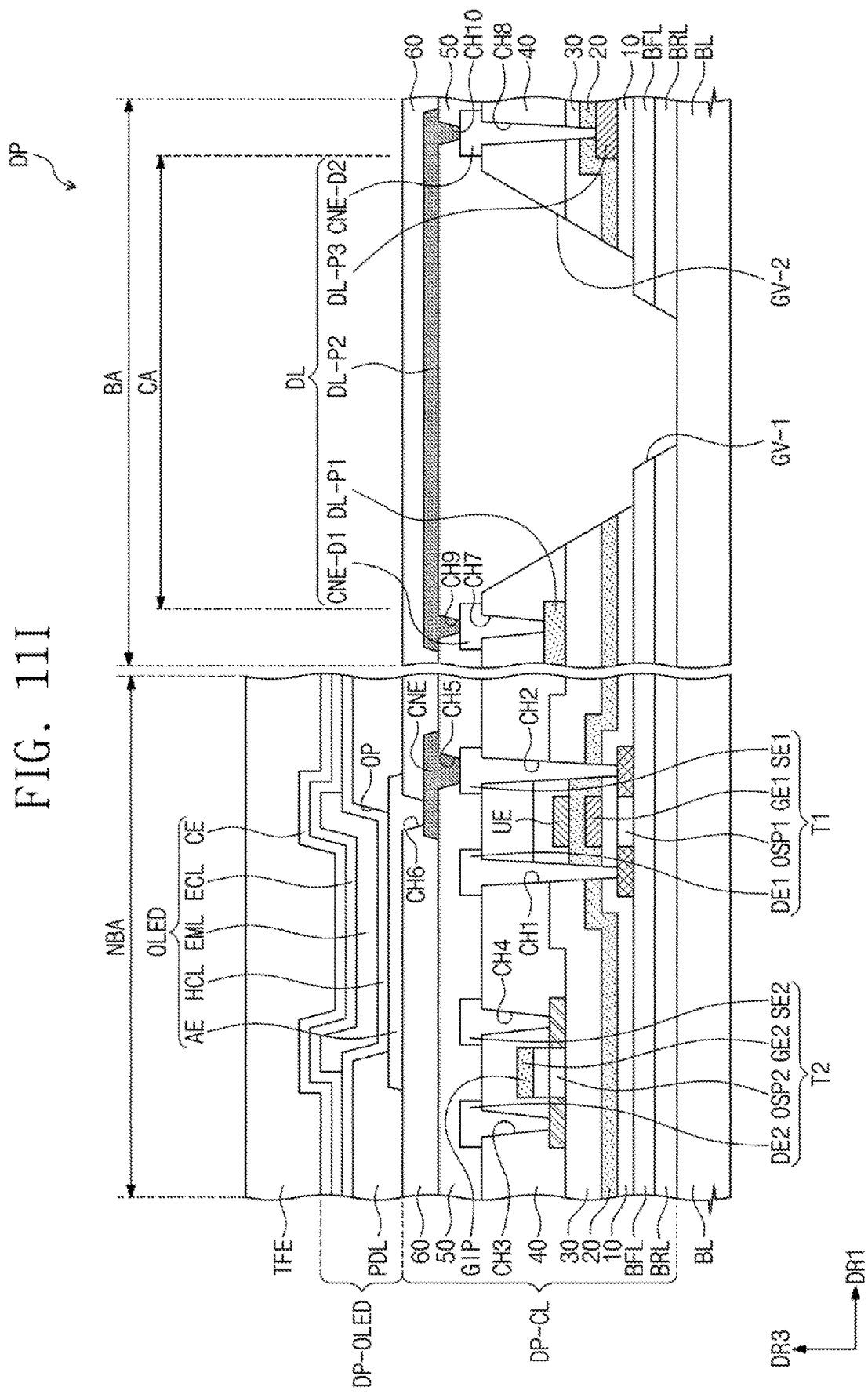
Figure 11J:
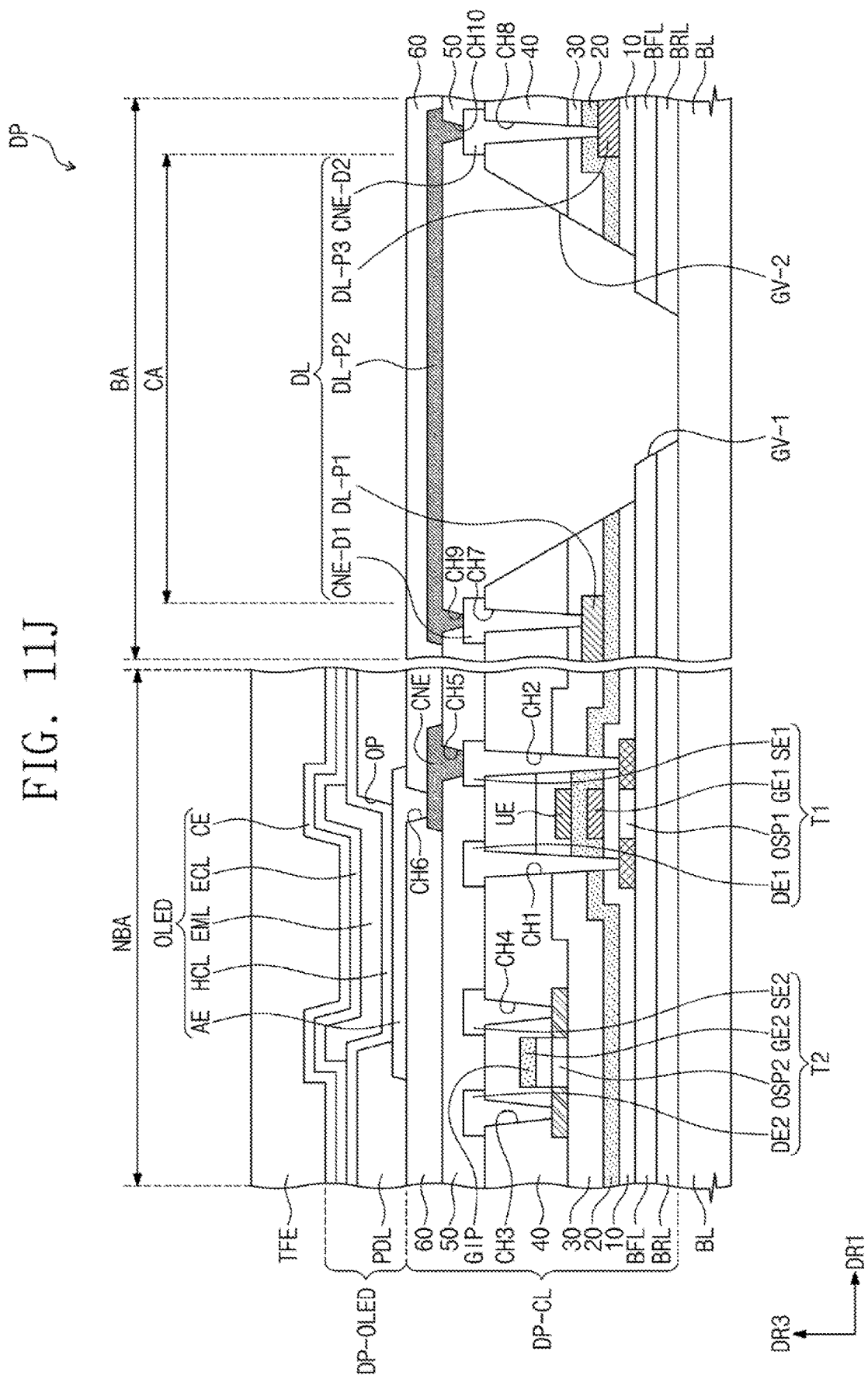

As shown in FIGS. 11F and 11G, sectional positions of the first portion DL1-P1 and the third portion DL1-P3 may be changed. As shown in FIGS. 11H to 11J, the first portion DL1-P1 and the third portion DL1-P3 may be disposed on different layers.

As shown in FIG. 11H, the first portion DL1-P1 may be disposed on the third insulating layer 30, and the third portion DL1-P3 may be disposed on the second insulating layer 20. As shown in FIG. 11I, the first portion DL1-P1 may be disposed on the third insulating layer 30, and the third portion DL1-P3 may be disposed on the first insulating layer 10. As shown in FIG. 11J, the first portion DL1-P1 may be disposed on the second insulating layer 20, and the third portion DL1-P3 may be disposed on the first insulating layer 10. In an exemplary embodiment of the present inventive concept, the sectional positions of the first portion DL1-P1 and the third portion DL1-P3 may be interchanged with each other.

Figure 11K:
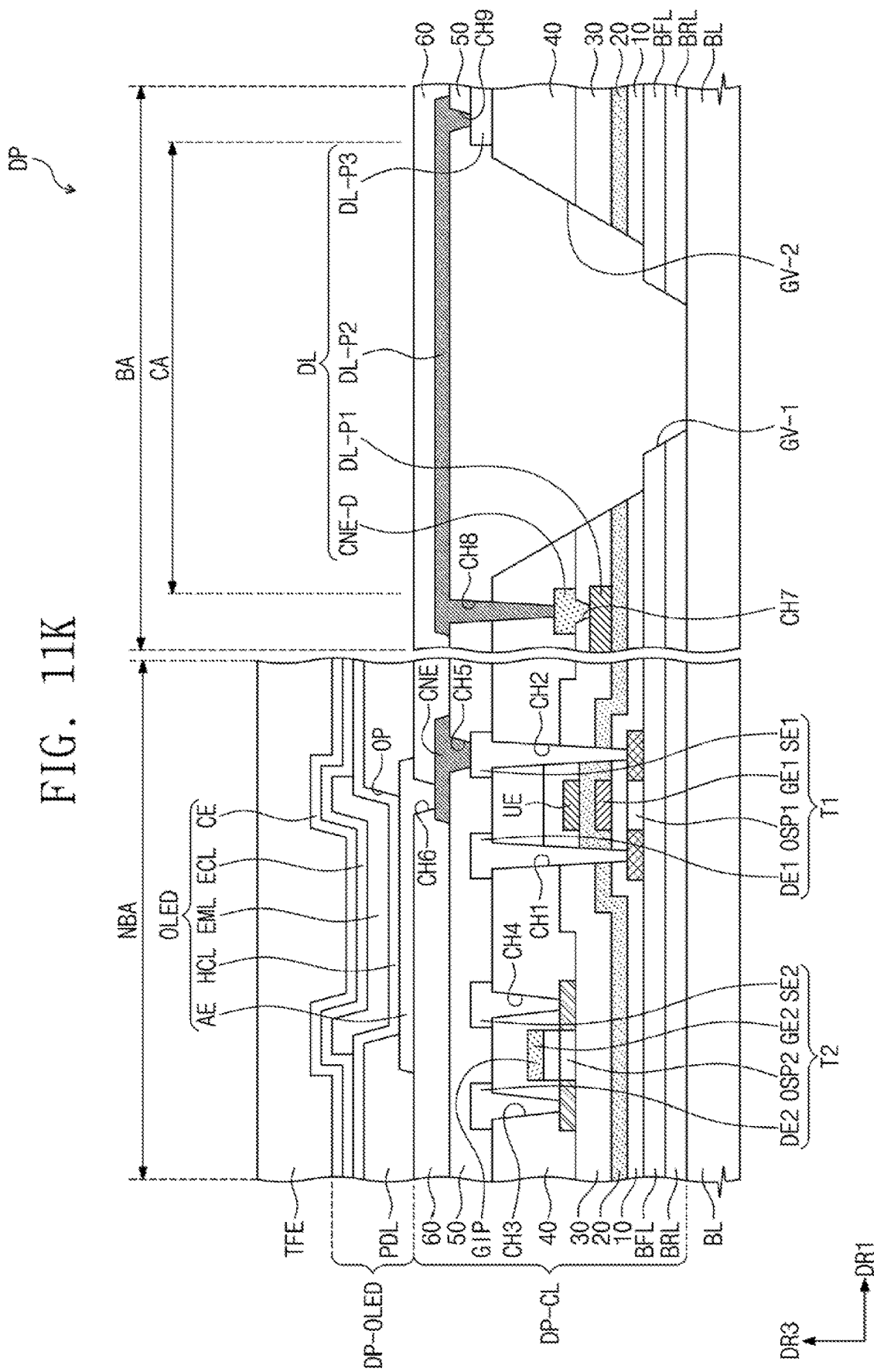
Figure 11L:
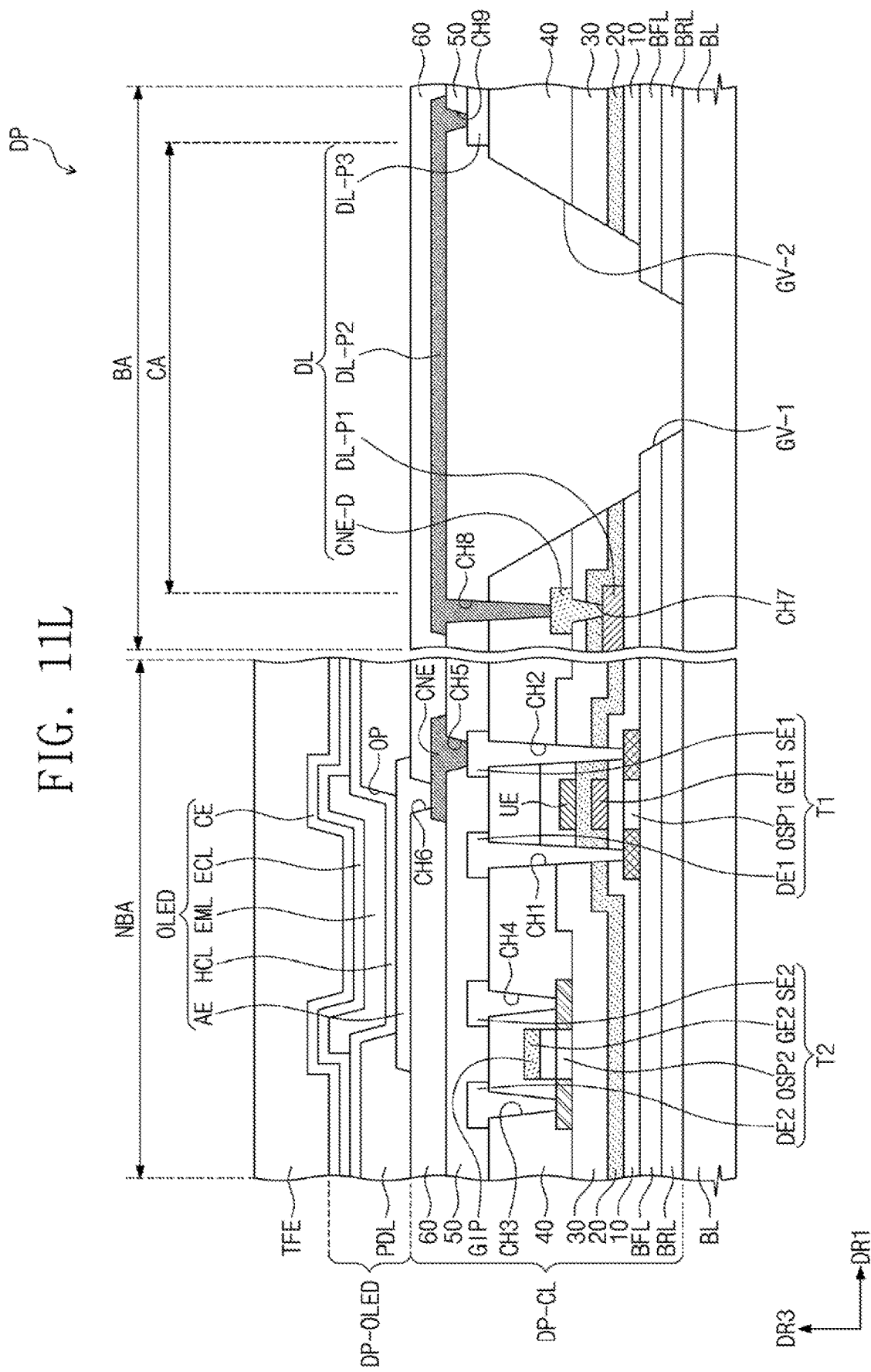

Each of the display panels DP of FIGS. 11K and 11L may further include the connection electrode CNE-D, compared with the display panels DP of FIGS. 11A to 11D. In the display panels DP of FIGS. 11K and 11L, the number of the connection electrode CNE-D may be reduced, compared with the display panels DP of FIGS. 11E and 11H.

As shown in FIG. 11K, the first portion DL1-P1 may be formed by the same process as the upper electrode UE and may be formed on the same layer as the upper electrode UE, and the connection electrode CNE-D may be formed by the same process as the second control electrode GE2 and may be formed on the same layer as the second control electrode GE2. In an exemplary embodiment of the present inventive concept, an additional process may be performed to form the seventh contact hole CH7 penetrating the third insulating layer 30. Each of the eighth contact hole CH8 and the ninth contact hole CH9 may be formed using the process for forming the fifth contact hole CH5.

As shown in FIG. 11K, the first portion DL1-P1 may be formed by the same process as the first control electrode GE1 and may be formed on the same layer as the first control electrode GE1, and the connection electrode CNE-D may be formed by the same process as the second control electrode GE2 and may be formed on the same layer as the second control electrode GE2. In an exemplary embodiment of the present inventive concept, an additional process may be performed to form the seventh contact hole CH7 penetrating the second insulating layer 20 and the third insulating layer 30. Each of the eighth contact hole CH8 and the ninth contact hole CH9 may be formed using the process for forming the fifth contact hole CH5.

In an exemplary embodiment of the present inventive concept, the sectional position of the connection electrode CNE-D may be changed from that shown in FIGS. 11K and 11L. The connection electrode CNE-D may connect the second portion DL1-P2 to the third portion DL1-P3.

According to an exemplary embodiment of the inventive concept, it may be possible to reduce a leakage current of a thin-film transistor, which is directly connected to a signal line. It may be possible to maintain a voltage-current property of a thin-film transistor controlling a driving current of a luminescent device.

Since an organic layer is disposed on a bending region of a display panel, flexibility of the bending region of the display panel may be increased.

A contact hole exposing a portion of a semiconductor pattern disposed on a display region may be formed concurrently using a process of etching an insulating layer and an inorganic layer on the bending region, and thus, it may be possible to reduce the total number of masks for a fabrication process.

While example embodiments of the inventive concept have been particularly shown and described, it will be understood by one of ordinary skill in the art that variations in form and detail may be made therein without departing from the spirit and scope of the present inventive concept.

What is claimed is:
1. A display panel, comprising:
   a base layer including a first region and a second region that is bent with respect to the first region;
   at least one inorganic layer overlapping both the first region and the second region and disposed on the base layer;

a first thin-film transistor disposed on the at least one inorganic layer and including a silicon semiconductor pattern overlapping the first region;

a second thin-film transistor disposed on the at least one inorganic layer and including an oxide semiconductor pattern overlapping the first region, wherein the oxide semiconductor pattern is disposed on a layer different from the silicon semiconductor pattern;

a plurality of insulating layers overlapping both the first region and the second region;

a signal line electrically connected to the second thin-film transistor;

an organic layer overlapping both the first region; and a luminescent element disposed on the organic layer and overlapping the first region, and wherein an opening is defined in the at least one inorganic layer and the plurality of insulation layers and the opening is positioned in the second region.

2. The display panel of claim 1, wherein a portion of the signal line overlaps the second region and is disposed on the organic layer.

3. The display panel of claim 1, wherein the opening penetrates the at least one inorganic layer and the plurality of insulation layers.

4. The display panel of claim 1, wherein the organic layer further overlaps the second region.

5. The display panel of claim 4, wherein the organic layer is disposed in the opening.

6. The display panel of claim 1, further comprising a connection electrode disposed on the organic layer and connected to one of a drain and a source of the first thin-film transistor through a first contact hole penetrating the organic layer.

7. The display panel of claim 6, further comprising a passivation layer disposed on the organic layer.

8. The display panel of claim 7, wherein an electrode of the luminescent element is connected to the connection electrode through a second contact hole penetrating the passivation layer.

9. The display panel of claim 7, wherein the passivation layer is disposed on the signal line, and a portion of the passivation layer overlapping the second region is in contact with the signal line.

10. The display panel of claim 1, wherein the insulating layers comprise:

a first insulation layer covering the silicon semiconductor pattern of the first thin-film transistor;

a second insulating layer disposed on the first insulating layer and covering a gate of the first thin-film transistor;

a third insulating layer disposed on the second insulating layer; and a fourth insulating layer disposed on the third insulating layer and covering a gate of the second thin-film transistor and overlapping the oxide semiconductor pattern of the second thin-film transistor.

11. The display panel of claim 10, further comprising an upper electrode disposed between the second insulating layer and the third insulating layer and overlapping the gate of the first thin-film transistor.

12. The display panel of claim 10, further comprising a fifth insulating layer overlapping the oxide semiconductor pattern of the second thin-film transistor and the gate of the second thin-film transistor.

13. The display panel of claim 10, further comprising an upper electrode disposed between the third insulating layer and the fourth insulating, layer and partially overlapping the gate of the first thin-film transistor.

14. The display panel of claim 13, further comprising a fifth insulating layer disposed between the third insulating layer and the upper electrode.

15. The display panel of claim 1, further comprising a light blocking pattern disposed between the at least one inorganic layer and the oxide semiconductor pattern of the second thin-film transistor and overlapping the oxide semiconductor pattern of the second thin-film transistor.

16. The display panel of claim 15, wherein the light blocking pattern is electrically conductive.

17. The display panel of claim 16, wherein the light blocking pattern is configured to receive a bias voltage.

18. The display panel of claim 15, wherein the light blocking pattern is electrically connected to a gate of the second thin-film transistor.

19. The display panel of claim 15, wherein the light blocking pattern is disposed on a same layer as the silicon semiconductor pattern of the first thin-film transistor, a gate of the first thin-film transistor, or an upper electrode overlapping the gate of the first thin-film transistor, and the light blocking pattern includes a same material as silicon semiconductor pattern of the first thin-film transistor, a gate of the first transistor, or the upper electrode overlapped with the gate of the first thin-film transistor.

20. The display panel of claim 1, wherein a portion of a top surface of the at least one inorganic layer is in contact with the organic layer.

21. The display panel of claim 1, wherein the second region includes a curvature region, which is connected to the first region, and a facing region, which is connected to the curvature region and faces the first region, wherein the curvature region is bent with a specific curvature, and wherein the signal line comprises:

a first portion overlapping the first region and electrically connected to the second thin-film transistor;

a second portion overlapping the curvature region and disposed on a different layer from the first portion; and a third portion overlapping the facing region and disposed on a different layer from the second portion.

22. The display panel of claim 21, further comprising a connection electrode connecting the first portion to the second portion or connecting the third portion to the second portion.

23. The display panel of claim 22, wherein the connection electrode is disposed on a same layer as the second portion of the signal line.

24. The display panel of claim 1, wherein the opening includes inclined surfaces, and a step is defined in each of the inclined surfaces.

25. The display panel of claim 1, wherein the opening includes a lower opening formed within the at least one inorganic layer and overlapping the second region and an upper opening formed within the plurality of insulating layers and extended from the lower opening.

* * * * *

UNITED STATES PATENT AND TRADEMARK OFFICE
CERTIFICATE OF CORRECTION

| | | |
|---|---|---|
| PATENT NO. | : 11,515,376 B2 | Page 1 of 1 |
| APPLICATION NO. | : 17/063698 | |
| DATED | : November 29, 2022 | |
| INVENTOR(S) | : Yoon-Jong Cho et al. | |

It is certified that error appears in the above-identified patent and that said Letters Patent is hereby corrected as shown below:

In the Claims

Column 21, Claim 1, Line 13: Please correct "an organic layer overlapping both the first region;" to read --an organic layer overlapping the first region;--

Signed and Sealed this
Fourth Day of April, 2023

Katherine Kelly Vidal
*Director of the United States Patent and Trademark Office*